(12) United States Patent
Muramoto et al.

(10) Patent No.: US 10,964,556 B2
(45) Date of Patent: Mar. 30, 2021

(54) SUBSTRATE PROCESSING APPARATUS, SUBSTRATE PROCESSING SYSTEM, AND SUBSTRATE PROCESSING METHOD

(71) Applicant: SCREEN Holdings Co., Ltd., Kyoto (JP)

(72) Inventors: Ryo Muramoto, Kyoto (JP); Mitsukazu Takahashi, Kyoto (JP)

(73) Assignee: SCREEN Holdings Co., Ltd.

( * ) Notice: Subject to any disclaimer, the term of this patent is extended or adjusted under 35 U.S.C. 154(b) by 102 days.

(21) Appl. No.: 15/977,124

(22) Filed: May 11, 2018

(65) Prior Publication Data
US 2018/0261475 A1    Sep. 13, 2018

Related U.S. Application Data

(62) Division of application No. 15/016,411, filed on Feb. 5, 2016.

(30) Foreign Application Priority Data

Feb. 12, 2015   (JP) .................................. 2015-025718
Feb. 12, 2015   (JP) .................................. 2015-025719
(Continued)

(51) Int. Cl.
*H01L 21/67*      (2006.01)

(52) U.S. Cl.
CPC .... *H01L 21/67051* (2013.01); *H01L 21/6715* (2013.01)

(58) Field of Classification Search
CPC ......... H01L 21/67051; H01L 21/68764; H01L 21/02041; H01L 21/02052; H01L 21/02054; H01L 21/02057
See application file for complete search history.

(56) References Cited

U.S. PATENT DOCUMENTS 5,626,675 A    5/1997   Sakamoto et al. ............. 118/663
6,432,199 B1    8/2002   Takekuma ...................... 118/52
(Continued)

FOREIGN PATENT DOCUMENTS

CN    1440055 A    9/2003
JP    7-142378 A    6/1995
(Continued)

OTHER PUBLICATIONS

JP2006128424—Machine Translation (Year: 2006).*

*Primary Examiner* — Marc Lorenzi
(74) *Attorney, Agent, or Firm* — Ostrolenk Faber LLP

(57) ABSTRACT

A top plate when located at a first position is held by an opposing-member holder, and the top plate when located at a second position is held by a substrate holder and rotated along with the substrate holder. In a substrate processing apparatus, a first processing liquid nozzle located at a supply position inside a to-be-held part of the top plate supplies a first processing liquid through an opposing-member opening to a substrate and is moved from the supply position to its retracted position, and a second processing liquid nozzle is moved from its retracted position to the supply position and supplies a second processing liquid through the opposing-member opening to the substrate. This configuration suppresses or prevents mixture of multiple types of processing liquids, as compared with the case where multiple types of processing liquids are sequentially supplied from a single processing liquid nozzle.

8 Claims, 43 Drawing Sheets

(30) Foreign Application Priority Data

Feb. 12, 2015 (JP) ................................ 2015-025720
Feb. 27, 2015 (JP) ................................ 2015-037749

(56) References Cited

U.S. PATENT DOCUMENTS

| | | | |
|---|---|---|---|
| 6,506,009 B1 | 1/2003 | Nulman et al. ............ 414/217.1 |
| 8,696,825 B2 * | 4/2014 | Miya ................ H01L 21/67028 134/1.2 |
| 2002/0136828 A1 | 9/2002 | Hung et al. ................... 427/240 |
| 2003/0140988 A1 | 7/2003 | Gandikota et al. ............ 148/527 |
| 2003/0172955 A1 | 9/2003 | Kuroda et al. .................... 134/2 |
| 2004/0084144 A1 | 5/2004 | Yokouchi ................. 156/345.11 |
| 2004/0087158 A1 | 5/2004 | Izumi ............................ 438/689 |
| 2005/0000652 A1 | 1/2005 | Nam et al. ............... 156/345.11 |
| 2007/0131246 A1 * | 6/2007 | Izumi ............... H01L 21/02041 134/1.3 |
| 2007/0141951 A1 * | 6/2007 | Naoki ............... H01L 21/67051 451/5 |
| 2007/0238028 A1 * | 10/2007 | Inatomi ..................... G03F 7/40 430/5 |
| 2009/0084409 A1 | 4/2009 | Okura et al. .................... 134/21 |
| 2009/0250079 A1 | 10/2009 | Yoshihara et al. ................ 134/4 |
| 2010/0101497 A1 * | 4/2010 | Izuta ................ H01L 21/67028 118/730 |
| 2012/0131815 A1 * | 5/2012 | Kraus ............... H01L 21/67051 34/443 |
| 2012/0312336 A1 | 12/2012 | Itoh et al. ....................... 134/36 |
| 2013/0014784 A1 | 1/2013 | Ito et al. ......................... 134/10 |
| 2013/0319470 A1 | 12/2013 | Kai ............................ 134/22.12 |
| 2014/0060423 A1 | 3/2014 | Nakai et al. .................... 118/50 |
| 2014/0273498 A1 | 9/2014 | Kobayashi et al. .......... 438/745 |
| 2014/0290703 A1 | 10/2014 | Kobayashi et al. ............ 134/33 |

FOREIGN PATENT DOCUMENTS

| | | |
|---|---|---|
| JP | 10-000414 A | 1/1998 |
| JP | 2000-315671 A | 11/2000 |
| JP | 2001-298069 A | 10/2001 |
| JP | 2002-164314 A | 6/2002 |
| JP | 2002-170810 A | 6/2002 |
| JP | 2002-184660 A | 6/2002 |
| JP | 2002-299305 A | 10/2002 |
| JP | 2003-077808 A | 3/2003 |
| JP | 2003-080159 A | 3/2003 |
| JP | 2004-079909 A | 3/2004 |
| JP | 3621568 | 2/2005 |
| JP | 2006-128424 A | 5/2006 |
| JP | 2006-128569 A | 5/2006 |
| JP | 2007-088398 A | 4/2007 |
| JP | 2009-252855 A | 10/2009 |
| JP | 2012-256745 A | 12/2012 |
| JP | 2013-021184 A | 1/2013 |
| JP | 2013-102238 A | 5/2013 |
| JP | 2013-207272 A | 10/2013 |
| JP | 2014-049606 A | 3/2014 |
| JP | 2014-179490 A | 9/2014 |
| JP | 2014-194965 A | 10/2014 |

* cited by examiner

XXIII–XXIII

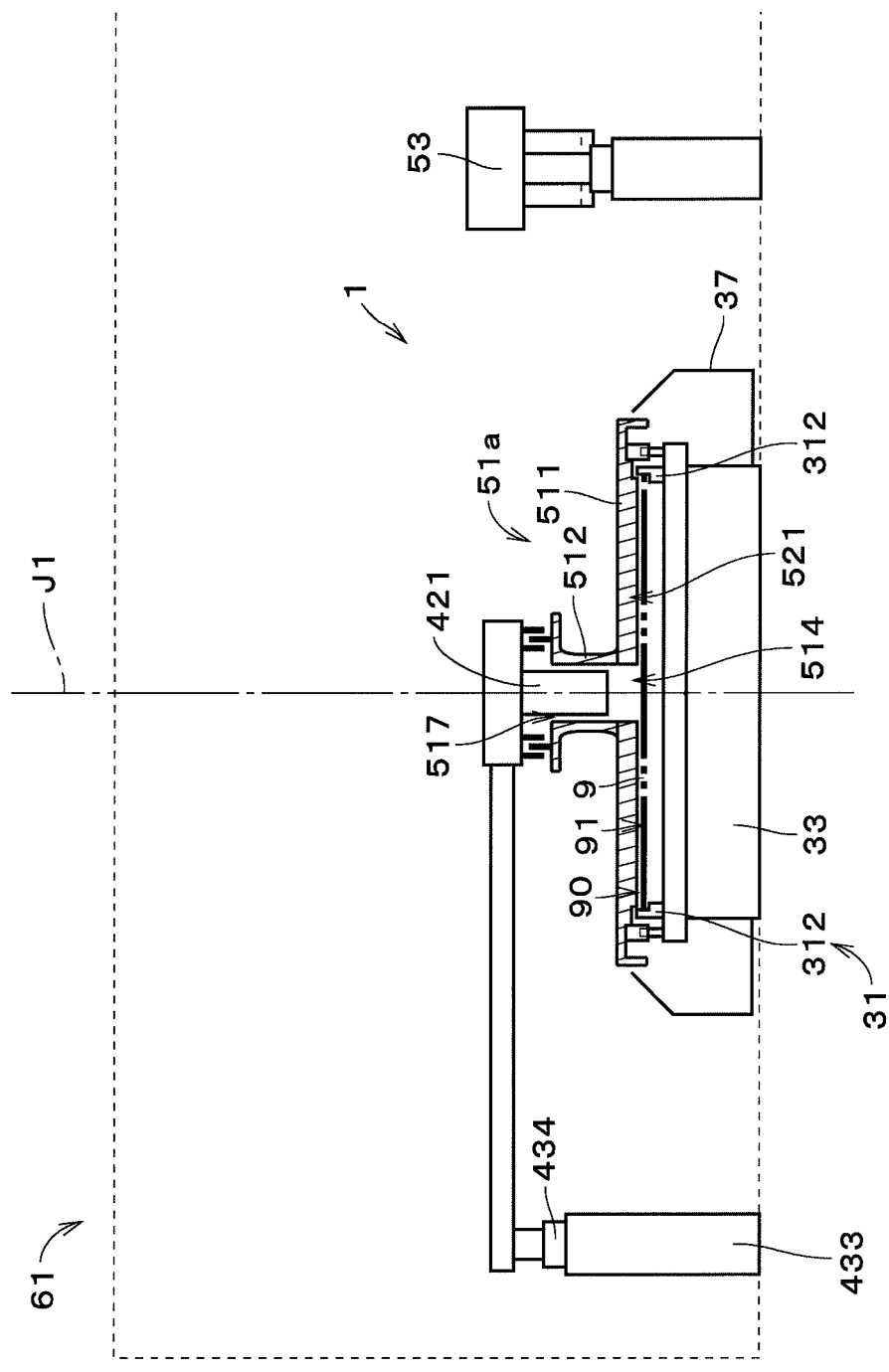

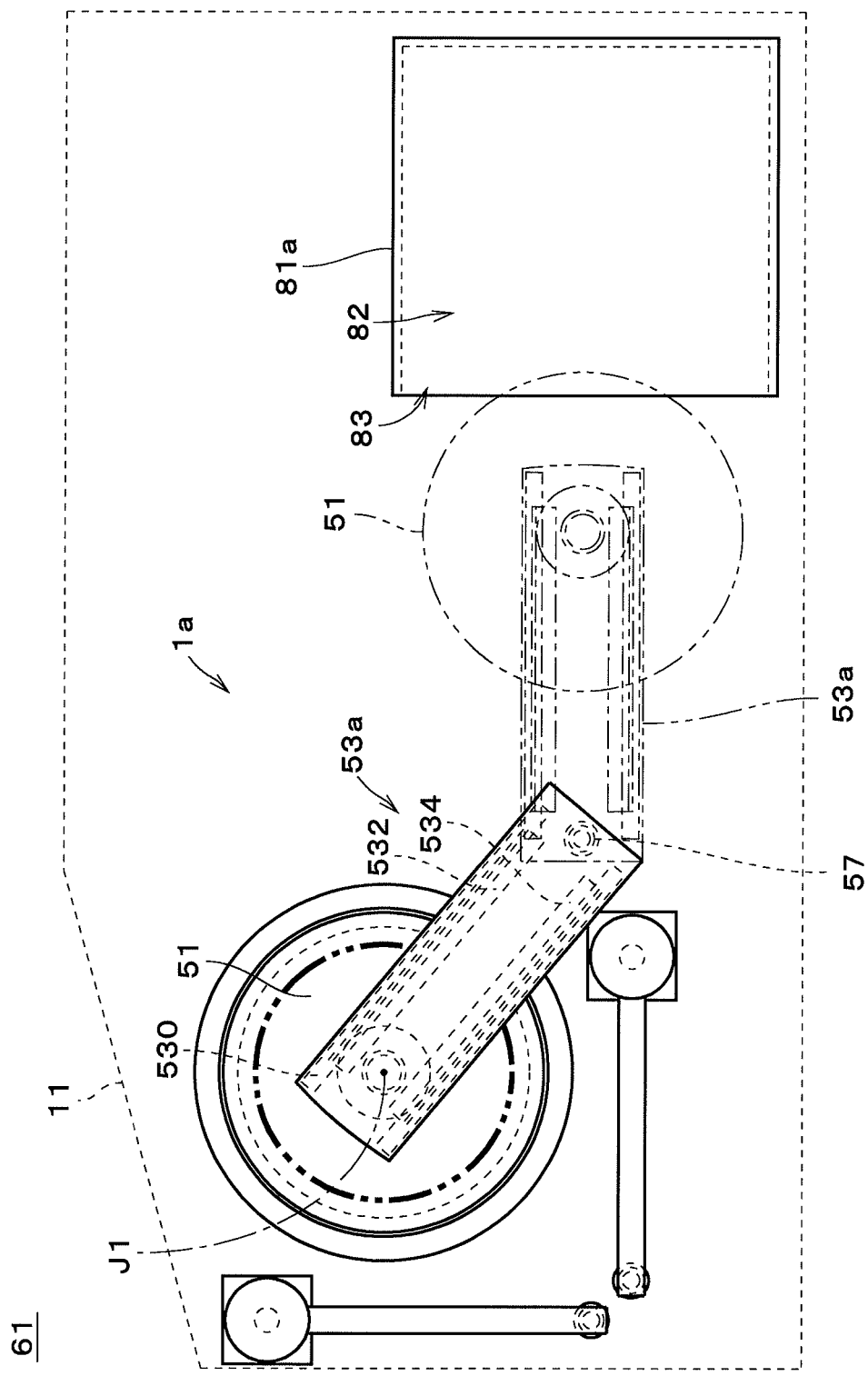

SUBSTRATE PROCESSING APPARATUS, SUBSTRATE PROCESSING SYSTEM, AND SUBSTRATE PROCESSING METHOD

CROSS-REFERENCE TO RELATED APPLICATIONS

The present application is a divisional of U.S. patent application Ser. No. 15/016,411 filed Feb. 5, 2016, which claims priority of Japanese Patent Application Nos. 2015-025718, filed Feb. 12, 2015, 2015-025719, filed Feb. 12, 2015, 2015-025720, filed Feb. 12, 2015 and 2015-037749, filed Feb. 27, 2015, the contents of which are incorporated by reference herein.

TECHNICAL FIELD

The present invention relates to a technique for processing a substrate.

BACKGROUND ART

A manufacturing process for manufacturing semiconductor substrates (hereinafter, simply referred to as "substrates") conventionally involves various types of processing to be performed on the substrates. Examples of the processing include chemical processing such as processing for supplying a chemical solution onto a substrate that has a resist pattern on its surface to etch the surface of the substrate. The chemical processing is followed by cleaning processing for cleaning the substrate by supplying a cleaning solution to the substrate and dry processing for drying the substrate.

For example, Japanese Patent Publication No. 3621568 (Document 1) discloses a substrate cleaning apparatus in which a lid member is placed on spin chunks that hold a wafer in a horizontal position and is rotated along with the wafer. When cleaning the substrate, a cleaning liquid is supplied from an upper nozzle located above and away from the lid member onto a substrate that is being rotated, through an opening of the lid member that is provided in the center of rotation. Examples of the cleaning liquid include hydrofluoric acid, hydrochloric acid, sulfuric acid, phosphoric acid, ammonia, and a hydrogen peroxide solution. Then, deionized water is supplied from the upper nozzle onto the rotating substrate to wash out the cleaning liquid adhering to the substrate. When subsequently drying the substrate, a nitrogen gas ($N_2$) is ejected from the above upper nozzle and supplied through the opening of the lid member onto the wafer. This reduces the oxygen concentration in the space between the lid member and the wafer and accelerates drying of the substrate.

The above lid member is made of a magnetic material such as iron. When moving the lid member upward away from the spin chunks, the lid member is adsorbed by an adsorptive member that is coupled to an electromagnet provided at the end of an arm, and is moved along with the arm. The substrate cleaning apparatus enables or disables the application of current to the electromagnet, with the adsorptive member kept in contact with the lid member, to allow the lid member to be adsorbed by or released from the adsorptive member.

Incidentally, in the substrate cleaning apparatus of Document 1, the cleaning liquid (e.g., hydrofluoric acid) and deionized water are successively supplied from the same nozzle. This may cause mixture of the cleaning liquid and deionized water in the nozzle.

Also, in the substrate cleaning apparatus of Document 1, outside air around the lid member may enter from a gap between the end of the upper nozzle and the opening of the lid member through the opening to the space between the lid member and the substrate. Thus, there is an upper limit to the extent of a reduction in the oxygen concentration in the space between the lid member and the wafer.

Moreover, the substrate cleaning apparatus of Document 1 requires the lid member to absolutely include a magnetic material because the lid member is adsorbed and held by a magnetic force. A holder that holds the lid member also has to include an electromagnet and needs to control turning on and off of the electromagnet. This may complicate a configuration for holding the lid member.

In the substrate cleaning apparatus of Document 1, the cleaning liquid supplied to the wafer repeatedly adheres to and is dried on the lower surface of the liquid member, which is an opposing member that opposes the wafer. As a result, residues of the cleaning liquid may be gradually accumulated on the lower surface of the lid member and become a source of pollution. This requires the lid member to be removed from the substrate cleaning apparatus for maintenance. At this time, the substrate cleaning apparatus is unable to perform processing such as cleaning the substrate, and therefore, the productivity of the apparatus may be reduced.

SUMMARY OF INVENTION

The present invention is intended for a substrate processing apparatus for processing a substrate, and it is an object of the present invention to suppress mixture of a plurality of types of processing liquids. Another object of the present invention is to reduce the entry of outside air into the space between an opposing member and a substrate. Yet another object of the present invention is to hold the opposing member with a simple configuration and to move an opposing-member holder between a holding position and a retracted position with a simple configuration. Yet another object of the present invention is to enable replacement of opposing members to be used and to suppress a reduction in productivity during substrate processing. The present invention is also directed to a substrate processing system for processing a substrate and a substrate processing method of processing a substrate.

A substrate processing apparatus according to an aspect of the present invention includes a substrate holder for holding a substrate in a horizontal position, an opposing member that opposes an upper surface of the substrate and has an opposing-member opening in a central part, an opposing-member conveying mechanism for holding the opposing member and moving the opposing member relative to the substrate holder between a first position and a second position in an up-down direction, a first processing liquid supply part for supplying a first processing liquid through a first processing liquid nozzle to the upper surface of the substrate, a second processing liquid supply part for supplying a second processing liquid through a second processing liquid nozzle to the upper surface of the substrate, a nozzle moving mechanism for individually moving the first processing liquid nozzle and the second processing liquid nozzle, specifically, moving the first processing liquid nozzle between a supply position above the opposing-member opening and a first retracted position around the substrate holder and moving the second processing liquid nozzle between the supply position and a second retracted position around the substrate holder, a substrate rotation mechanism for rotating the substrate along with the substrate holder about a central axis pointing in the up-down direction, a controller for controlling the first processing liquid supply part, the second processing liquid supply part, and the nozzle moving mechanism, and a gas supply part for supplying a gas to a space between the opposing member and the substrate. The opposing member that is located at the first position is held by the opposing-member conveying mechanism and spaced above from the substrate holder, and the opposing member that is located at the second position is held by the substrate holder and rotated along with the substrate holder by the substrate rotation mechanism. Under the control of the controller, the first processing liquid is supplied through the opposing-member opening to the substrate with the first processing liquid nozzle being located at the supply position, the first processing liquid nozzle is moved from the supply position to the first retracted position, the second processing liquid nozzle is moved from the second retracted position to the supply position, and the second processing liquid is supplied through the opposing-member opening to the substrate. This suppresses mixture of a plurality of types of processing liquids.

In a preferred embodiment of the present invention, the opposing member includes an opposing-member body that opposes the upper surface of the substrate and has the opposing-member opening in the central part, and a tubular to-be-held part that protrudes upward from the periphery of the opposing-member opening of the opposing-member body and is held by the opposing-member conveying mechanism. The first processing liquid nozzle and the second processing liquid nozzle, when located at the supply position, are inserted through an upper opening of the to-be-held part.

A substrate processing apparatus according to another aspect of the present invention includes a substrate holder for holding a substrate in a horizontal position, an opposing member that opposes an upper surface of the substrate, has an opposing-member opening in a central part, and has a tubular to-be-held part that protrudes upward from the periphery of the opposing-member opening, an opposing-member conveying mechanism for holding the to-be-held part of the opposing member and moving the opposing member relative to the substrate holder between a first position and a second position in an up-down direction, a processing liquid nozzle located on the inner side of the to-be-held part and for ejecting a processing liquid through the opposing-member opening toward the upper surface of the substrate, a substrate rotation mechanism for rotating the substrate along with the substrate holder about a central axis pointing in the up-down direction, and a gas supply part for supplying a gas to a space between the opposing member and the substrate. The opposing member that is located at the first position is held by the opposing-member conveying mechanism and spaced above from the substrate holder, and the opposing member that is located at the second position is held by the substrate holder and rotated along with the substrate holder by the substrate rotation mechanism, and the gas supply part supplies a gas to a gap between an inner surface of the to-be-held part of the opposing member and an outer surface of the processing liquid nozzle. This reduces the entry of outside air into the space between the opposing member and the substrate.

In a preferred embodiment of the present invention, the processing liquid nozzle protrudes downward from the opposing-member conveying mechanism and is inserted through an upper opening of the to-be-held part, and the gas from the gas supply part is supplied from the upper opening of the to-be-held part into the to-be-held part via the opposing-member conveying mechanism.

A substrate processing apparatus according to another aspect of the present invention includes a substrate holder for holding a substrate in a horizontal position, an opposing member that opposes an upper surface of the substrate, has an opposing-member opening in a central part, and has a tubular to-be-held part that protrudes upward from the periphery of the opposing-member opening, an opposing-member holder for holding the to-be-held part of the opposing member, an opposing-member elevating mechanism for moving the opposing member relative to the substrate holder between a first position and a second position in an up-down direction, a processing liquid nozzle located on the inner side of the to-be-held part and for ejecting a processing liquid through the opposing-member opening toward the upper surface of the substrate, a substrate rotation mechanism for rotating the substrate along with the substrate holder about a central axis pointing in the up-down direction, and an opposing-member-holder moving mechanism for moving the opposing-member holder between a holding position above the opposing member and a retracted position around the opposing member. The opposing member that is located at the first position is held by the opposing-member holder and spaced above from the substrate holder, and the opposing member that is located at the second position is held by the substrate holder and rotated along with the substrate holder by the substrate rotation mechanism. The to-be-held part includes a cylindrical flange connector centered on the central axis, and an opposing-member flange part that extends radially outward from an upper end of the flange connector. The opposing-member holder includes: a first flange supporter that is in contact with and supports part of the opposing-member flange part of the opposing member from the underside when the opposing member is located at the first position, a second flange supporter that is located on the opposite side to the first flange supporter with the flange connector located therebetween and that is in contact with and supports part of the opposing-member flange part of the opposing member from the underside when the opposing member is located at the first position, and a holder body on which the first flange supporter and the second flange supporter are mounted. With the opposing member being located at the second position, the first flange supporter and the second flange supporter are horizontally moved to space the first flange supporter and the second flange supporter radially outward from the opposing-member flange part or to dispose the first flange supporter and the second flange supporter below the opposing-member flange part. This configuration allows the opposing member to be held with a simple configuration and allows the opposing-member holder to move between the holding position and the retracted position with a simple configuration.

In a preferred embodiment of the present invention, the first flange supporter and the second flange supporter are fixed to the holder body, the opposing-member-holder moving mechanism horizontally rotates the holder body to move the opposing-member holder between the holding position and the retracted position, and the rotation of the holder body causes the first flange supporter and the second flange supporter to be spaced radially outward from the opposing-member flange part or to be disposed below the opposing-member flange part.

A substrate processing apparatus according to another aspect of the present invention includes a substrate holder for holding a substrate in a horizontal position, an opposing member that opposes an upper surface of the substrate, a processing liquid supply part for supplying a processing liquid to the upper surface of the substrate, a substrate rotation mechanism for rotating the substrate along with the substrate holder about a central axis pointing in an up-down direction, an opposing-member storage part capable of housing the opposing member, and an opposing-member conveying mechanism for holding the opposing member, moving the opposing member relative to the substrate holder between a first position and a second position in the up-down direction, and conveying the opposing member between a position above the substrate holder and the opposing-member storage part. The opposing member that is located at the first position is held by the opposing-member conveying mechanism and spaced above from the substrate holder, and the opposing member that is located at the second position is held by the substrate holder and rotated along with the substrate holder by the substrate rotation mechanism, and the opposing-member conveying mechanism conveys the opposing member from the position above the substrate holder into the opposing-member storage part and conveys another opposing member housed in the opposing-member storage part out of the opposing-member storage part to the position above the substrate holder. This configuration enables replacement of opposing members to be used.

In a preferred embodiment of the present invention, the opposing member and the another opposing member are of different types.

These and other objects, features, aspects and advantages of the present invention will become more apparent from the following detailed description of the present invention when taken in conjunction with the accompanying drawings.

BRIEF DESCRIPTION OF DRAWINGS

FIG. 36 is a cross-sectional view of part of the processing unit;
FIG. 37 is a plan view of a processing unit of a substrate processing system according to a fifth embodiment.

DESCRIPTION OF EMBODIMENTS

Figure 1:
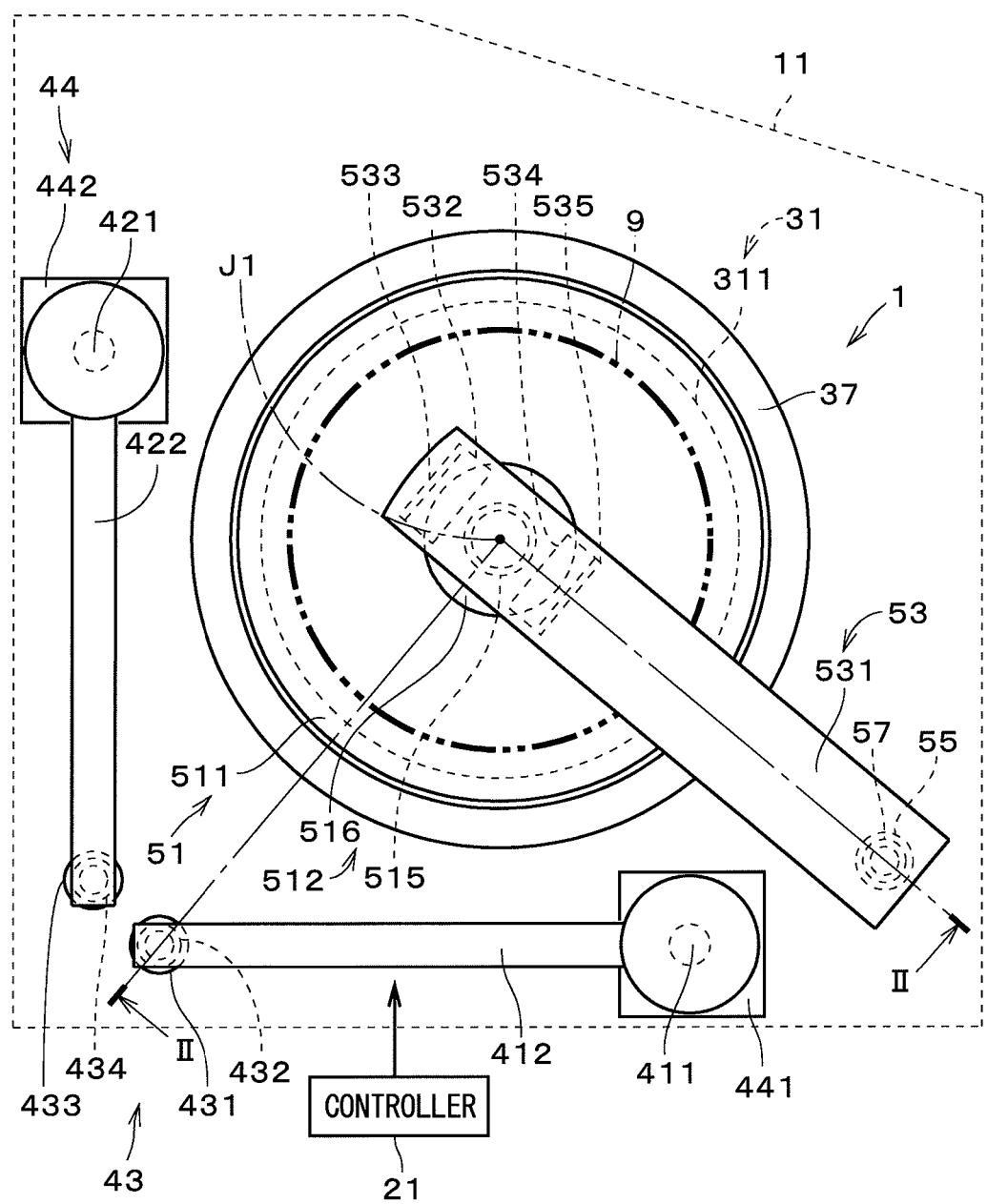
FIG. 1 is a plan view of a substrate processing apparatus according to a first embodiment.
Figure 2:
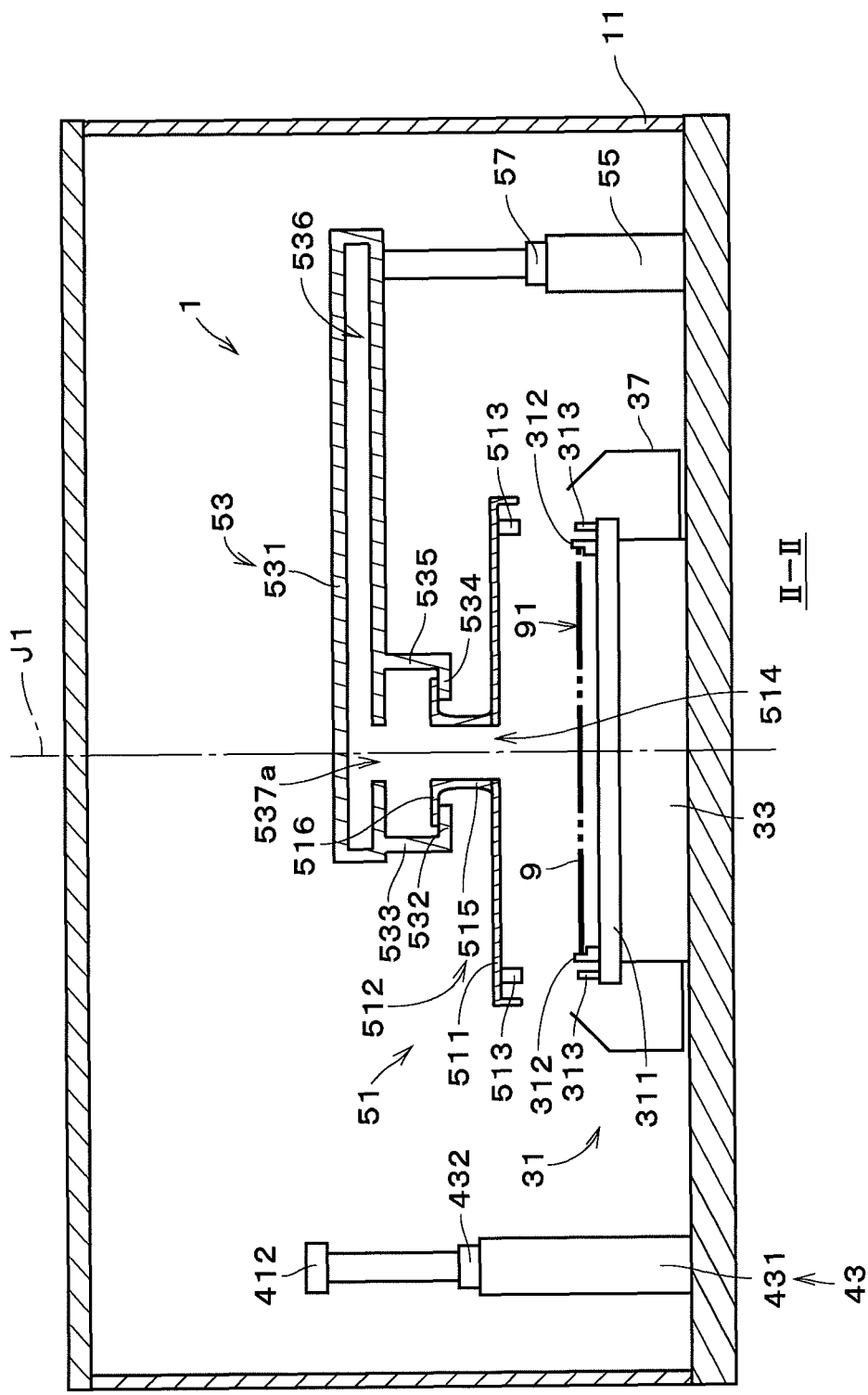
FIG. 2 is a cross-sectional view of the substrate processing apparatus.

FIG. 1 is a plan view of a substrate processing apparatus 1 according to a first embodiment of the present invention. FIG. 2 is a cross-sectional view of the substrate processing apparatus 1 taken along II-II in FIG. 1. The substrate processing apparatus 1 is a sheet-fed apparatus for processing semiconductor substrates 9 (hereinafter, simply referred to as "substrates 9") one at a time. The substrate processing apparatus 1 is housed in a housing 11, which is an apparatus housing chamber. In FIG. 1, the housing 11 is indicated by a broken line.

The substrate processing apparatus 1 includes a controller 21, a substrate holder 31, a substrate rotation mechanism 33, a cup part 37, a first processing liquid nozzle 411, a second processing liquid nozzle 421, a nozzle moving mechanism 43, a nozzle cleaning part 44, a top plate 51, an opposing-member holder 53, an opposing-member elevating mechanism 55, and an opposing-member-holder moving mechanism 57. The controller 21 controls constituent elements of, for example, the substrate rotation mechanism 33, the nozzle moving mechanism 43, the nozzle cleaning part 44, the opposing-member elevating mechanism 55, and the opposing-member-holder moving mechanism 57 and constituent elements of, for example, a first processing liquid supply part 413, a second processing liquid supply part 423, and a gas supply part 45, which will be described later. In FIG. 2 onward, the controller 21 is not shown.

In FIG. 1, the first processing liquid nozzle 411 and the second processing liquid nozzle 421 are spaced from the top plate 51 in a plan view and located at their respective retracted positions around the top plate 51. In the following description, when there is no particular need to distinguish between the first processing liquid nozzle 411 and the second processing liquid nozzle 421, the first processing liquid nozzle 411 and the second processing liquid nozzle 421 are collectively referred to as "processing liquid nozzles," or either the first processing liquid nozzle 411 or the second processing liquid nozzle 421 is simply referred to as a "processing liquid nozzle."

The substrate holder 31 holds a substrate 9 in a horizontal position. The substrate holder 31 includes a base part 311, a plurality of chucks 312, and a plurality of engagement parts 313. The base part 311 is a generally disc-shaped member centered on a central axis J1 pointing in the up-down direction. The substrate 9 is disposed above the base part 311. The chucks 312 are generally equiangularly spaced about the central axis J1 and circumferentially arranged on the outer periphery of the upper surface of the base part 311. The chucks 312 of the substrate holder 31 hold the outer edge of the substrate 9. The engagement parts 313 are generally equiangularly spaced about the central axis J1 and circumferentially arranged on the outer periphery of the upper surface of the base part 311. The engagement parts 313 are located radially outward of the chucks 312. The substrate rotation mechanism 33 is located below the substrate holder 31. The substrate rotation mechanism 33 rotates the substrate 9 along with the substrate holder 31 about the central axis J1.

The cup part 37 is an annular member centered on the central axis J1 and is located radially outward of the substrate 9 and the substrate holder 31. The cup part 37 covers the entire circumferences of the substrate 9 and the substrate holder 31 and receives, for example, processing liquids that are dispersed from the substrate 9 to the surroundings. The cup part 37 has a discharge port (not shown) at the bottom. The processing liquids or other substances received by the cup part 37 are discharged through the discharge port to the outside of the housing 11. Also, gases in the cup part 37 are exhausted through the discharge port to the outside of the housing 11.

The top plate 51 is a generally circular member in a plan view. The top plate 51 is an opposing member that opposes an upper surface 91 of the substrate 9 and acts as a shield plate that shields above the top of the substrate 9. The top plate 51 includes an opposing-member body 511, a to-be-held part 512 and a plurality of engagement parts 513. The opposing-member body 511 is a generally disc-shaped member centered on the central axis J1. The opposing-member body 511 opposes the upper surface 91 of the substrate 9. The opposing-member body 511 has an opposing-member opening 514 in the central part. The opposing-member opening 514 is, for example, generally circular in a plan view. The diameter of the opposing-member opening 514 is smaller enough than the diameter of the substrate 9. The engagement parts 513 are generally equiangularly spaced about the central axis J1 and circumferentially arranged on the outer periphery of the lower surface of the opposing-member body 511.

The to-be-held part 512 is a tubular part that protrudes upward from the periphery of the opposing-member opening 514 of the opposing-member body 511. The to-be-held part 512 includes a flange connector 515 and an opposing-member flange part 516. The flange connector 515 has a generally cylindrical shape centered on the central axis J1. The flange connector 515 is connected to the opposing-member body 511 in the vicinity of the edge of the opposing-member opening 514. The opposing-member flange part 516 extends radially outward from the upper end of the flange connector 515. The opposing-member flange part 516 has, for example, a generally annular plate-like shape centered on the central axis J1.

The opposing-member holder 53 holds the to-be-held part 512 of the top plate 51. The opposing-member holder 53 includes a holder body 531, a first flange supporter 532, a first connector 533, a second flange supporter 534, and a second connector 535. The holder body 531 is a rod-like arm that extends generally horizontally. A base (i.e., the right end in FIG. 2) of the holder body 531 is connected to the opposing-member elevating mechanism 55 and the opposing-member-holder moving mechanism 57. In the substrate processing apparatus 1, the opposing-member holder 53, the opposing-member elevating mechanism 55, and the opposing-member-holder moving mechanism 57 constitute an opposing-member conveying mechanism for conveying the top plate 51. The opposing-member conveying mechanism may include other constituent elements.

Inside the holder body 531 is a holder inner space 536 that extends generally along the entire length of the holder body 531. The lower surface of the tip end of the holder body 531 has an opening 537a that communicates with the holder inner space 536. The opening 537a is located above the to-be-held part 512 of the top plate 51.

The first flange supporter 532, the first connector 533, the second flange supporter 534, and the second connector 535 are mounted on the tip end of the holder body 531. The first flange supporter 532 and the first connector 533 are located in the vicinity of the tip end of the holder body 531, and the second flange supporter 534 and the second connector 535 are located between the base of the holder body 531 and a pair of the first flange supporter 532 and the first connector 533. The second flange supporter 534 is located on the opposite side to the first flange supporter 532 with the flange connector 515 of the top plate 51 located therebetween.

Figure 3:
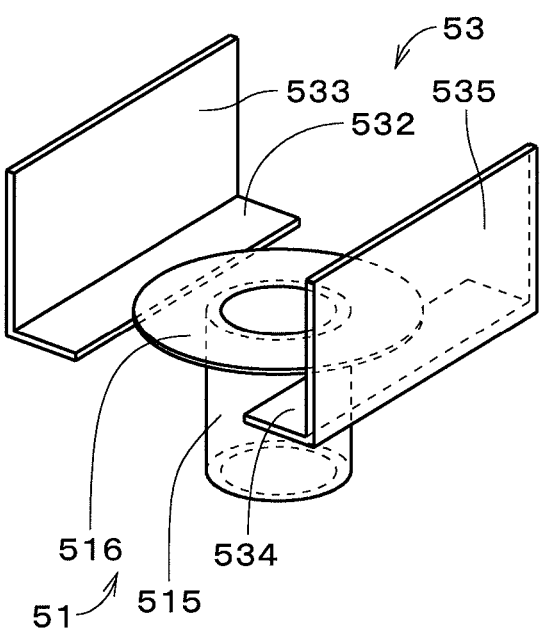
FIG. 3 is an enlarged perspective view of around an end portion of an opposing-member holder.

FIG. 3 is an enlarged perspective view of around the end portion of the opposing-member holder 53. In FIG. 3, the holder body 531 and the opposing-member body 511 are not shown. As illustrated in FIGS. 1 to 3, the first connector 533 and the second connector 535 are each a generally flat plate-like part that extends downward from the lower surface of the holder body 531. The first connector 533 and the second connector 535 each extend in a direction that is generally perpendicular to the longitudinal direction of the holder body 531. The first flange supporter 532 is a generally flat plate-like part that extends generally horizontally from the lower end of the first connector 533. The first flange supporter 532 extends from the first connector 533 toward the base of the holder body 531. The second flange supporter 534 is a generally flat plate-like part that extends generally horizontally from the lower end of the second connector 535. The second flange supporter 534 extends from the second connector 535 toward the tip end of the holder body 531.

The distance in the longitudinal direction of the holder body 531 between the first flange supporter 532 and the second flange supporter 534 is smaller than the outer diameter of the opposing-member flange part 516 of the top plate 51 and greater than the outer diameter of the flange connector 515. The distance in the longitudinal direction of the holder body 531 between the first connector 533 and the second connector 535 is greater than the outer diameter of the opposing-member flange part 516. As illustrated in FIGS. 1 and 2, the opening 537a is located between the first connector 533 and the second connector 535 in the longitudinal direction of the holder body 531.

In the example in FIG. 1, the first flange supporter 532 and the second flange supporter 534 are fixed to the holder body 531 via the first connector 533 and the second connector 535. In other words, the first flange supporter 532 and the second flange supporter 534 are non-movable parts of the opposing-member holder 53, and the positions of the first flange supporter 532 and the second flange supporter 534 relative to the holder body 531 remain unchanged.

With the top plate 51 located at the position illustrated in FIG. 2, the first flange supporter 532 and the second flange supporter 534 are each in contact with and support part of the opposing-member flange part 516 of the top plate 51 from the underside. Thus, the top plate 51 is suspended from the opposing-member holder 53 above the substrate 9 and the substrate holder 31. In the following description, this position of the top plate 51 in the up-down direction in FIG. 2 is referred to as a "first position." The top plate 51 that is located at the first position is held by the opposing-member holder 53 and spaced above from the substrate holder 31.

The first flange supporter 532 and the second flange supporter 534 includes a mobility limiting part (not shown) for limiting a positional shift of the top plate 51 (i.e., movement and rotation of the top plate 51). The mobility limiting part includes, for example, protrusions that protrude upward from the upper surfaces of the first flange supporter 532 and the second flange supporter 534, and through holes of the opposing-member flange part 516 in which the protrusions are inserted. Alternatively, the mobility limiting part may, for example, include protrusions that protrude upward from the upper surfaces of the first flange supporter 532 and the second flange supporter 534 and that are in contact with the outer edge of the opposing-member flange part 516. The same applies to a substrate processing apparatus 1a, which will be described later.

Figure 4:
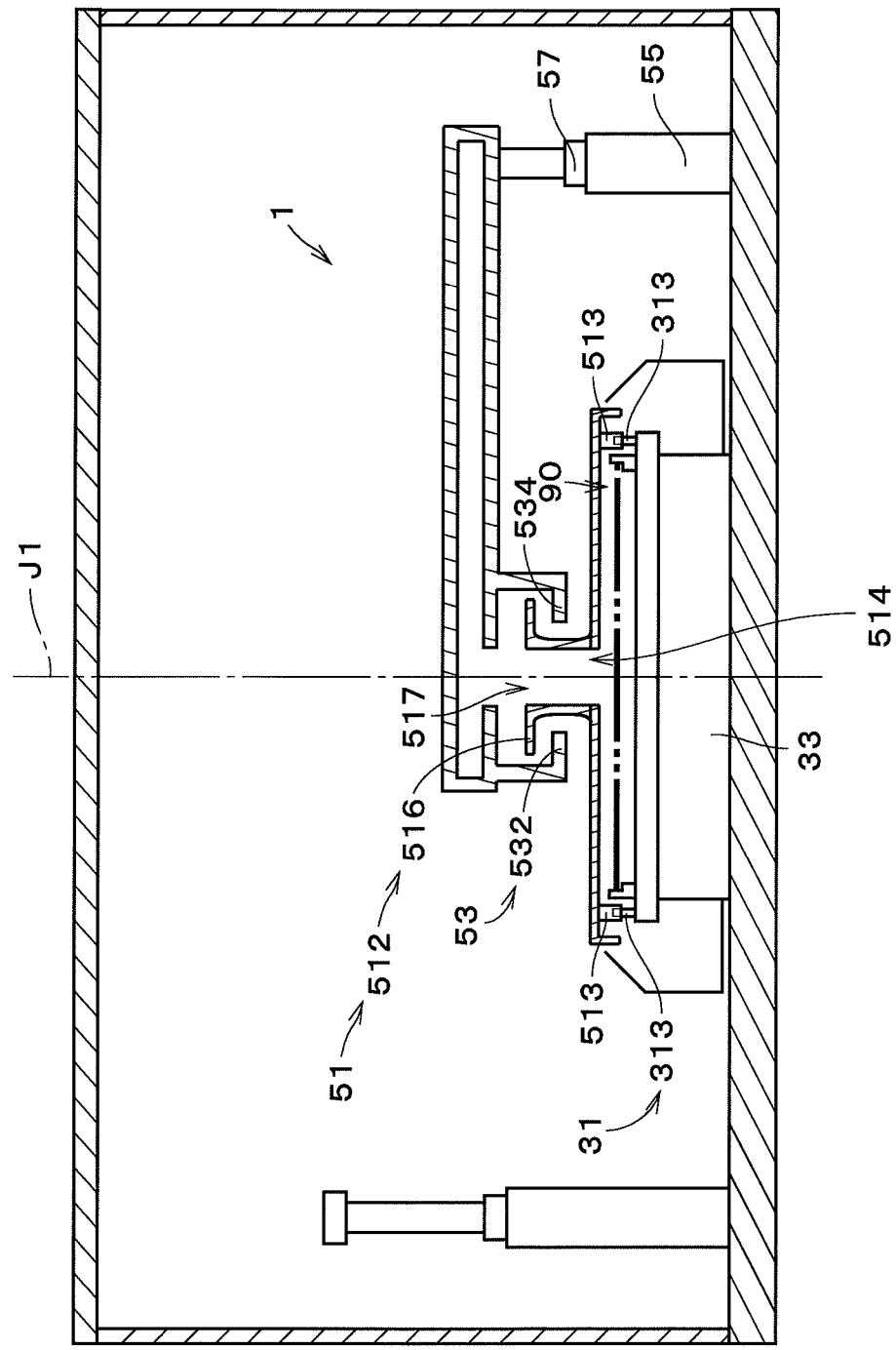
FIG. 4 is a cross-sectional view of the substrate processing apparatus.

The opposing-member elevating mechanism 55 moves the top plate 51 along with the opposing-member holder 53 in the up-down direction. FIG. 4 is a cross-sectional view illustrating the top plate 51 that has been moved down from the first position illustrated in FIG. 2. In the following description, the position of the top plate 51 in the up-down direction in FIG. 4 is referred to as a "second position." That is, the opposing-member elevating mechanism 55 moves the top plate 51 between the first position and the second position in the up-down direction. The second position is a position below the first position. In other words, the second position is a position at which the top plate 51 is closer to the substrate holder 31 in the up-down direction than at the first position.

With the top plate 51 located at the second position, the engagement parts 513 of the top plate 51 are respectively engaged with the engagement parts 313 of the substrate holder 31. The engagement parts 513 are supported from below by the engagement parts 313. For example, the engagement parts 313 are pins that extend generally parallel to the up-down direction, and the upper ends of the engagement parts 313 fit into upwardly opening recesses that are formed in the lower ends of the engagement parts 513. The opposing-member flange part 516 of the top plate 51 is spaced above from the first flange supporter 532 and the second flange supporter 534 of the opposing-member holder 53. Thus, the top plate 51 that is located at the second position is held by the substrate holder 31 and spaced from the opposing-member holder 53 (i.e., without contact with the opposing-member holder 53). When the substrate rotation mechanism 33 is driven with the top plate 51 located at the second position, the top plate 51 rotates along with the substrate holder 31.

The opposing-member holder 53 is horizontally movable in the state where the top plate 51 is located at the second position, i.e., where the opposing-member flange part 516 is spaced above from the first flange supporter 532 and the second flange supporter 534. The opposing-member-holder moving mechanism 57 horizontally moves the opposing-member holder 53 that is horizontally movable. In the example in FIG. 1, the opposing-member holder 53 is moved in the state where the first processing liquid nozzle 411 and the second processing liquid nozzle 421 are located at their respective retracted positions. The opposing-member holder 53 is horizontally moved by the opposing-member-holder moving mechanism 57 horizontally rotating the holder body 531.

As illustrated in FIGS. 1 and 2, the nozzle moving mechanism 43 includes a first nozzle elevating mechanism 431, a first nozzle rotation mechanism 432, a second nozzle elevating mechanism 433, and a second nozzle rotation mechanism 434. The first processing liquid nozzle 411 is connected to the end of the first arm 412 that extends horizontally from the first nozzle elevating mechanism 431 and the first nozzle rotation mechanism 432. The first nozzle elevating mechanism 431 moves the first processing liquid nozzle 411 along with the first arm 412 in the up-down direction. The first nozzle rotation mechanism 432 horizontally rotates the first processing liquid nozzle 411 along with the first arm 412.

As illustrated in FIG. 1, the second processing liquid nozzle 421 is connected to the end of a second arm 422 that extends horizontally from the second nozzle elevating mechanism 433 and the second nozzle rotation mechanism 434. The second nozzle elevating mechanism 433 moves the second processing liquid nozzle 421 along with the second arm 422 in the up-down direction. The second nozzle rotation mechanism 434 horizontally rotates the second processing liquid nozzle 421 along with the second arm 422.

Figure 5:
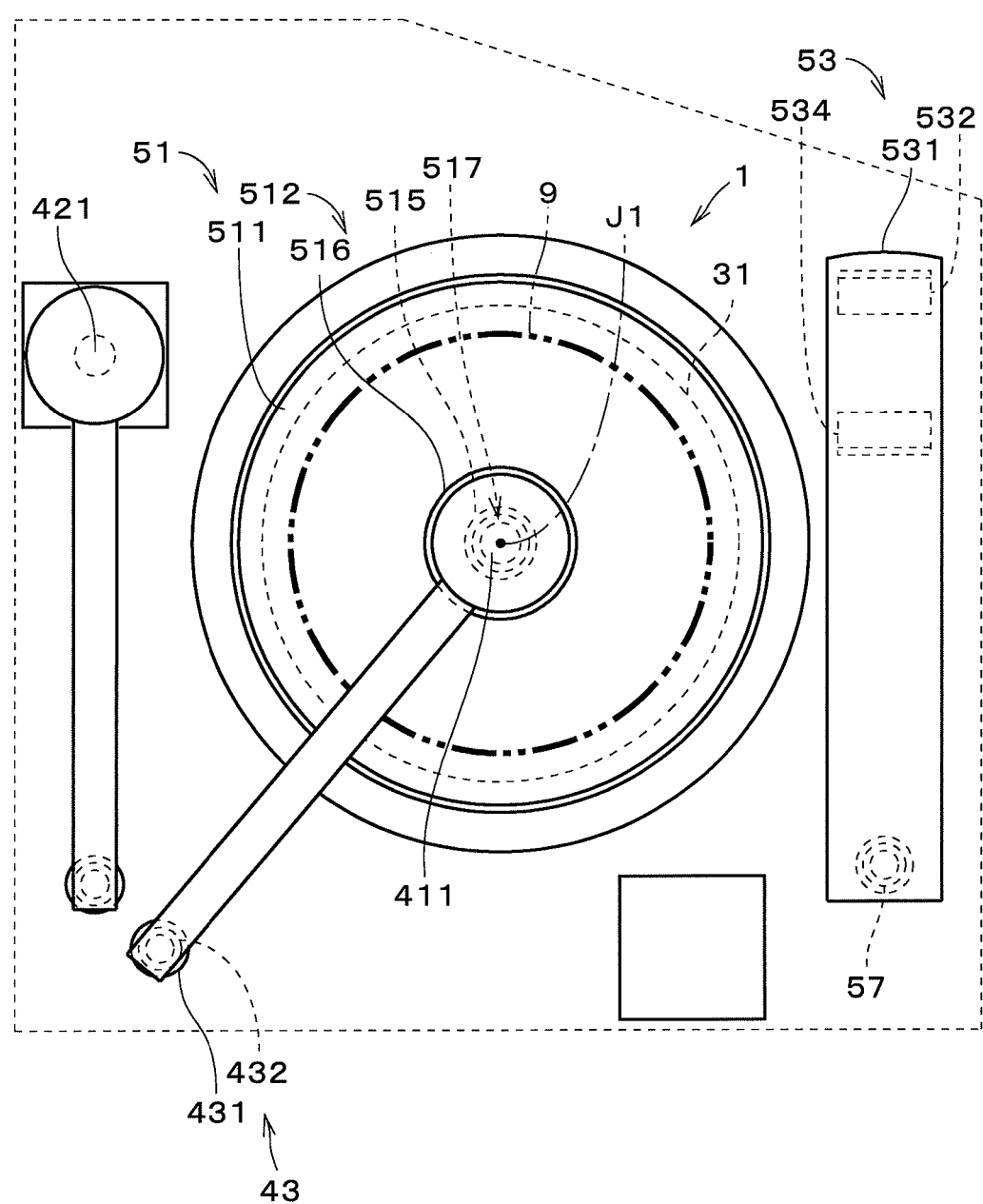
FIG. 5 is a plan view of the substrate processing apparatus.

FIG. 5 is a plan view of the substrate processing apparatus 1. The opposing-member holder 53 is moved by the opposing-member-holder moving mechanism 57 between a position above the top plate 51 as illustrated in FIG. 1 and a position around the top plate 51 as illustrated in FIG. 5 (i.e., a position that avoids any overlap with the top plate 51). In the following description, the position of the opposing-member holder 53 in a plan view in FIG. 1 is referred to as a "holding position," and the position of the opposing-member holder 53 in a plan view in FIG. 5 is referred to as a "retracted position."

In the substrate processing apparatus 1, the first flange supporter 532 and the second flange supporter 534 are horizontally moved by the opposing-member-holder moving mechanism 57 rotating the holder body 531 with the top plate 51 located at the second position. Accordingly, when the opposing-member holder 53 is located at the holding position, the first flange supporter 532 and the second flange supporter 534 are moved radially outward away from the opposing-member flange part 516 and the flange connector 515 to the retracted position. When the opposing-member holder 53 is located at the retracted position, the first flange supporter 532 and the second flange supporter 534 are moved to the holding position and disposed below the opposing-member flange part 516.

Figure 6:
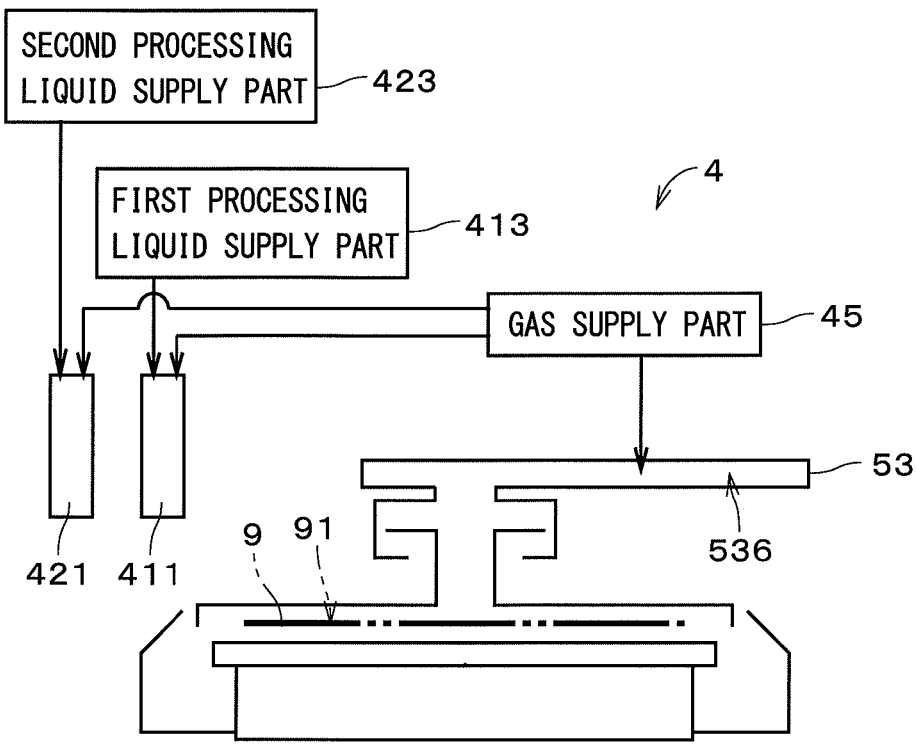
FIG. 6 is a block diagram of a gas-liquid supply part.

FIG. 6 is a block diagram of the gas-liquid supply part 4, related to the supply of gases and processing liquids in the substrate processing apparatus 1. The gas-liquid supply part 4 includes the first processing liquid nozzle 411, the second processing liquid nozzle 421, the first processing liquid supply part 413, the second processing liquid supply part 423, and the gas supply part 45. The first processing liquid supply part 413 is connected to the first processing liquid nozzle 411. As will be described later, with the first processing liquid nozzle 411 located above the substrate 9, the first processing liquid supply part 413 supplies a first processing liquid through the first processing liquid nozzle 411 to the upper surface 91 of the substrate 9. The second processing liquid supply part 423 is connected to the second processing liquid nozzle 421. As will be described later, with the second processing liquid nozzle 421 located above the substrate 9, the second processing liquid supply part 423 supplies a second processing liquid through the second processing liquid nozzle 421 to the upper surface 91 of the substrate 9. The gas supply part 45 is connected to the opposing-member holder 53 and supplies a gas to the holder inner space 536 of the opposing-member holder 53. The gas supply part 45 is also connected to the first processing liquid nozzle 411 and the second processing liquid nozzle 421 and supplies gases to the first processing liquid nozzle 411 and the second processing liquid nozzle 421.

In the substrate processing apparatus 1, various types of liquids are used as the first processing liquid and the second processing liquid. Each of the first processing liquid and the second processing liquid may, for example, be a chemical solution for use in chemical processing to be performed on the substrate 9 (e.g., a polymer removing solution or an etchant such as hydrofluoric acid or an aqueous solution of tetramethyl ammonium hydroxide). Each of the first processing liquid and the second processing liquid may also be a cleaning liquid such as deionized water (DIW) or carbonated water for use in cleaning the substrate 9. Each of the first processing liquid and the second processing liquid may also be isopropyl alcohol (IPA) that is supplied as a substitute for the liquid on the substrate 9. The first processing liquid and the second processing liquid may preferably be liquids of different types. The gas supplied from the gas supply part 45 may, for example, be an inert gas such as a nitrogen gas ($N_2$). Alternatively, the gas supply part 45 may supply various gases other than inert gases.

Figure 7:
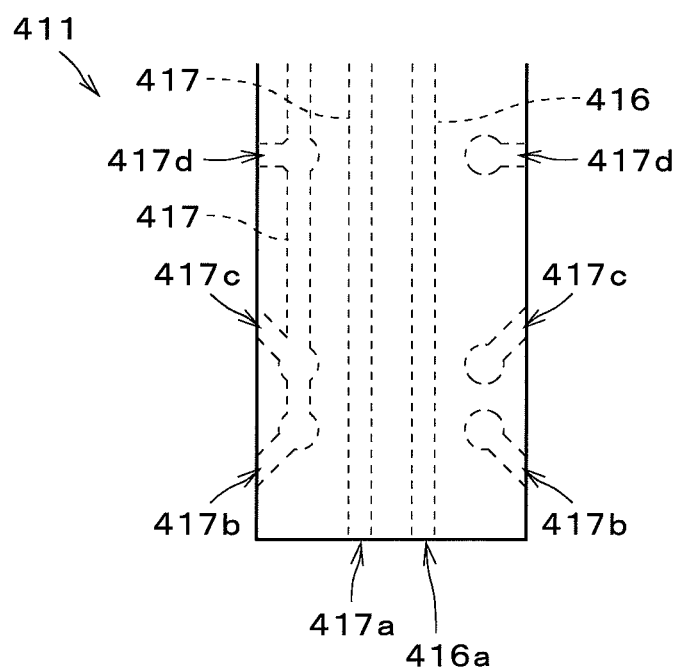
FIG. 7 is a cross-sectional view of part of a first processing liquid nozzle.

FIG. 7 is an enlarged cross-sectional view of part of the first processing liquid nozzle 411. The first processing liquid nozzle 411 is made of, for example, tetrafluoroethylene-perfluoroalkylvinylether copolymer (PFA). The first processing liquid nozzle 411 includes a processing liquid passage 416 and two gas passages 417. The processing liquid passage 416 is connected to the first processing liquid supply part 413 illustrated in FIG. 6. The two gas passages 417 are connected to the gas supply part 45 illustrated in FIG. 6.

The first processing liquid supplied from the first processing liquid supply part 413 to the processing liquid passage 416 is ejected downward from an ejection port 416a that is provided in the lower end surface of the first processing liquid nozzle 411. The inert gas supplied from the gas supply part 45 to the gas passage 417 in the center of the nozzle (i.e., the gas passage 417 on the right in FIG. 7) is supplied (e.g., jet) downward from a lower-surface jet opening 417a that is provided in the lower end surface of the first processing liquid nozzle 411. The inert gas supplied from the gas supply part 45 to the gas passage 417 on the outer periphery is supplied to the surroundings from a plurality of side-surface jet openings 417b, 417c, and 417d that are provided in the outer surface of the first processing liquid nozzle 411.

The side-surface jet openings 417b are circumferentially arrayed at generally equiangular intervals. The side-surface jet openings 417b are connected to a circumferential passage that extends circumferentially from the low end of the gas passage 417 on the outer periphery. The side-surface jet openings 417c are circumferentially arrayed at generally equiangular intervals above the side-surface jet openings 417b. The side-surface jet openings 417c are connected to a circumferential passage that extends circumferentially from the gas passage 417. The side-surface jet openings 417d are circumferentially arrayed at generally equiangular intervals above the side-surface jet openings 417c. The side-surface jet openings 417d are connected to a circumferential passage that extends circumferentially from the gas passage 417. The first processing liquid nozzle 411 may also include other gas passages 417, and the side-surface jet openings 417c and the side-surface jet openings 417d may be connected to the other gas passages 417.

The inert gas supplied from the gas supply part 45 (see FIG. 6) is supplied (e.g., jet) obliquely downward from the side-surface jet openings 417b and supplied (e.g., jet) obliquely upward from the side-surface jet openings 417c. The inert gas supplied from the gas supply part 45 is also supplied (e.g., jet) approximately horizontally from the side-surface jet openings 417d.

Note that the first processing liquid nozzle 421 may include only a single side-surface jet opening 417b, a single side-surface jet opening 417c, and a single side-surface jet opening 417d. The configuration of the second processing liquid nozzle 421 is similar to the configuration of the first processing liquid nozzle 411 illustrated in FIG. 7. The second processing liquid nozzle 421 ejects the second processing liquid from ejection ports provided in the lower end surface.

Figure 8:
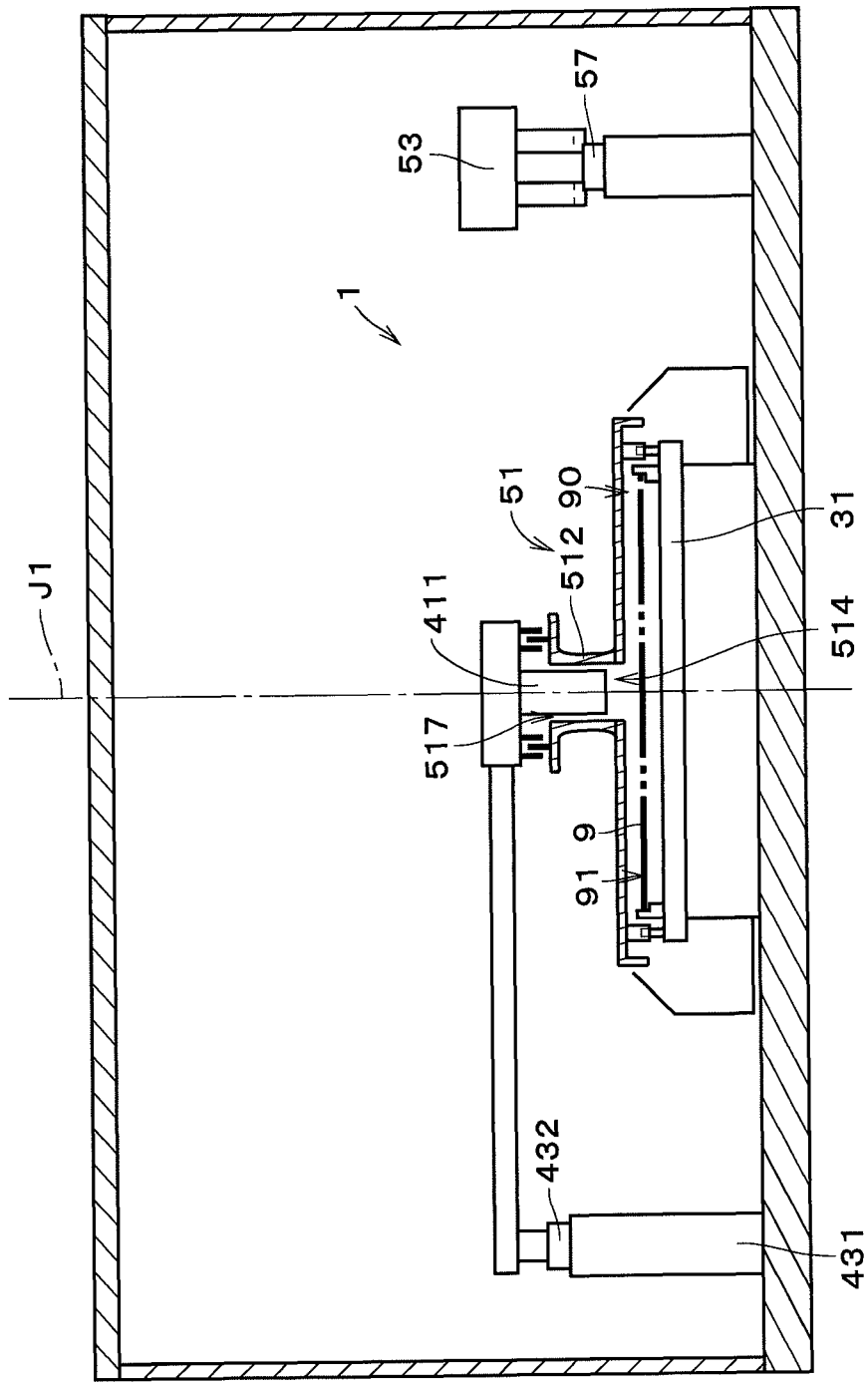
FIG. 8 is a cross-sectional view of the substrate processing apparatus.

FIG. 8 is a cross-sectional view of the substrate processing apparatus 1. FIG. 8 illustrates a state in which the top plate 51 located at the second position is held by the substrate holder 31. The opposing-member holder 53 has been retracted from the holding position to the retracted position by the opposing-member-holder moving mechanism 57. As illustrated in FIGS. 5 and 8, with the opposing-member holder 53 retracted, the first processing liquid nozzle 411 is moved from its retracted position (i.e., first retracted position) by the first nozzle elevating mechanism 431 and the first nozzle rotation mechanism 432 and inserted into the to-be-held part 512 through the upper opening 517 of the to-be-held part 512 of the top plate 51. The first processing liquid nozzle 411 is located inside the to-be-held part 512. In other words, the outer surface of the first processing liquid nozzle 411 radially opposes the inner surface of the to-be-held part 512. In the following description, the position of the first processing liquid nozzle 411 in FIG. 8 is referred to as a "supply position" (the same applies to the second processing liquid nozzle 421). In the example in FIG. 8, the end (i.e., lower end) of the first processing liquid nozzle 411 located at the supply position is located above the lower edge of the opposing-member opening 514 of the opposing-member body 511. Alternatively, the end of the first processing liquid nozzle 411 may be located at the same position as the lower edge of the opposing-member opening 514 in the up-down direction.

The first processing liquid supplied from the first processing liquid supply part 413 (see FIG. 6) is ejected from the ejection port 416*a* (see FIG. 7) of the first processing liquid nozzle 411 through the opposing-member opening 514 toward the upper surface 91 of the substrate 9. Part of the inert gas supplied from the gas supply part 45 (see FIG. 6) is supplied from the lower-surface jet opening 417*a* (see FIG. 7) of the first processing liquid nozzle 411 through the opposing-member opening 514 to a space 90 (hereinafter, referred to as a "processing space 90") between the top plate 51 and the substrate 9.

Figure 9:
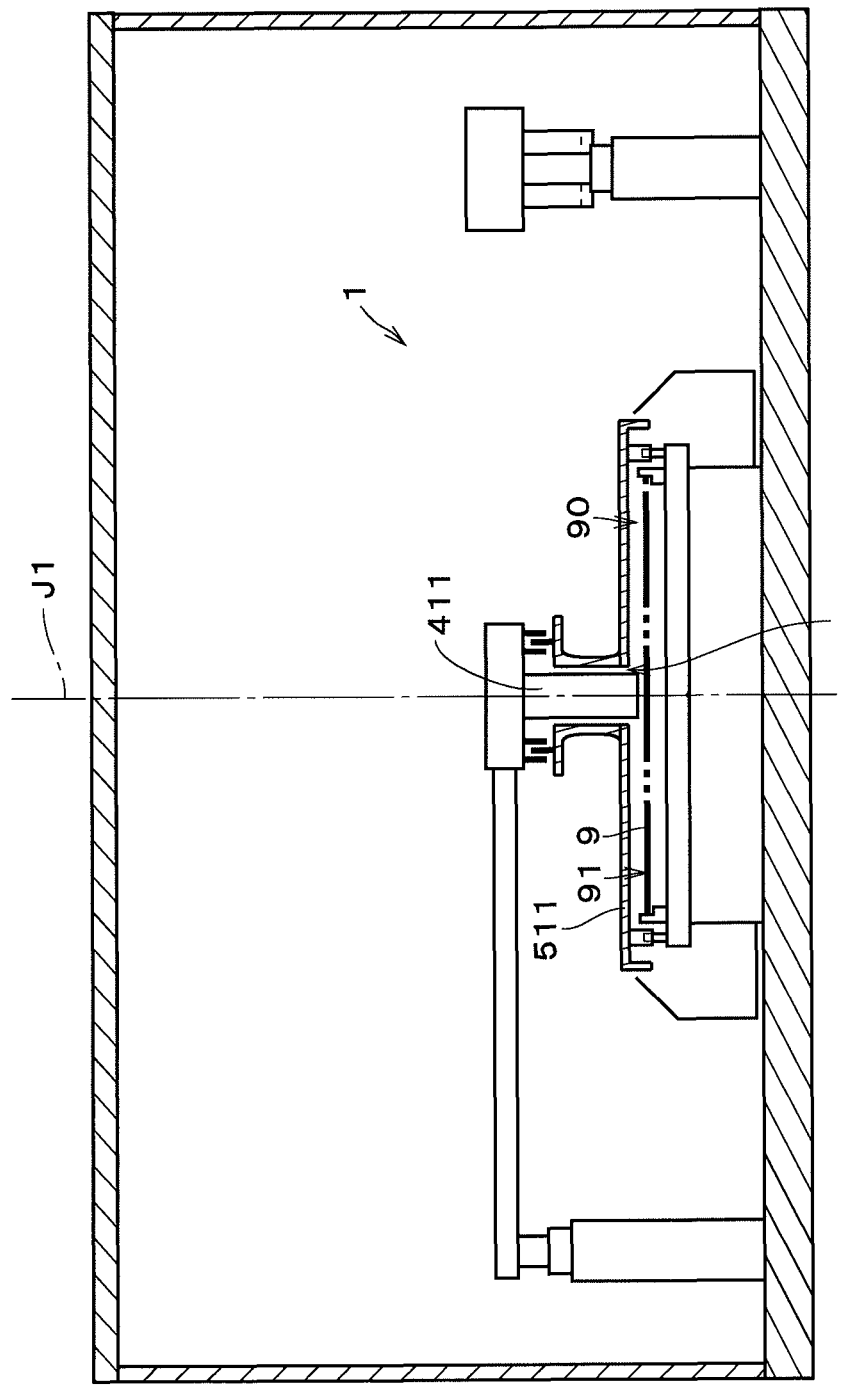
FIG. 9 is a cross-sectional view of the substrate processing apparatus.

In the substrate processing apparatus 1, the first processing liquid nozzle 411 may protrude downward from the opposing-member opening 514 of the opposing-member body 511 as illustrated in FIG. 9. In other words, the end of the first processing liquid nozzle 411 is located below the lower edge of the opposing-member opening 514. Part of the inert gas supplied from the gas supply part 45 flows down in the first processing liquid nozzle 411 through the opposing-member opening 514 and is supplied from the lower-surface jet opening 417*a* of the first processing liquid nozzle 411 to the processing space 90. The first processing liquid supplied from the first processing liquid supply part 413 flows down in the first processing liquid nozzle 411 through the opposing-member opening 514 and is ejected from the ejection port 416*a* of the first processing liquid nozzle 411 toward the upper surface 91 of the substrate 9. In the following description, the supply of the first processing liquid through the opposing-member opening 514 refers to not only the state where the first processing liquid ejected from the first processing liquid nozzle 411 above the opposing-member opening 514 passes through the opposing-member opening 514, but also the state where the first processing liquid is ejected through the first processing liquid nozzle 411 inserted in the opposing-member opening 514 as illustrated in FIG. 9. The same applies to the second processing liquid nozzle 421 and the second processing liquid, which will be described later.

Figure 10:
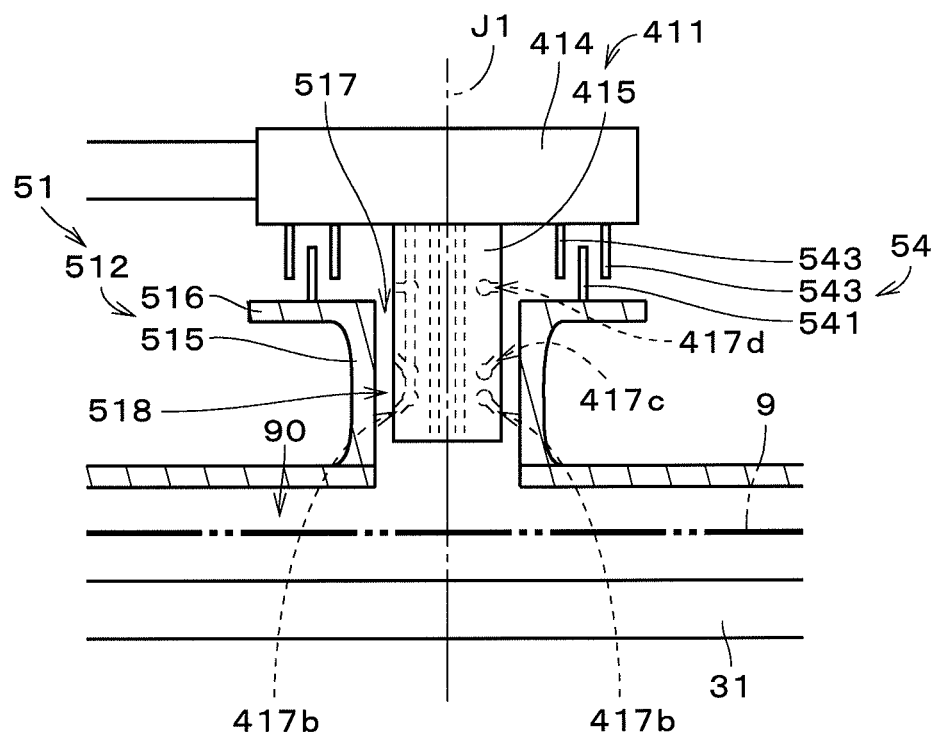
FIG. 10 is a cross-sectional view of around the first processing liquid nozzle.

FIG. 10 is an enlarged cross-sectional view of the first processing liquid nozzle 411 in FIG. 8 and around the first processing liquid nozzle 411. In FIG. 10, the top plate 51 is located at the second position. The first processing liquid nozzle 411 includes a nozzle body 415 and a nozzle flange part 414. The nozzle body 415 has a generally columnar shape and is inserted into the flange connector 515 of the to-be-held part 512. The nozzle flange part 414 is connected to the upper end of the nozzle body 415. The nozzle flange part 414 is a generally disc-shaped part that extends radially outward from the top of the nozzle body 415. The nozzle flange part 414 opposes the upper surface of the opposing-member flange part 516.

In the example in FIG. 10, a labyrinth 54 is formed between the upper surface of the opposing-member flange part 516 and the lower surface of the nozzle flange part 414. To be specific, the labyrinth 54 with a first protrusion 541 and two second protrusions 543 is formed around the entire circumference, the first protrusion 541 protruding upward from the upper surface of the opposing-member flange part 516, and the second protrusions 543 protruding downward from the lower surface of the nozzle flange part 414 of the first processing liquid nozzle 411 located at the supply position. The first protrusion 541 and the two second protrusions 543 have generally cylindrical shapes centered on the central axis J1 and have different diameters. The diameter of the first protrusion 541 is greater than the diameter of the inner second protrusion 543 and smaller than the diameter of the outer second protrusion 543. The upper end of the first protrusion 541 is located above the lower ends of the two second protrusions 543. When the top plate 51 located at the second position is rotated along with the substrate holder 31, the two second protrusions 543 do not rotate, and the first protrusion 541 rotates between the two second protrusions 543.

With the first processing liquid nozzle 411 located at the supply position, each of the side-surface jet openings 417*b* and 417*c* radially opposes the inner surface of the flange connector 515. Part of the inert gas supplied from the gas supply part 45 to the first processing liquid nozzle 411 is supplied from the side-surface jet openings 417*b* and the side-surface jet openings 417*c* of the outer surface of the first processing liquid nozzle 411 to a gap 518 between the inner surface of the to-be-held part 512 and the outer surface of the first processing liquid nozzle 411. In the gap 518, the inert gas from the gas supply part 45 is supplied obliquely downward and obliquely upward from the outer surface of the first processing liquid nozzle 411. The inert gas supplied obliquely downward from the side-surface jet openings 417*b* flows down through the gap 518 and is supplied to the processing space 90. The inert gas supplied obliquely upward from the side-surface jet openings 417*c* flows up through the gap 518 and reaches the upper opening 517 of the to-be-held part 512.

Each of the side-surface jet openings 417*d* radially opposes the labyrinth 54 at a position above the opposing-member flange part 516. Part of the inert gas supplied from the gas supply part 45 to the first processing liquid nozzle 411 is approximately horizontally supplied from the side-surface jet openings 417*d* of the outer surface of the first processing liquid nozzle 411 toward the labyrinth 54. The inert gas supplied horizontally from the side-surface jet openings 417*d* flows circumferentially outward through the labyrinth 54, along with the inert gas that has been supplied from the side-surface jet openings 417*c* and reached the upper opening 517. The same applies to the case where the second processing liquid nozzle 421 is located at the supply position.

Figure 11:
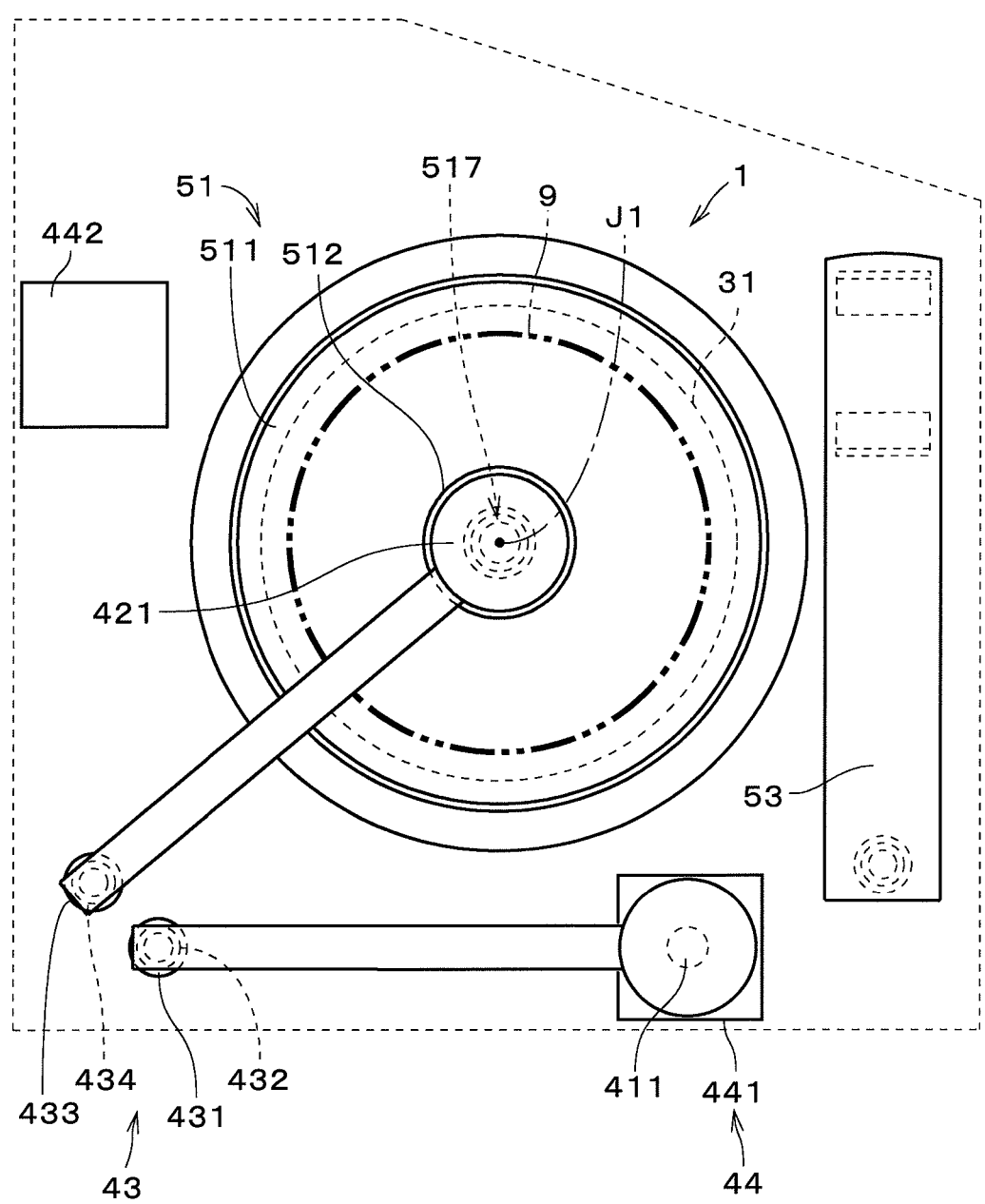
FIG. 11 is a plan view of the substrate processing apparatus.

FIG. 11 is a plan view of the substrate processing apparatus 1. In FIG. 11, the first processing liquid nozzle 411 is moved from the supply position above the top plate 51 illustrated in FIG. 5 by the first nozzle elevating mechanism 431 and the first nozzle rotation mechanism 432 and is located at its retracted position that is located around and spaced from above the top plate 51 (i.e., the retracted position is located around and spaced from an area above the top plate 51) as illustrated in FIG. 11. The second processing liquid nozzle 421 is moved from its retracted position (i.e., second retracted position) around the top plate 51 illustrated in FIG. 5 by the second nozzle elevating mechanism 433 and the second nozzle rotation mechanism 434 and is located at the supply position above the top plate 51 as illustrated in FIG. 11. Our concepts regarding the retracted positions of the first processing liquid nozzle 411 and the second processing liquid nozzle 421 include a space (i.e., evacuation space) with a certain degree of spread that allows the first processing liquid nozzle 411 and the second processing liquid nozzle 421 to oscillate at their retracted positions.

Similarly to the first processing liquid nozzle 411 illustrated in FIG. 10, the second processing liquid nozzle 421 located at the above supply position is inserted into the to-be-held part 512 through the upper opening 517 of the to-be-held part 512 of the top plate 51. The end (i.e., lower end) of the second processing liquid nozzle 421 located at the above supply position is located above the lower edge of the opposing-member opening 514 of the opposing-member body 511, similarly to the first processing liquid nozzle 411 illustrated in FIG. 10. Alternatively, the end of the second processing liquid nozzle 421 may be located at the same position as the lower edge of the opposing-member opening 514 in the up-down direction.

The supply position of the first processing liquid nozzle 411 and the second processing liquid nozzle 421 illustrated in FIGS. 5 and 11 is specifically a position above the opposing-member opening 514 of the top plate 51. The retracted positions of the first processing liquid nozzle 411 and the second processing liquid nozzle 421 are positions around the substrate holder 31. The nozzle moving mechanism 43 individually moves the first processing liquid nozzle 411 and the second processing liquid nozzle 421 between the supply position and their respective retracted positions.

As illustrated in FIG. 11, the nozzle cleaning part 44 includes a first cleaning part 441 and a second cleaning part 442. The first cleaning part 441 is provided in the vicinity of the retracted position of the first processing liquid nozzle 411. The first cleaning part 441 cleans the first processing liquid nozzle 411 located at its retracted position. The first cleaning part 441 cleans the first processing liquid nozzle 411 by, for example, supplying a cleaning liquid such as deionized water toward the first processing liquid nozzle 411. The second cleaning part 442 is provided in the vicinity of the retracted position of the second processing liquid nozzle 421. The second cleaning part 442 cleans the second processing liquid nozzle 421 located at its retracted position illustrated in FIG. 1. The second cleaning part 442 cleans the second processing liquid nozzle 421 by, for example, supplying a cleaning liquid such as deionized water toward the second processing liquid nozzle 421. The first cleaning part 441 and the second cleaning part 442 may also dry the cleaned first processing liquid nozzle 411 and the cleaned second processing liquid nozzle 421. When cleaning or drying the first processing liquid nozzle 411 and the second processing liquid nozzle 421, the first processing liquid nozzle 411 and the second processing liquid nozzle 421 may oscillate at their retracted positions (i.e., in the evacuation space).

Figure 12A:
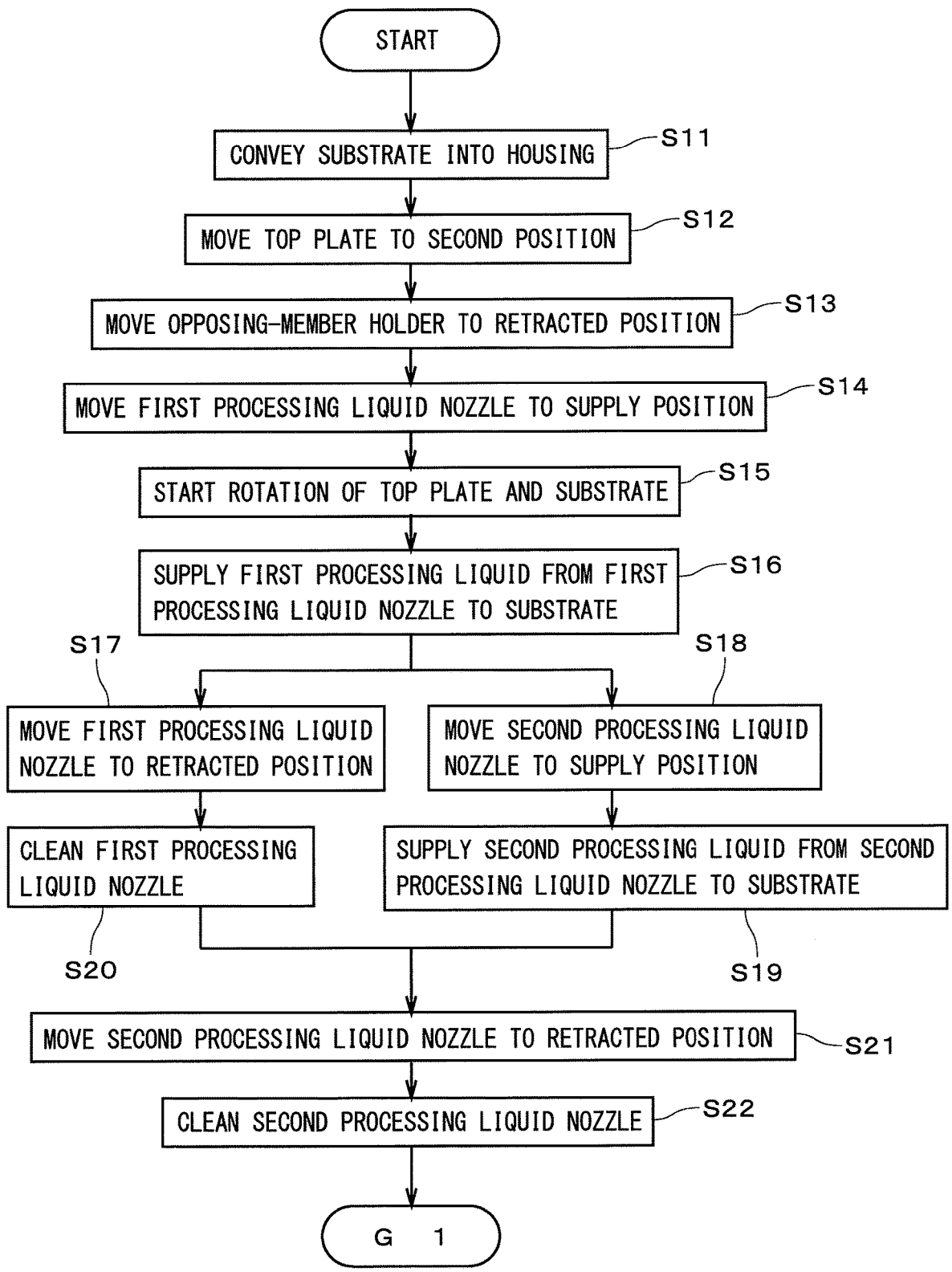
FIG. 12A is a flowchart of processing performed on a substrate.
Figure 12B:
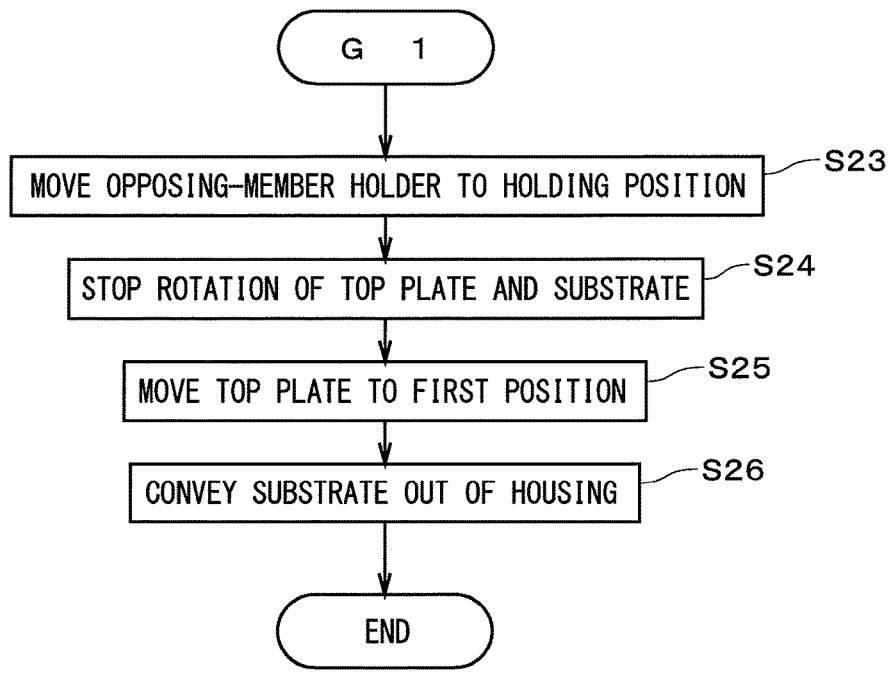
FIG. 12B is a flowchart of processing performed on the substrate.

Next, an exemplary procedure of processing performed on the substrate 9 by the substrate processing apparatus 1 will be described with reference to FIGS. 12A and 12B. First, with the top plate 51 located at the first position illustrated in FIG. 2, the substrate 9 is conveyed into the housing 11 and held by the substrate holder 31 (step S11). At this time, the top plate 51 is held by the opposing-member holder 53, and the first processing liquid nozzle 411 and the second processing liquid nozzle 421 are located at their retracted positions.

Next, the controller 21 (see FIG. 1) controls the opposing-member elevating mechanism 55 to move the opposing-member holder 53 down. The top plate 51 is moved down from the first position to the second position and held by the substrate holder 31 as illustrated in FIG. 4 (step S12). The inert gas supplied from the gas supply part 45 to the holder inner space 536 of the opposing-member holder 53 flows down through the upper opening 517 of the to-be-held part 512 and is supplied through the opposing-member opening 514 to the processing space 90.

In step S12, the first flange supporter 532 and the second flange supporter 534 of the opposing-member holder 53 are spaced below from the opposing-member flange part 516 of the top plate 51. In this state, the controller 21 controls the opposing-member-holder moving mechanism 57 to horizontally rotate the opposing-member holder 53. The opposing-member holder 53 is retracted from the holding position above the top plate 51 and moved to the aforementioned retracted position (step S13).

Then, with the opposing-member holder 53 located the retracted position, the controller 21 controls the first nozzle elevating mechanism 431 and the first nozzle rotation mechanism 432 to move the first processing liquid nozzle 411 from its retracted position to the supply position (step S14). The first processing liquid nozzle 411 is inserted through the upper opening 517 of the top plate 51 and disposed inside the to-be-held part 512 as illustrated in FIGS. 8 and 10.

When the first processing liquid nozzle 411 is located at the supply position, the controller 21 controls the gas supply part 45 to supply an inert gas from the lower-surface jet opening 417a of the first processing liquid nozzle 411 to the processing space 90. The inert gas is also supplied from the side-surface jet openings 417b and 417c of the first processing liquid nozzle 411 to the gap 518 between the inner surface of the to-be-held part 512 of the top plate 51 and the outer surface of the first processing liquid nozzle 411. The inert gas is also supplied from the side-surface jet openings 417d of the first processing liquid nozzle 411 toward the labyrinth 54 between the upper surface of the opposing-member flange part 516 and the lower surface of the nozzle flange part 414.

The controller 21 also controls the substrate rotation mechanism 33 to start rotation of the substrate holder 31, the substrate 9, and the top plate 51 (step S15). The inert gas continues to be supplied from the first processing liquid nozzle 411 in step S15 onward. Note that the rotation of the top plate 51 and other constituent elements may be started (step S15) before the first processing liquid nozzle 411 is moved to the supply position (step S14). For example, step S15 may be performed between steps S12 and S13. In this case, in step S13, the opposing-member holder 53 is moved away from the rotating top plate 51 to the retracted position.

Then, with the first processing liquid nozzle 411 located at the supply position, the first processing liquid supply part 413 supplies the first processing liquid from the first processing liquid nozzle 411 through the opposing-member opening 514 of the top plate 51 located at the second position to the central part of the upper surface 91 of the rotating substrate 9 (step S16). The first processing liquid supplied from the first processing liquid nozzle 411 located at the supply position to the central part of the substrate 9 is spread radially outward from the central part of the substrate 9 over the entire upper surface 91 of the substrate 9 by the rotation of the substrate 9. The first processing liquid is dispersed radially outward from the outer edge of the substrate 9 and received by the cup part 37. The first processing liquid is supplied for a predetermined period of time, and the processing of the substrate 9 using the first processing liquid ends.

The first processing liquid is, for example, a chemical solution such as a polymer removing solution or an etchant. In step S16, chemical processing is performed on the substrate 9. Note that the first processing liquid may be supplied (step S16) before the rotation of the substrate 9 is started (step S15). In this case, a puddle of the first processing liquid is formed on the entire upper surface 91 of the substrate 9, and puddling using the first processing liquid is performed. The same applies to steps S54 and S55, which will be described later.

When the processing of the substrate 9 using the first processing liquid has ended, the supply of the first processing liquid from the first processing liquid nozzle 411 is stopped. The first processing liquid nozzle 411 is then moved from the supply position to the retracted position by the first nozzle elevating mechanism 431 and the first nozzle rotation mechanism 432 (step S17).

In the substrate processing apparatus 1, the controller 21 controls the second nozzle elevating mechanism 433 and the second nozzle rotation mechanism 434 to move the second processing liquid nozzle 421 from the retracted position to the supply position (step S18). With the opposing-member holder 53 located at the retracted position, the second processing liquid nozzle 421 is inserted through the upper opening 517 of the to-be-held part 512 of the top plate 51 and disposed inside the to-be-held part 512 as illustrated in FIG. 11. Preferably, the second processing liquid nozzle 421 may be moved (step S18) in parallel with the movement of the first processing liquid nozzle 411 (step S17). Note that step S18 may be performed after completion of step S17.

When the second processing liquid nozzle 421 is located at the supply position, the inert gas from the gas supply part 45 is supplied from the lower-surface jet opening of the second processing liquid nozzle 421 to the processing space 90. The inert gas is also supplied from the side-surface jet openings of the outer surface of the second processing liquid nozzle 421 to the gap 518 and the labyrinth 54.

Then, the controller 21 controls the second processing liquid supply part 423 to supply the second processing liquid from the second processing liquid nozzle 421 through the opposing-member opening 514 of the top plate 51 located at the second position to the central part of the upper surface 91 of the substrate 9, with the second processing liquid nozzle 421 located at the supply position (step S19). The second processing liquid supplied from the second processing liquid nozzle 421 located at the supply position to the central part of the substrate 9 is spread radially outward from the central part of the substrate 9 over the entire upper surface 91 of the substrate 9 by the rotation of the substrate 9. The second processing liquid is dispersed radially outward from the outer edge of the substrate 9 and received by the cup part 37. The second processing liquid is supplied for a predetermined period of time, and the processing of the substrate 9 using the second processing liquid ends. The second processing liquid is, for example, a cleaning liquid such as deionized water or carbonated water. In step S19, cleaning processing is performed on the substrate 9.

In the substrate processing apparatus 1, the cleaning of the first cleaning part 441 cleans the first processing liquid nozzle 411 located at the retracted position (step S20) is performed in parallel with the movement of the second processing liquid nozzle 421 (step S18) or the supply of the second processing liquid (step S19).

When the processing of the substrate 9 using the second processing liquid has ended, the supply of the second processing liquid from the second processing liquid nozzle 421 is stopped. The substrate 9 continues to be rotated, and processing for drying the substrate 9 is performed. The rotation speed of the substrate 9 during the dry processing is faster than the rotation speed thereof during the processing of the substrate 9 using the second processing liquid in step S19. Also, the second processing liquid nozzle 421 is moved from the supply position to the retracted position by the second nozzle elevating mechanism 433 and the second nozzle rotation mechanism 434 (step S21). Then, the second cleaning part 442 cleans the second processing liquid nozzle 421 located at the retracted position (step S22).

The opposing-member holder 53 is horizontally rotated and moved from the retracted position to the holding position by the opposing-member-holder moving mechanism 57 (step S23). At this time, the first flange supporter 532 and the second flange supporter 534 of the opposing-member holder 53 are spaced below from the opposing-member flange part 516 of the top plate 51 that is being rotated at the second position.

Then, the rotation of the substrate holder 31, the substrate 9, and the top plate 51 by the substrate rotation mechanism 33 is stopped (step S24). The opposing-member holder 53 is then moved upward by the opposing-member elevating mechanism 55 to move the top plate 51 up from the second position to the first position (step S25). The top plate 51 is spaced above from the substrate holder 31 and held by the opposing-member holder 53. Thereafter, the substrate 9 is conveyed out of the housing 11 (step S26).

Steps S23 to S26 may be performed after completion of step S22. Alternatively, step S22 may be performed in parallel with one or more of steps S23 to S26. Step S20 may also be performed in parallel with step S22, for example. It is sufficient for step S23 to be performed after step S21 and before step S25. For example, step S23 may be performed after step S24, i.e., after the rotation of the top plate 51 and other constituent elements is stopped.

As described above, the processing of the substrate 9 using the first processing liquid and the second processing liquid is performed when the top plate 51 is located at the second position, and the substrate 9 is conveyed into and out of the housing when the top plate 51 is located at the first position. Thus, the first and second positions described above may also be respectively regarded as a "non-processing position" and a "processing position."

The substrate processing apparatus 1 sequentially performs the above-described steps S11 to S26 on a plurality of substrates 9 to process the substrates 9. Note that step S22 may be performed after completion of step S26, i.e., before the next substrate 9 is conveyed into the housing, or may be performed in parallel with steps S11 to S17 that are performed on the next substrate 9. Alternatively, step S22 may be performed between steps S17 and S18 that are performed on the next substrate 9.

As described above, in the substrate processing apparatus 1, the top plate 51 that is located at the first position is held by the opposing-member holder 53 and spaced above from the substrate holder 31. The top plate 51 that is located at the second position is held by the substrate holder 31 and rotated along with the substrate holder 31 by the substrate rotation mechanism 33. The gas supply part 45 supplies a gas to the processing space 90 between the top plate 51 and the substrate 9. This configuration allows a desired gaseous atmosphere to be created in the processing space 90 and allows the substrate 9 to be processed in that gaseous atmosphere. For example, when an inert gas is supplied to the processing space 90, the substrate 9 is processed in an inert gas atmosphere (i.e., low oxygen atmosphere).

In the substrate processing apparatus 1, the gas supply part 45 also supplies a gas to the gap 518 between the inner surface of the to-be-held part 512 of the top plate 51 and the outer surface of the processing liquid nozzle that is located inside the to-be-held part 512 (i.e., the first processing liquid nozzle 411 or the second processing liquid nozzle 421 that is located at the supply position). Thus, the gap 518 between the top plate 51 rotating along with the substrate 9 and the processing liquid nozzle in a stationary state is sealed with the above gas. This configuration reduces the entry of outside air (i.e., atmosphere around the processing space 90) into the processing space 90 through the gap 518 between the top plate 51 and the processing liquid nozzle. Consequently, the processing space 90 remains in the desired gaseous atmosphere, and the processing of the substrate 9 is easily implemented in that gaseous atmosphere. The aforementioned "outside air" refers to the atmosphere around the processing space 90 in the housing 11, i.e., the atmosphere around the top plate 51 and the substrate holder 31. The same applies to the following description.

As described above, in the substrate processing apparatus 1, the gas from the gas supply part 45 is supplied from the first processing liquid nozzle 411 during the time that the first processing liquid is supplied from the first processing liquid nozzle 411 to the substrate 9 (step S16), and the gas from the gas supply part 45 is supplied from the second processing liquid nozzle 421 during the time that the second processing liquid is supplied from the second processing liquid nozzle 421 to the substrate 9 (step S19). This simplifies the configuration of supplying a gas from the gas supply part 45 to the processing space 90 in parallel with the processing of the substrate 9 using the first processing liquid or the second processing liquid.

The substrate processing apparatus 1 includes the opposing-member-holder moving mechanism 57 for retracting the opposing-member holder 53 from above the top plate 51, with the top plate 51 located at the second position. In the substrate processing apparatus 1, the retraction of the opposing-member holder 53 from the position above the top plate 51 during the rotation of the top plate 51 reduces disturbances in air flow caused by the opposing-member holder 53 located above the top plate 51. The configuration also improves the degrees of freedom in the shape of the upper surface of the top plate 51 and in arranging additional constituent elements on that upper surface.

Moreover, in the substrate processing apparatus 1, with the opposing-member holder 53 retracted, the processing liquid nozzle (i.e., the first processing liquid nozzle 411 or the second processing liquid nozzle 421) is inserted into the to-be-held part 512 through the upper opening 517, and the gas from the gas supply part 45 is directly supplied from the outer surface of the processing liquid nozzle to the gap 518. This configuration facilitates the supply of a gas to the gap 518. Note that the supply of a gas from the gas supply part 45 through the opposing-member holder 53 may be omitted. In this case, the opposing-member holder 53 may, for example, be an approximately solid member. This simplifies the configuration of the opposing-member holder 53.

The gas from the gas supply part 45 is supplied obliquely upward and obliquely downward from the outer surface of the processing liquid nozzle located at the supply position (i.e., the first processing liquid nozzle 411 or the second processing liquid nozzle 421 that is inserted in the to-be-held part 512). This configuration further reduces the entry of outside air into the gap 518 through the upper opening 517 of the to-be-held part 512.

In the substrate processing apparatus 1, the labyrinth 54 is formed between the upper surface of the opposing-member flange part 516 and the lower surface of the nozzle flange part 414. The presence of the labyrinth 54 reduces the possibility that outside air in the vicinity of the to-be-held part 512, i.e., outside air below the opposing-member flange part 516 and on the radial outer side of the flange connector 515, will enter from the space between the opposing-member flange part 516 and the nozzle flange part 414 into the gap 518 and the processing space 90 through the upper opening 517 of the to-be-held part 512. Also, the gas from the gas supply part 45 is supplied from the outer surface of the processing liquid nozzle toward the labyrinth 54. This configuration further reduces the entry of outside air into the gap 518 from the space between the opposing-member flange part 516 and the nozzle flange part 414.

In the substrate processing apparatus 1, under the control of the controller 21, the first processing liquid is supplied through the opposing-member opening 514 to the substrate 9 with the first processing liquid nozzle 411 located at the supply position, and the first processing liquid nozzle 411 is moved from the supply position to its retracted position. Then, the second processing liquid nozzle 421 is moved from its retracted position to the supply position and supplies the second processing liquid through the opposing-member opening 514 to the substrate 9. This configuration suppresses or prevents mixture of a plurality of types of processing liquids, as compared with the case where a plurality of types of processing liquids are successively supplied from a single processing liquid nozzle. In addition, since the first processing liquid nozzle 411 and the second processing liquid nozzle 421 are retractable from the supply position, processing liquids that may adhere to, for example, the inner surface of the to-be-held part 512 of the top plate 51 are easily removable.

The first processing liquid nozzle 411 and the second processing liquid nozzle 421, when located at the supply position, are inserted into the to-be-held part 512 through the upper opening 517 of the to-be-held part 512 that protrudes upward from the periphery of the opposing-member opening 514. This configuration reduces the entry of outside air from the opposing-member opening 514 into the processing space 90. Consequently, the processing space 90 remains in the desired gaseous atmosphere, and the processing of the substrate 9 is easily implemented in that gaseous atmosphere.

The ends of the first processing liquid nozzle 411 and the second processing liquid nozzle 421, when located at the supply position, are located above or at the same position as the lower edge of the opposing-member opening 514 in the up-down direction. This configuration reduces the possibility that the first processing liquid supplied from the first processing liquid nozzle 411 will adhere to the end of the first processing liquid nozzle 411 as a result of, for example, the first processing liquid bouncing off the substrate 9. Similarly, the configuration also reduces the possibility that the second processing liquid supplied from the second processing liquid nozzle 421 will adhere to the end of the second processing liquid nozzle 421 as a result of, for example, the second processing liquid bouncing off the substrate 9.

In the substrate processing apparatus 1, the opposing-member holder 53 includes the first flange supporter 532, the second flange supporter 534 located on the opposite side to the first flange supporter 532 with the flange connector 515 located therebetween, and the holder body 531 on which the first flange supporter 532 and the second flange supporter 534 are mounted. The first flange supporter 532 and the second flange supporter 534 are in contact with and support part of the opposing-member flange part 516 of the top plate 51 from the underside when the top plate 51 is located at the first position. With the top plate 51 located at the second position, the first flange supporter 532 and the second flange supporter 534 are horizontally moved to space the first flange supporter 532 and the second flange supporter 534 radially outward from the opposing-member flange part 516 or to dispose the first flange supporter 532 and the second flange supporter 534 below the opposing-member flange part 516.

Thus, in the substrate processing apparatus 1, irrespective of whether the top plate 51 located at the second position is in a stationary state or being rotated, the first flange supporter 532 and the second flange supporter 534 are easily movable away from the opposing-member flange part 516 to move the opposing-member holder 53 to the retracted position with a simple configuration. Also, irrespective of whether the top plate 51 is in a stationary state or being rotated, the first flange supporter 532 and the second flange supporter 534 are insertable into the positions below the opposing-member flange part 516 to move the opposing-member holder 53 to the holding position with a simple configuration. That is, the substrate processing apparatus 1 allows the top plate 51 to be held with a simple configuration and allows the opposing-member holder 53 to be movable between the holding position and the retracted position with a simple configuration, irrespective of the state of the top plate 51.

As described above, in the substrate processing apparatus 1, the opposing-member holder 53 is moved from the retracted position to the holding position (step S23) before the rotation of the top plate 51 and other constituent elements is stopped (step S24). Moving the opposing-member holder 53 to the holding position during the rotation of the top plate 51 and other constituent elements in this way shortens the time required for the processing of the substrate 9 (i.e., the amount of time from when the substrate 9 is conveyed into the housing to when the substrate 9 is conveyed out of the housing), as compared with the case where step S23 is performed after step S24. Also, when the opposing-member holder 53 is moved from the holding position to the retracted position (step S13) after the rotation of the top plate 51 and other constituent elements is started (step S15), i.e., when the opposing-member holder 53 is moved to the retracted position during the rotation of the top plate 51 and other constituent elements, the time required for the processing of the substrate 9 is shortened as compared with the case where step S13 is performed before step S15.

In the substrate processing apparatus 1, the first flange supporter 532 and the second flange supporter 534 are fixed to the holder body 531. The opposing-member-holder moving mechanism 57 horizontally rotates the holder body 531 to move the opposing-member holder 53 between the holding position and the retracted position. The rotation of the holder body 531 causes the first flange supporter 532 and the second flange supporter 534 to be spaced radially outward from the opposing-member flange part 516 or to be disposed below the opposing-member flange part 516. This configuration simplifies the configuration of the opposing-member holder 53 and allows the opposing-member holder 53 to move between the holding position and the retracted position, irrespective of whether the top plate 51 is being rotated or not.

In the substrate processing apparatus 1, the nozzle cleaning part 44 cleans the first processing liquid nozzle 411 located at the retracted position. Thus, even if the first processing liquid or other substances adhere to the first processing liquid nozzle 411, such deposits are removed and the first processing liquid nozzle 411 is kept clean. This configuration consequently suppresses or prevents unintended dripping of the first processing liquid from the first processing liquid nozzle 411 when the first processing liquid nozzle 411 is moved from the retracted position to the supply position. The configuration also suppresses or prevents unintended dripping of the first processing liquid onto the substrate 9 when the first processing liquid nozzle 411 is located at the supply position.

In the substrate processing apparatus 1, the nozzle cleaning part 44 also cleans the second processing liquid nozzle 421 located at the retracted position. Thus, the second processing liquid nozzle 421 is kept clean. This configuration consequently suppresses or prevents unintended dripping of the second processing liquid from the second processing liquid nozzle 421 when the second processing liquid nozzle 421 is moved or when the second processing liquid nozzle 421 is located at the supply position.

Figure 13:
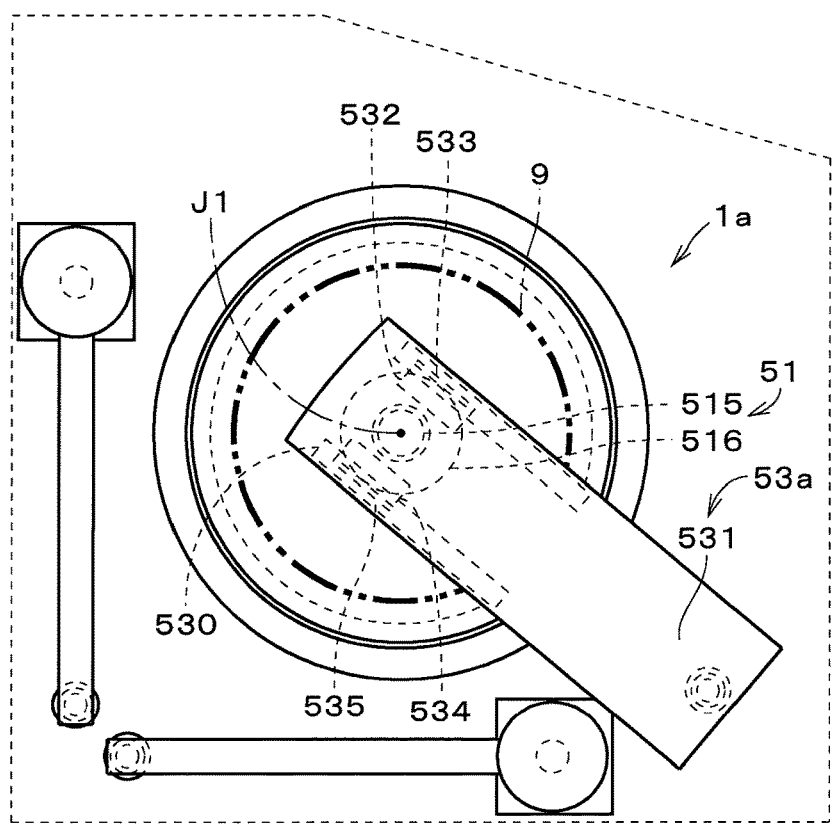
FIG. 13 is a plan view of a substrate processing apparatus according to a second embodiment.

FIG. 13 is a plan view of a substrate processing apparatus 1a according to a second embodiment of the present invention. The substrate processing apparatus 1a includes, instead of the opposing-member holder 53, an opposing-member holder 53a that differs in the orientations of the first flange supporter 532 and the second flange supporter 534 from the opposing-member holder 53 illustrated in FIGS. 1 and 2. The opposing-member holder 53a also includes a supporter moving mechanism 530. The other configuration of the substrate processing apparatus 1a is similar to the configuration of the substrate processing apparatus 1 illustrated in FIG. 1, and constituent elements that correspond to those of the substrate processing apparatus 1 are given the same reference numerals in the following description.

As illustrated in FIG. 13, the first flange supporter 532, the first connector 533, the second flange supporter 534, and the second connector 535 of the opposing-member holder 53a are mounted on the end portion of the holder body 531 via the supporter moving mechanism 530. A pair of the first flange supporter 532 and the first connector 533 and a pair of the second flange supporter 534 and the second connector 535 are located at approximately the same position in the longitudinal direction of the holder body 531. The second flange supporter 534 is located on the opposite side to the first flange supporter 532 with the flange connector 515 of the top plate 5 located therebetween.

The first connector 533 and the second connector 535 are generally flat plate-like parts that extend downward from the supporter moving mechanism 530. The first connector 533 and the second connector 535 extend in a direction that is generally parallel to the longitudinal direction of the holder body 531. The first flange supporter 532 is a generally flat plate-like part that extends generally horizontally from the lower end of the first connector 533. The first flange supporter 532 extends from the first connector 533 in a direction toward the second flange supporter 534. The second flange supporter 534 is a generally flat plate-like part that extends generally horizontally from the lower end of the second connector 535. The second flange supporter 534 extends from the second connector 535 in a direction toward the first flange supporter 532.

The distance in a direction (hereinafter, referred to a "width direction") perpendicular to the longitudinal direction of the holder body 531 between the first flange supporter 532 and the second flange supporter 534 is smaller than the outer diameter of the opposing-member flange part 516 of the top plate 51 and greater than the outer diameter of the flange connector 515. The distance in the width direction of the holder body 531 between the first connector 533 and the second connector 535 is greater than the outer diameter of the opposing-member flange part 516.

The supporter moving mechanism 530 generally horizontally moves the pair of the first connector 533 and the first flange supporter 532 and the pair of the second connector 535 and the second flange supporter 534 in a direction that is generally parallel to the longitudinal direction of the holder body 531. That is, in the opposing-member holder 53a, the supporter moving mechanism 530 is capable of moving the first flange supporter 532 and the second flange supporter 534 relative to the holder body 531.

Figure 14:
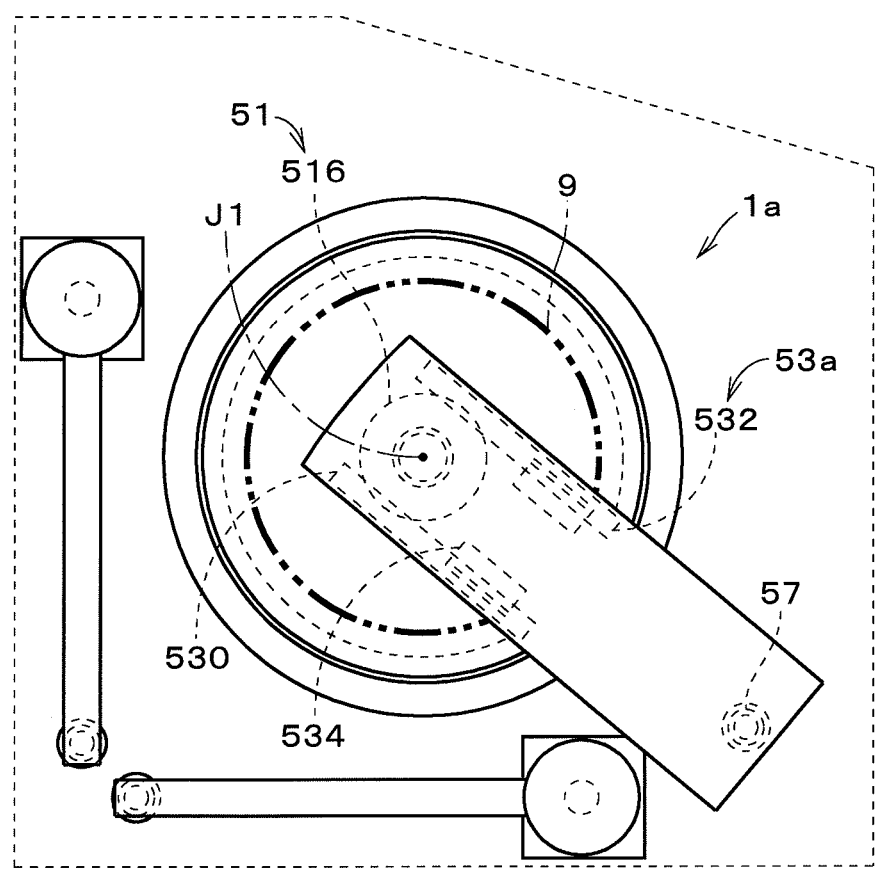
FIG. 14 is a plan view of the substrate processing apparatus.

In the substrate processing apparatus 1a, with the holder body 531 located at the holding position, the first flange supporter 532 and the second flange supporter 534 are in contact with part of the opposing-member flange part 516 of the top plate 51 from the underside and supports the top plate 51 when the top plate 51 is located at the first position. Also, with the holder body 531 located at the holding position and the top plate 51 located at the second position, the supporter moving mechanism 530 moves the first flange supporter 532 and the second flange supporter 534 toward the base of the holder body 531 to space the first flange supporter 532 and the second flange supporter 534 radially outward from the opposing-member flange part 516 as illustrated in FIG. 14. In this state, the opposing-member holder 53a is movable between the holding position and the retracted position by the opposing-member-holder moving mechanism 57 horizontally rotating the opposing-member holder 53a.

Also, in the substrate processing apparatus 1a, with the holder body 531 located at the holding position and the top plate 51 located at the second position, the supporter moving mechanism 530 moves the first flange supporter 532 and the second flange supporter 534 toward the tip end of the holder body 531 to dispose the first flange supporter 532 and the second flange supporter 534 below the opposing-member flange part 516 as illustrated in FIG. 13.

In the substrate processing apparatus 1a, irrespective of whether the top plate 51 located at the second position is in a stationary state or being rotated, the first flange supporter 532 and the second flange supporter 534 are movable away from the opposing-member flange part 516 to move the opposing-member holder 53a to the retracted position, as in the substrate processing apparatus 1 illustrated in FIG. 1. Also, irrespective of whether the top plate 51 is in a stationary state or being rotated, the opposing-member holder 53a is movable from the retracted position to the holding position to dispose the first flange supporter 532 and the second flange supporter 534 below the opposing-member flange part 516. That is, the substrate processing apparatus 1a allows the top plate 51 to be held with a simple configuration and allows the opposing-member holder 53a to be movable between the holding position and the retracted position with a simple configuration, irrespective of the state of the top plate 51. In this way, in the substrate processing apparatus 1a, the opposing-member holder 53a is movable between the holding position and the retracted position during the rotation of the top plate 51 and other constituent elements, as in the substrate processing apparatus 1 illustrated in FIG. 1. This configuration shortens the time required for the processing of the substrate 9.

In the substrate processing apparatus 1a, the direction of movement of the first flange supporter 532 and the second flange supporter 534 by the supporter moving mechanism 530 does not necessarily have to be a direction that is generally parallel to the longitudinal direction of the holder body 531. For example, the first flange supporter 532 and the second flange supporter 534 may be horizontally moved in a direction that is generally perpendicular to the longitudinal direction of the holder body 531 by the supporter moving mechanism 530. In this case, the first flange supporter 532 and the second flange supporter 534 may be moved in directions away from each other and spaced radially outward from the opposing-member flange part 516. Alternatively, the first flange supporter 532 and the second flange supporter 534 may be moved in directions toward each other and disposed below the opposing-member flange part 516.

Figure 15:
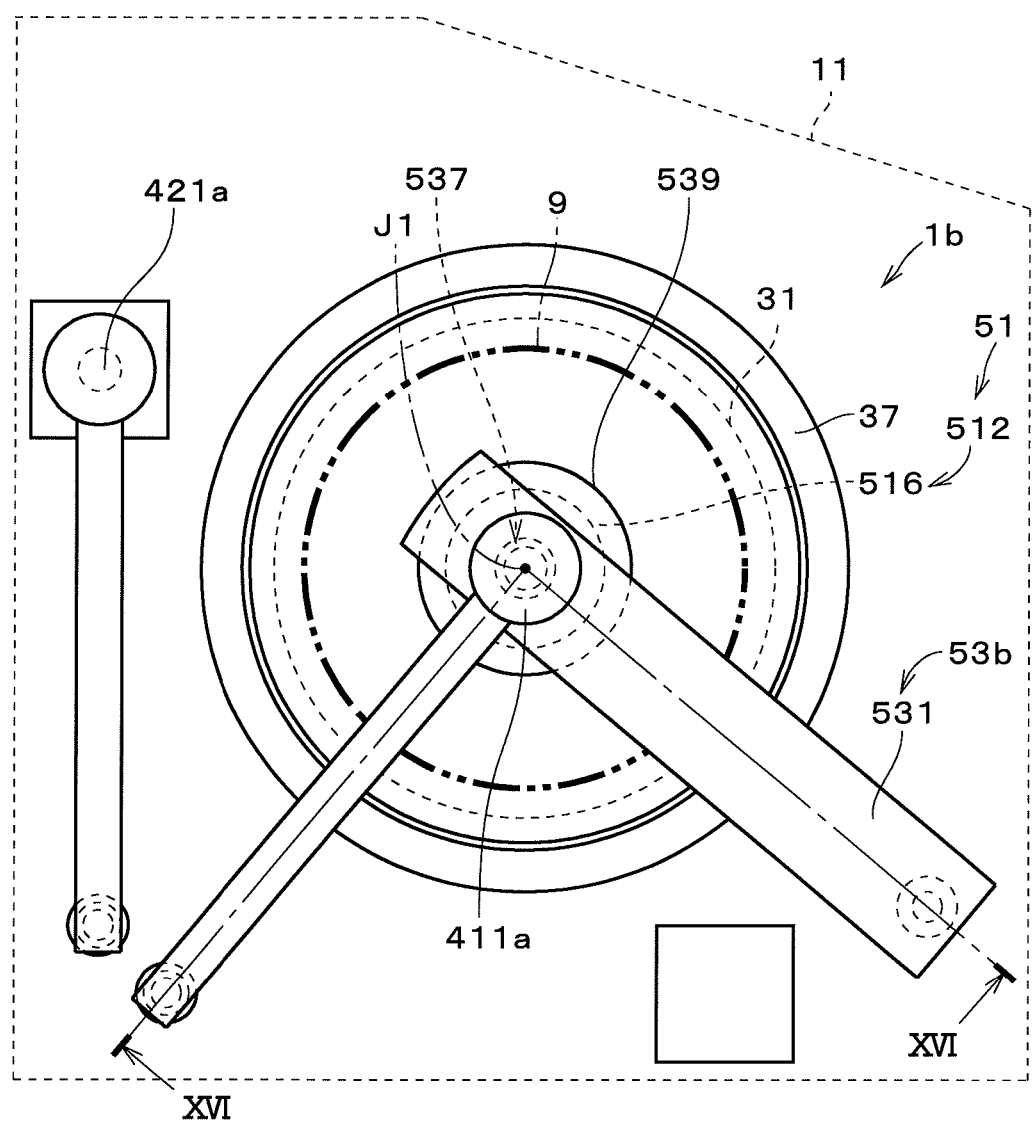
FIG. 15 is a plan view of a substrate processing apparatus according to a third embodiment.
Figure 16:
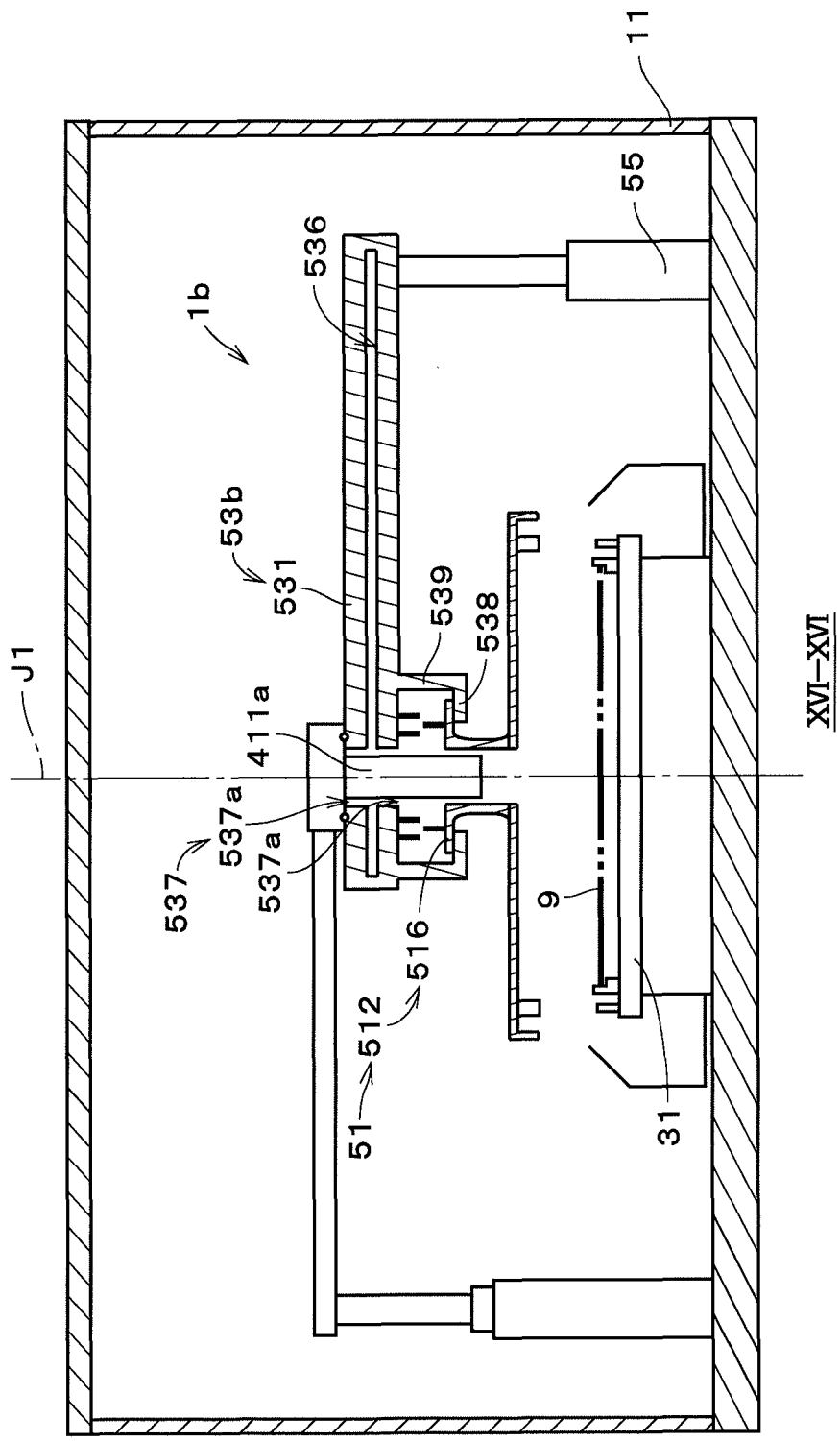
FIG. 16 is a cross-sectional view of the substrate processing apparatus.

FIG. 15 is a plan view of a substrate processing apparatus 1b according to a third embodiment of the present invention. FIG. 16 is a cross-sectional view of the substrate processing apparatus 1b taken along XVI-XVI in FIG. 15. An opposing-member holder 53b of the substrate processing apparatus 1b includes a flange supporter 538 and a connector 539, instead of the first flange supporter 532, the first connector 533, the second flange supporter 534, and the second connector 535 of the substrate processing apparatus 1. The substrate processing apparatus 1b also includes a first processing liquid nozzle 411a and a second processing liquid nozzle 421a that have different configurations from the configurations of the first processing liquid nozzle 411 and the second processing liquid nozzle 421. In the substrate processing apparatus 1b, the opposing-member-holder moving mechanism 57 illustrated in FIG. 1 is omitted, and the first processing liquid nozzle 411a and the second processing liquid nozzle 421a are inserted into the to-be-held part 512 of the top plate 51 through the opposing-member holder 53b. The other configuration of the substrate processing apparatus 1b is similar to the configuration of the substrate processing apparatus 1 illustrated in FIGS. 1 and 2, and constituent elements that correspond to those in FIGS. 1 and 2 in the following description are given the same reference numerals.

The flange supporter 538 and the connector 539 are mounted on the tip end portion of the holder body 531. The connector 539 is a generally cylindrical part centered on the central axis J1. The connector 539 is fixed to the holder body 531 and extends downward from the lower surface of the holder body 531. The flange supporter 538 is a generally annular plate-like part centered on the central axis J1. The flange supporter 538 extends radially inward from the lower end of the connector 539. The inner diameter of the flange supporter 538 is smaller than the outer diameter of the opposing-member flange part 516.

With the top plate 51 located at the first position as illustrated in FIG. 16, the flange supporter 538 is in contact with and supports part of the opposing-member flange part 516 of the top plate 51 from the underside. Thus, the top plate 51 is suspended from the opposing-member holder 53b above the substrate 9 and the substrate holder 31. In other words, the top plate 51 located at the first position is held by the opposing-member holder 53b and spaced above from the substrate holder 31.

The flange supporter 538 and the opposing-member flange part 516 include mobility limiting parts (not shown) that are engaged with each other to limit a positional shift of the top plate 51 (i.e., movement and rotation of the top plate 51). The mobility limiting parts include, for example, protrusions that protrude upward from the upper surface of the flange supporter 538, and through holes that are formed in the opposing-member flange part 516 and in which the protrusions are inserted.

The tip end portion of the holder body 531 has a through hole 537 that vertically penetrates the holder body 531. The through hole 537 communicates with the holder inner space 536. In the example in FIG. 16, the through hole 537 includes two generally circular openings 537a provided in the upper and lower surfaces of the holder body 531. The positions of these two openings 537a coincide with each other in a plan view. The through hole 537 is located above the to-be-held part 512 of the top plate 51. The through hole 537 is also located radially inward of the connector 539 and radially inward of the inner edge of the flange supporter 538. In the example in FIG. 16, the first processing liquid nozzle 411a is inserted in the to-be-held part 512 of the top plate 51 through the through hole 537.

Figure 17:
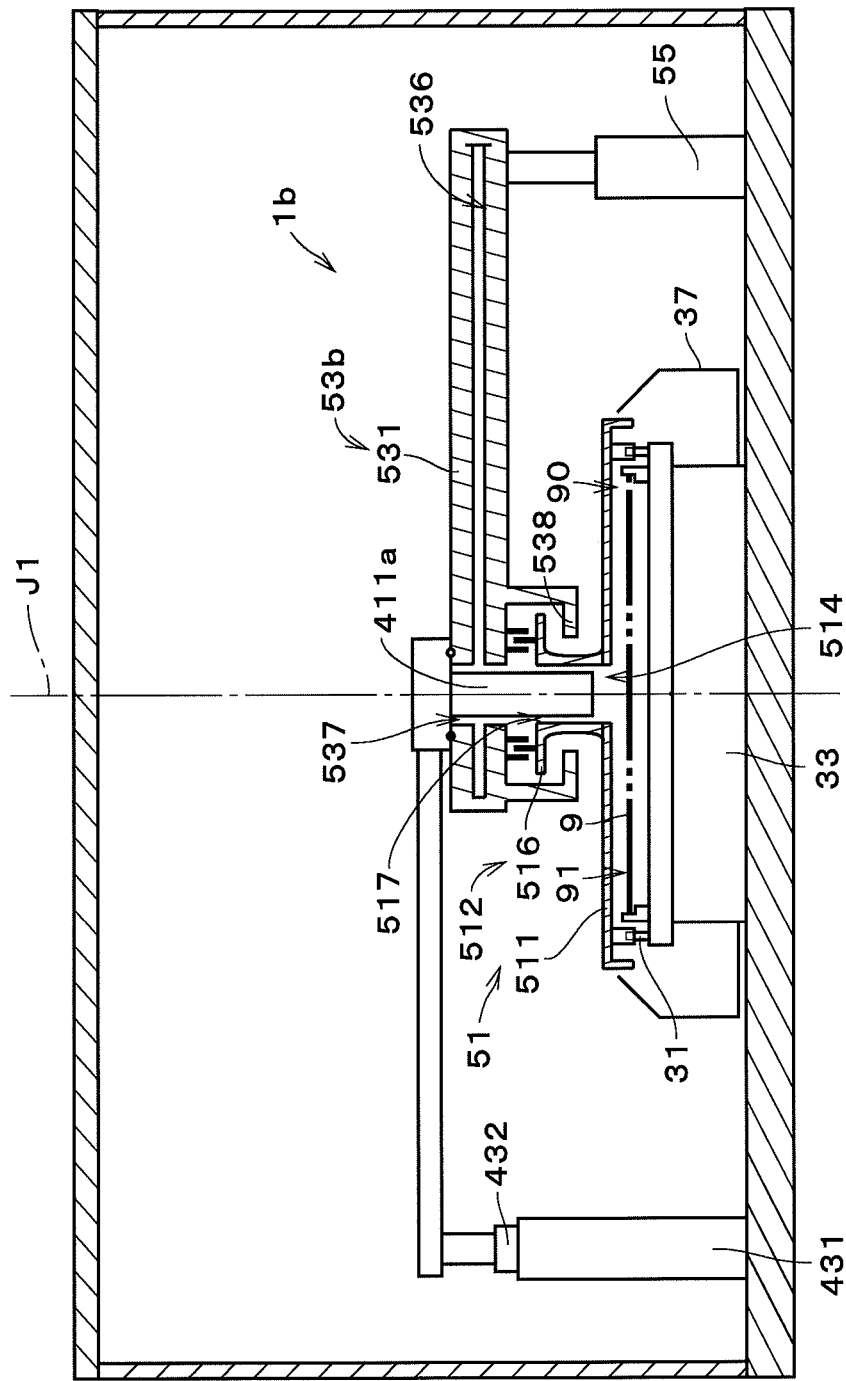
FIG. 17 is a cross-sectional view of the substrate processing apparatus.

FIG. 17 is a cross-sectional view of the substrate processing apparatus 1b with the top plate 51 located at the second position. When the top plate 51 is moved down and located at the second position by the opposing-member elevating mechanism 55, the opposing-member flange part 516 of the top plate 51 is spaced above from the flange supporter 538 of the opposing-member holder 53b. Thus, the top plate 51 located at the second position is held by the substrate holder 31 and spaced from the opposing-member holder 53b (i.e., is not in contact with the opposing-member holder 53b). When the substrate rotation mechanism 33 is driven with the top plate 51 located at the second position, the top plate 51 is rotated along with the substrate holder 31.

As illustrated in FIG. 17, the first processing liquid nozzle 411a is located above the top plate 51. The first processing liquid nozzle 411a protrudes downward from the holder body 531 of the opposing-member holder 53b through the through hole 537 of the opposing-member holder 53b and is inserted in the to-be-held part 512 through the upper opening 517 of the to-be-held part 512 of the top plate 51. The first processing liquid nozzle 411a is located at the supply position inside the to-be-held part 512. In other words, the outer surface of the first processing liquid nozzle 411a radially opposes the inner surface of the to-be-held part 512. In the example in FIG. 17, the end (i.e., lower end) of the first processing liquid nozzle 411a is located above the lower edge of the opposing-member opening 514 of the opposing-member body 511. Alternatively, the end of the first processing liquid nozzle 411a may be located at the same position as the lower edge of the opposing-member opening 514 in the up-down direction.

Figure 18:
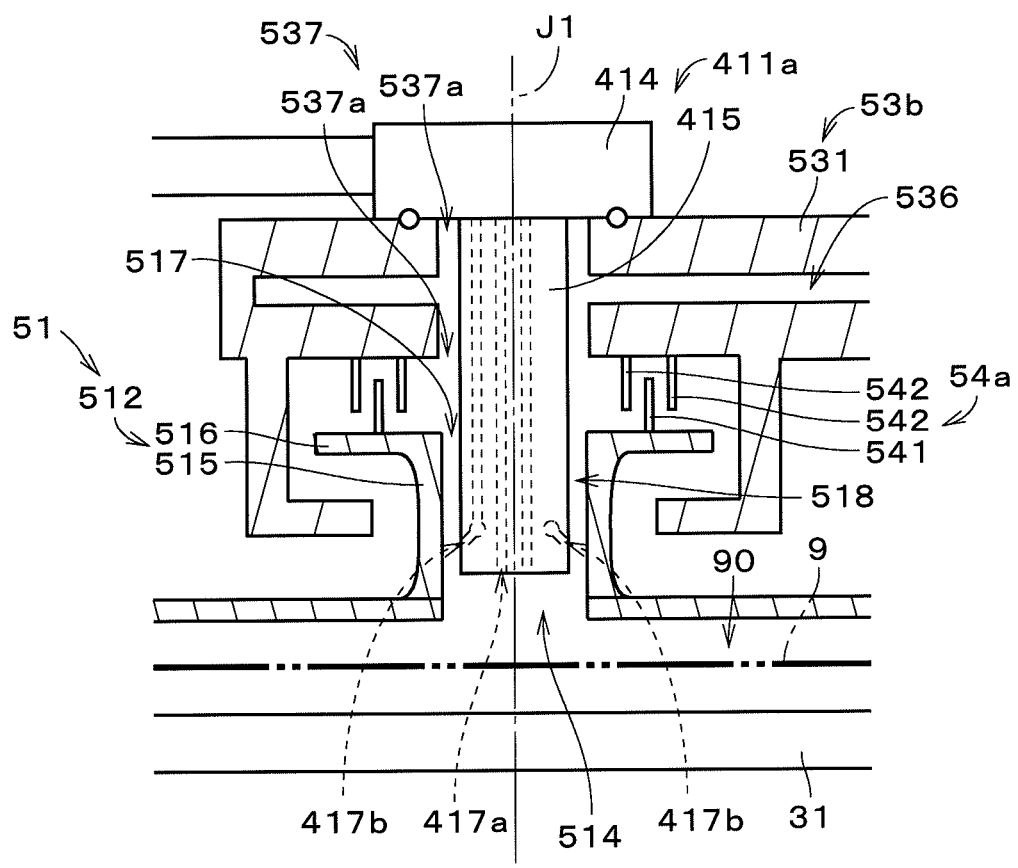
FIG. 18 is a cross-sectional view of around the first processing liquid nozzle.

FIG. 18 is an enlarged cross-sectional view of the first processing liquid nozzle 411a in FIG. 17 and the vicinity thereof. In FIG. 18, the top plate 51 is located at the second position. The first processing liquid nozzle 411a includes the nozzle body 415 and the nozzle flange part 414. The side-surface jet openings 417c and 417d of the first processing liquid nozzle 411 illustrated in FIG. 10 are omitted from the first processing liquid nozzle 411a. The nozzle body 415 has a generally columnar shape and is inserted in the flange connector 515 of the to-be-held part 512 through the through hole 537 (i.e., the two openings 537a) of the opposing-member holder 53b. The nozzle flange part 414 is connected to the upper end of the nozzle body 415. The nozzle flange part 414 is a generally disc-shaped part that extends radially outward from the top of the nozzle body 415. The nozzle flange part 414 is in contact with the upper surface of the opposing-member holder 53b and covers the upper opening 537a. For example, an O ring may be provided between the lower surface of the nozzle flange part 414 and the upper surface of the opposing-member holder 53b.

In the example in FIG. 18, a labyrinth 54a is formed between the upper surface of the opposing-member flange part 516 and the opposing-member holder 53b. To be specific, the labyrinth 54a is formed around the entire circumference by a first protrusion 541 and two second protrusions 542, the first protrusion 541 protruding upward from the upper surface of the opposing-member flange part 516, and the second protrusions 542 protruding downward from the lower surface of the holder body 531 of the opposing-member holder 53b. The first protrusion 541 and the two second protrusions 542 have generally cylindrical shapes centered on the central axis J1 and have different diameters. The diameter of the first protrusion 541 is greater than the diameter of the inner second protrusion 542 and smaller than the diameter of the outer second protrusion 542. The upper end of the first protrusion 541 is located above the lower ends of the two second protrusions 542. When the top plate 51 located at the second position rotates along with the substrate holder 31, the two second protrusions 542 do not rotate, and the first protrusion 541 rotates between the two second protrusions 542.

Part of the inert gas supplied from the gas supply part 45 (see FIG. 6) to the first processing liquid nozzle 411a is supplied from a lower-surface jet opening 417a of the first processing liquid nozzle 411a through the opposing-member opening 514 to the processing space 90 between the top plate 51 and the substrate 9. Part of the inert gas supplied from the gas supply part 45 to the first processing liquid nozzle 411a is supplied from a plurality of side-surface jet openings 417b of the outer surface of the first processing liquid nozzle 411a to the gap 518 between the inner surface of the to-be-held part 512 of the top plate 51 and the outer surface of the first processing liquid nozzle 411a. The inert gas supplied obliquely downward from the side-surface jet openings 417b to the gap 518 flows down through the gap 518 and is supplied to the processing space 90.

The inert gas supplied from the gas supply part 45 to the holder inner space 536 of the opposing-member holder 53b passes through the opposing-member holder 53b and is supplied from the upper opening 517 of the to-be-held part 512 to the to-be-held part 512. To be specific, the inert gas supplied from the gas supply part 45 to the holder inner space 536 is supplied toward the upper and lower openings 537a of the through hole 537. Since, as described above, the upper opening 537a is closed with the nozzle flange part 414, the inert gas flows down through the lower opening 537a. Then, the inert gas flows down through the above gap 518 and is supplied through the opposing-member opening 514 to the processing space 90. Part of the inert gas supplied from the gas supply part 45 to the holder inner space 536 flows radially outward above the opposing-member flange part 516 to the labyrinth 54a and flows through the labyrinth 54a to the outside in the circumferential direction of the labyrinth 54a. The same applies to the state in which the second processing liquid nozzle 421a is located at the supply position.

Figure 19:
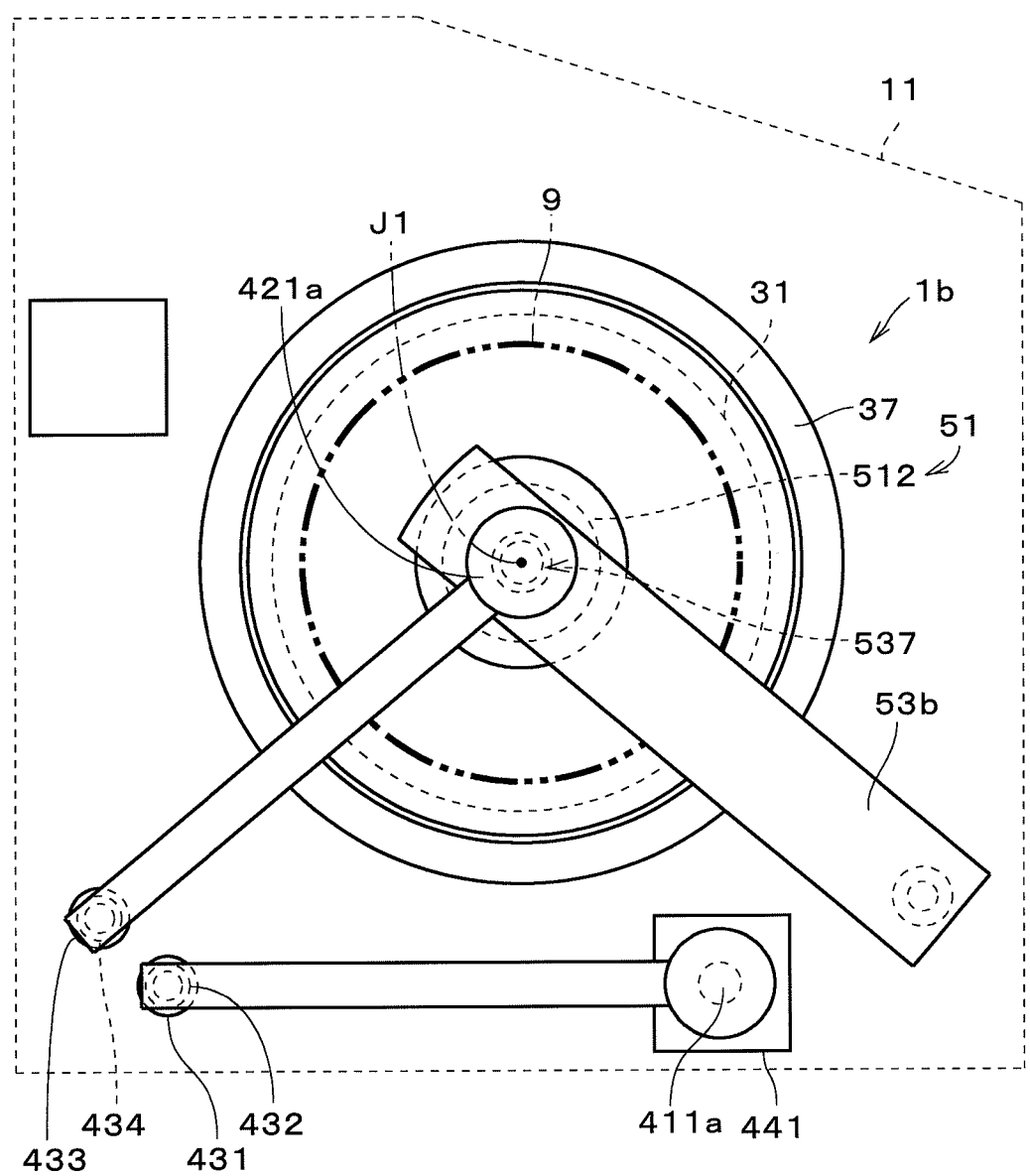
FIG. 19 is a plan view of the substrate processing apparatus.

FIG. 19 is a plan view of the substrate processing apparatus 1b. In FIG. 19, the first processing liquid nozzle 411a is moved from the supply position above the top plate 51 in FIG. 15 by the first nozzle elevating mechanism 431 and the first nozzle rotation mechanism 432 and located at its retracted position, which is located around and spaced from above the top plate 51. The second processing liquid nozzle 421a is moved from its retracted position around the top plate 51 in FIG. 15 by the second nozzle elevating mechanism 433 and the second nozzle rotation mechanism 434 and located at the supply position above the top plate 51. Our concepts regarding the retracted positions of the first processing liquid nozzle 411a and the second processing liquid nozzle 421a include a space (i.e., evacuation space) with a certain degree of spread that allows the first processing liquid nozzle 411a and the second processing liquid nozzle 421a to oscillate at their retracted positions.

Similarly to the first processing liquid nozzle 411a illustrated in FIG. 18, the second processing liquid nozzle 421a that is located at the above supply position is inserted into the through hole 537 of the opposing-member holder 53b and further inserted into the to-be-held part 512 through the upper opening 517 (see FIG. 18) of the to-be-held part 512 of the top plate 51. The end (i.e., lower end) of the second processing liquid nozzle 421a located at the above supply position is located above the lower edge of the opposing-member opening 514 of the opposing-member body 511, as in the case of the first processing liquid nozzle 411a in FIG. 18. Alternatively, the end of the second processing liquid nozzle 421a may be located at the same position as the lower edge of the opposing-member opening 514 in the up-down direction.

Figure 20A:
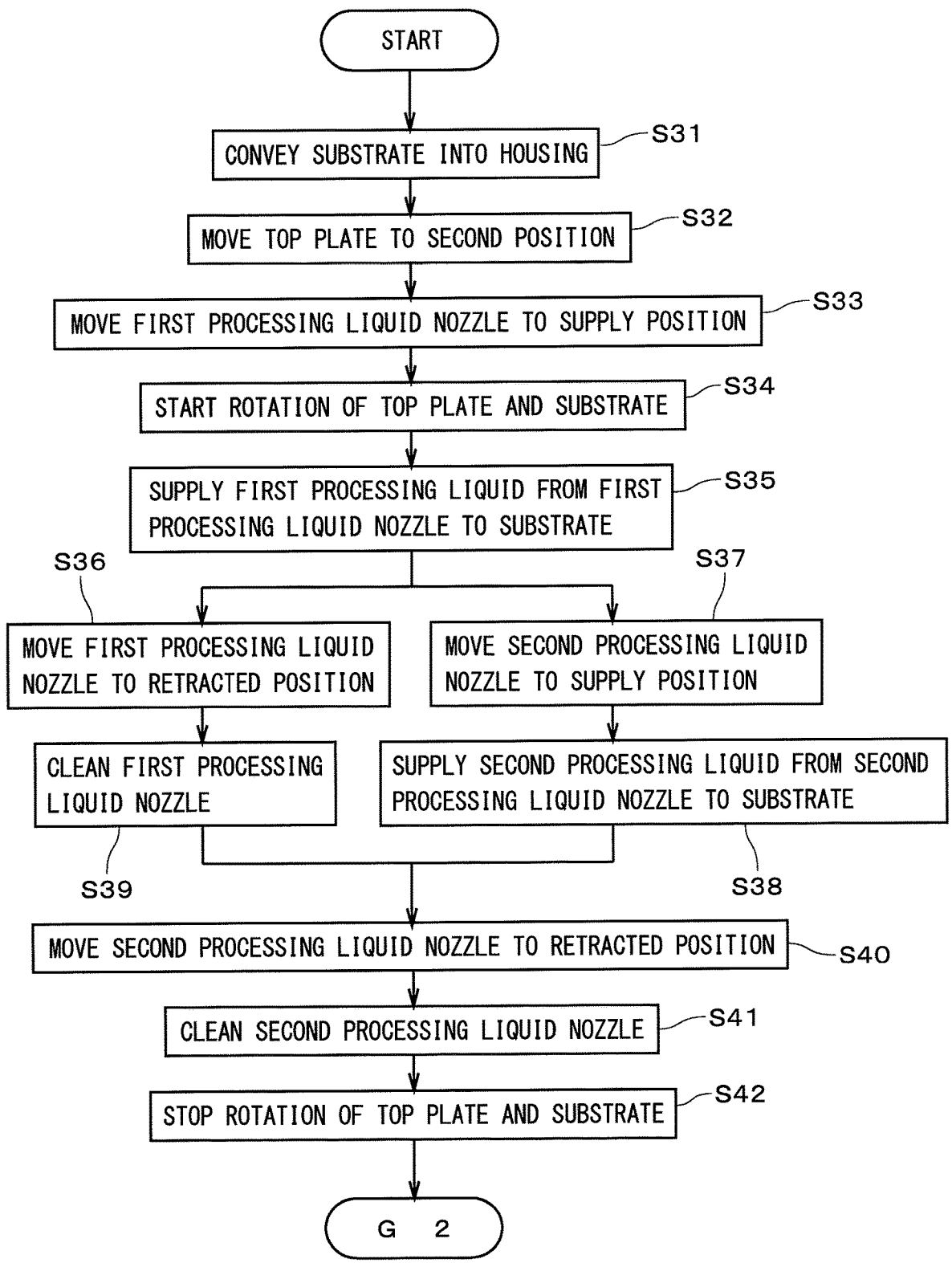
FIG. 20A is a flowchart of processing performed on a substrate.
Figure 20B:
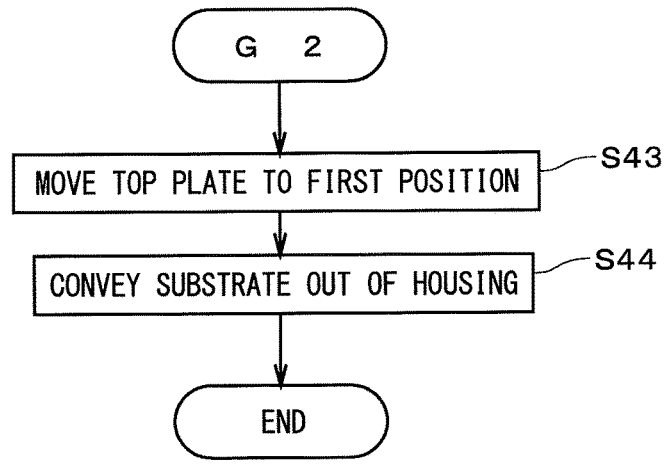
FIG. 20B is a flowchart of processing performed on the substrate.

Next, an exemplary procedure of processing performed on the substrate 9 by the substrate processing apparatus 1b will be described with reference to FIGS. 20A and 20B. The processing performed on the substrate 9 by the substrate processing apparatus 1b is approximately the same as the processing performed on the substrate 9 by the substrate processing apparatus 1, except in that steps S13 and S23 of moving the opposing-member holder 53 in FIGS. 12A and 12B are omitted.

In the substrate processing apparatus 1b, with the top plate 51 located at the first position illustrated in FIG. 16, the substrate 9 is first conveyed into the housing 11 and held by the substrate holder 31 (step S31). At this time, the first processing liquid nozzle 411a and the second processing liquid nozzle 421a are located at their respective retracted positions.

Next, the controller 21 (see FIG. 1) controls the opposing-member elevating mechanism 55 to move the top plate 51 down from the first position to the second position illustrated in FIG. 17 at which the top plate 51 is held by the substrate holder 31 (step S32). The controller 21 also controls the first nozzle elevating mechanism 431 and the first nozzle rotation mechanism 432 to move the first processing liquid nozzle 411a from the retracted position to the supply position (step S33). The first processing liquid nozzle 411a is inserted into the to-be-held part 512 of the top plate 51 through the through hole 537 of the opposing-member holder 53b and located inside the to-be-held part 512.

Note that steps S32 and S33 may be performed in parallel. Alternatively, the first processing liquid nozzle 411a may be moved from the retracted position to above the top plate 51 and inserted into the to-be-held part 512 of the top plate 51 located at the first position before step S32. In this case, in step S32, the first processing liquid nozzle 411a is also moved down along with the top plate 51 in synchronization with the downward movement of the top plate 51.

The controller 21 then controls the gas supply part 45 to supply an inert gas to the processing space 90 through the lower-surface jet opening 417a of the first processing liquid nozzle 411a illustrated in FIG. 18. The inert gas is also supplied through the side-surface jet openings 417b of the first processing liquid nozzle 411a to the gap 518 between the inner surface of the to-be-held part 512 of the top plate 51 and the outer surface of the first processing liquid nozzle 411a. Moreover, the insert gas supplied to the holder inner space 536 of the opposing-member holder 53b is supplied to the gap 518 through the upper opening 517 of the to-be-held part 512. The inert gas supplied from the first processing liquid nozzle 411a and the opposing-member holder 53b to the gap 518 flows down and is supplied to the processing space 90 through the opposing-member opening 514. Part of the inert gas supplied to the holder inner space 536 is also supplied to the labyrinth 54a.

The controller 21 also controls the substrate rotation mechanism 33 illustrated in FIG. 17 to start rotation of the substrate holder 31, the substrate 9, and the top plate 51 (step S34). The controller 21 then controls the first processing liquid supply part 413 to, with the first processing liquid nozzle 411a located at the supply position, supply the first processing liquid from the first processing liquid nozzle 411a through the opposing-member opening 514 of the top plate 51 located at the second position to the central part of the upper surface 91 of the substrate 9 that is being rotated (step S35). The first processing liquid supplied from the first processing liquid nozzle 411a located at the supply position to the central part of the substrate 9 is spread radially outward from the central part of the substrate 9 over the entire upper surface 91 of the substrate 9 by the rotation of the substrate 9. The first processing liquid is dispersed radially outward from the outer edge of the substrate 9 and received by the cup part 37. In the substrate processing apparatus 1b, the first processing liquid is supplied for a predetermined period of time, and the processing of the substrate 9 using the first processing liquid ends.

When the processing of the substrate 9 with the first processing liquid has ended, the supply of the first processing liquid from the first processing liquid nozzle 411a is stopped. Then, the first processing liquid nozzle 411a is moved from the supply position to its retracted position by the first nozzle elevating mechanism 431 and the first nozzle rotation mechanism 432 (step S36). After the first processing liquid nozzle 411a is moved from the supply position, the inert gas from the gas supply part 45 is supplied to the processing space 90 through the holder inner space 536 of the opposing-member holder 53b and the upper opening 517 of the to-be-held part 512.

In the substrate processing apparatus 1b, the controller 21 controls the second nozzle elevating mechanism 433 and the second nozzle rotation mechanism 434 to move the second processing liquid nozzle 421a from its retracted position to the supply position as illustrated in FIG. 19 (step S37). The second processing liquid nozzle 421a is inserted into the to-be-held part 512 of the top plate 51 through the through hole 537 of the opposing-member holder 53b and located inside the to-be-held part 512. Preferably, the second processing liquid nozzle 421a may be moved (step S37) in parallel with the movement of the first processing liquid nozzle 411a (step S36). Note that step S37 may be performed after completion of step S36.

When the second processing liquid nozzle 421a is located at the supply position, the inert gas from the gas supply part 45 is supplied through the lower-surface jet opening of the second processing liquid nozzle 421a to the processing space 90. The inert gas is also supplied through the side-surface jet openings of the outer surface of the second processing liquid nozzle 421a to the gap 518 between the inner surface of the to-be-held part 512 of the top plate 51 and the outer surface of the second processing liquid nozzle 421a. The inert gas is further supplied through the holder inner space 536 of the opposing-member holder 53b and the upper opening 517 of the to-be-held part 512 to the gap 518. The inert gas supplied to the gap 518 flows down through the opposing-member opening 514 and is supplied to the processing space 90. Part of the inert gas supplied to the holder inner space 536 is also supplied to the labyrinth 54a.

The controller 21 then controls the second processing liquid supply part 423 to, with the second processing liquid nozzle 421a located at the supply position, supply the second processing liquid from the second processing liquid nozzle 421a through the opposing-member opening 514 of the top plate 51 located at the second position to the central part of the upper surface 91 of the substrate 9 (step S38). The second processing liquid supplied from the second processing liquid nozzle 421a located at the supply position to the central part of the substrate 9 is spread radially outward from the central part of the substrate 9 over the entire upper surface 91 of the substrate 9 by the rotation of the substrate 9. The second processing liquid is dispersed radially outward from the outer edge of the substrate 9 and received by the cup part 37. The second processing liquid is supplied for a predetermined period of time, and the processing of the substrate 9 using the second processing liquid ends.

In the substrate processing apparatus 1b, in parallel with the movement of the second processing liquid nozzle 421a (step S37) or the supply of the second processing liquid (step S38), the controller 21 controls the first cleaning part 441 to clean the first processing liquid nozzle 411a located at the retracted position (step S39).

When the processing of the substrate 9 using the second processing liquid has ended, the supply of the second processing liquid from the second processing liquid nozzle 421a is stopped. The substrate 9 continues to be rotated, and processing for drying the substrate 9 is performed. Also, the second processing liquid nozzle 421a is moved from the supply position to its retracted position by the second nozzle elevating mechanism 433 and the second nozzle rotation mechanism 434 (step S40). The controller 21 then controls the second cleaning part 442 to clean the second processing liquid nozzle 421a located at the retracted position (step S41).

Also, the rotation of the substrate holder 31, the substrate 9, and the top plate 51 by the substrate rotation mechanism 33 is stopped (step S42). Then, the top plate 51 is moved up from the second position to the first position by the opposing-member elevating mechanism 55, spaced above from the substrate holder 31, and held by the opposing-member holder 53b (step S43). Thereafter, the substrate 9 is conveyed out of the housing 11 (step S44). Steps S42 to S44 may, for example, be performed after step S41. Alternatively, step S41 may be performed in parallel with one or more of steps S42 to S44. Step S39 may also be performed in parallel with step S41, for example.

The substrate processing apparatus 1b sequentially performs the above-described steps S31 to S44 on a plurality of substrates 9 to process the substrate 9. Note that step S41 may be performed after step S44 and before the next substrate 9 is conveyed into the housing, or may be performed in parallel with steps S31 to S36 that are performed on the next substrate 9. Alternatively, step S41 may be performed between steps S36 and S37 that are performed on the next substrate 9.

As described above, in the substrate processing apparatus 1b, the top plate 51 that is located at the first position is held by the opposing-member holder 53b and spaced above from the substrate holder 31 as in the substrate processing apparatus 1 illustrated in FIG. 1. The top plate 51 that is located at the second position is held by the substrate holder 31, spaced from the opposing-member holder 53b, and rotated along with the substrate holder 31 by the substrate rotation mechanism 33. The gas supply part 45 supplies a gas to the processing space 90 between the top plate 51 and the substrate 9. This configuration allows a desired gaseous atmosphere to be created in the processing space 90 and allows the substrate 9 to be processed in that gaseous atmosphere. For example, when an inert gas is supplied to the processing space 90, the substrate 9 is processed in an inert gas atmosphere (i.e., low oxygen atmosphere).

In the substrate processing apparatus 1b, the gas supply part 45 supplies a gas to the gap 518 between the inner surface of the to-be-held part 512 of the top plate 51 and the outer surface of the processing liquid nozzle that is located inside the to-be-held part 512 (i.e., the first processing liquid nozzle 411a or the second processing liquid nozzle 421a that is located at the supply position). Thus, the gap 518 between the top plate 51 rotating along with the substrate 9 and the processing liquid nozzle in a stationary state is sealed with the gas. This configuration reduces the entry of outside air into the processing space 90 from the gap 518 between the top plate 51 and the processing liquid nozzle. Consequently, the processing space 90 remains in the desired gaseous atmosphere, and the processing of the substrate 9 is easily implemented in that gaseous atmosphere.

As described above, the processing liquid nozzle located at the supply position protrudes downward from the opposing-member holder 53b and is inserted through the upper opening 517 of the to-be-held part 512 of the top plate 51. The gas from the gas supply part 45 is supplied via the opposing-member holder 53b to the to-be-held part 512 through the upper opening 517 of the to-be-held part 512. This configuration reduces the entry of outside air from the upper opening 517 of the to-be-held part 512 into the processing space 90 not only when the first processing liquid nozzle 411a and the second processing liquid nozzle 421a are each located at the supply position, but also during exchange between the first processing liquid nozzle 411a and the second processing liquid nozzle 421a (i.e., when no processing liquid nozzle is located inside the to-be-held part 512).

As described above, the processing liquid nozzle located at the supply position is inserted into the to-be-held part 512 through the through hole 537 of the opposing-member holder 53b above the to-be-held part 512. The gas from the gas supply part 45 is supplied toward the through hole 537. When a processing liquid nozzle is located at the supply position, the gas flows through the lower opening 537a of the through hole 537 to the gap 518. This configuration allows the gas to be easily guided from the opposing-member holder 53b to the processing space 90.

During exchange between the first processing liquid nozzle 411a and the second processing liquid nozzle 421a (i.e., with no processing liquid nozzle inserted in the through hole 537), the gas from the gas supply part 45 is supplied toward the upper and lower openings 537a of the through hole 537. The gas supplied toward the upper opening 537a reduces the entry of outside air around the opposing-member holder 53b into the holder inner space 536 through the upper opening 537a. Also, the gas supplied toward the lower opening 537a and flowing toward the upper opening 517 of the to-be-held part 512 and the opposing-member flange part 516 reduces the possibility that outside air around the to-be-held part 512 will enter the processing space 90 through the upper opening 517 of the to-be-held part 512 from the space between the upper surface of the opposing-member flange part 516 and the opposing-member holder 53b.

With the top plate 51 located at the second position, the labyrinth 54a is formed between the upper surface of the opposing-member flange part 516 of the top plate 51 and the opposing-member holder 53b. The presence of the labyrinth 54a reduces the possibility that outside air around the to-be-held part 512 will enter the gap 518 and the processing space 90 through the upper opening 517 of the to-be-held part 512 from the space between the upper surface of the opposing-member flange part 516 and the opposing-member holder 53b. Moreover, the gas supplied from the gas supply part 45 to the holder inner space 536 is supplied through the opening 537a of the lower surface of the holder body 531 to the labyrinth 54a. This configuration further reduces the entry of outside air into the gap 518 from the space between the opposing-member flange part 516 and the opposing-member holder 53b.

As described above, the gas from the gas supply part 45 is supplied from the outer surface of the processing liquid nozzle located at the supply position to the gap 518. The direct supply of a gas from the outer surface of the processing liquid nozzle located inside the to-be-held part 512 to the gap 518 facilitates the supply of a gas to the gap 518.

In the substrate processing apparatus 1b, under the control of the controller 21, the first processing liquid is supplied through the opposing-member opening 514 to the substrate 9 with the first processing liquid nozzle 411a located at the supply position, and the first processing liquid nozzle 411a is moved from the supply position to its retracted position (i.e., first retracted position). Then, the second processing liquid nozzle 421a is moved from its retracted position (i.e., second retracted position) to the supply position and supplies the second processing liquid through the opposing-member opening 514 to the substrate 9. This configuration suppresses or prevents mixture of a plurality of types of processing liquids, as compared with the case where a plurality of types of processing liquids are successively supplied from a single processing liquid nozzle. Also, the first processing liquid nozzle 411a and the second processing liquid nozzle 421a are retractable from the supply position. Thus, processing liquids that adhere to, for example, the inner surface of the to-be-held part 512 of the top plate 51, are easily removable.

As described above, the first processing liquid nozzle 411a and the second processing liquid nozzle 421a, when located at the supply position, are inserted in the through hole 537 of the opposing-member holder 53b above the opposing-member opening 514. This facilitates the process of alternately disposing the first processing liquid nozzle 411a and the second processing liquid nozzle 421a at the supply position.

As described above, in the substrate processing apparatus 1b, the gas from the gas supply part 45 is supplied from the first processing liquid nozzle 411a during the time that the first processing liquid is supplied from the first processing liquid nozzle 411a to the substrate 9 (step S35), and the gas from the gas supply part 45 is supplied from the second processing liquid nozzle 421a during the time that the second processing liquid is supplied from the second processing liquid nozzle 421a to the substrate 9 (step S38). This simplifies the configuration of supplying a gas from the gas supply part 45 to the processing space 90 in parallel with the processing of the substrate 9 using the first processing liquid or the second processing liquid.

Figure 22:
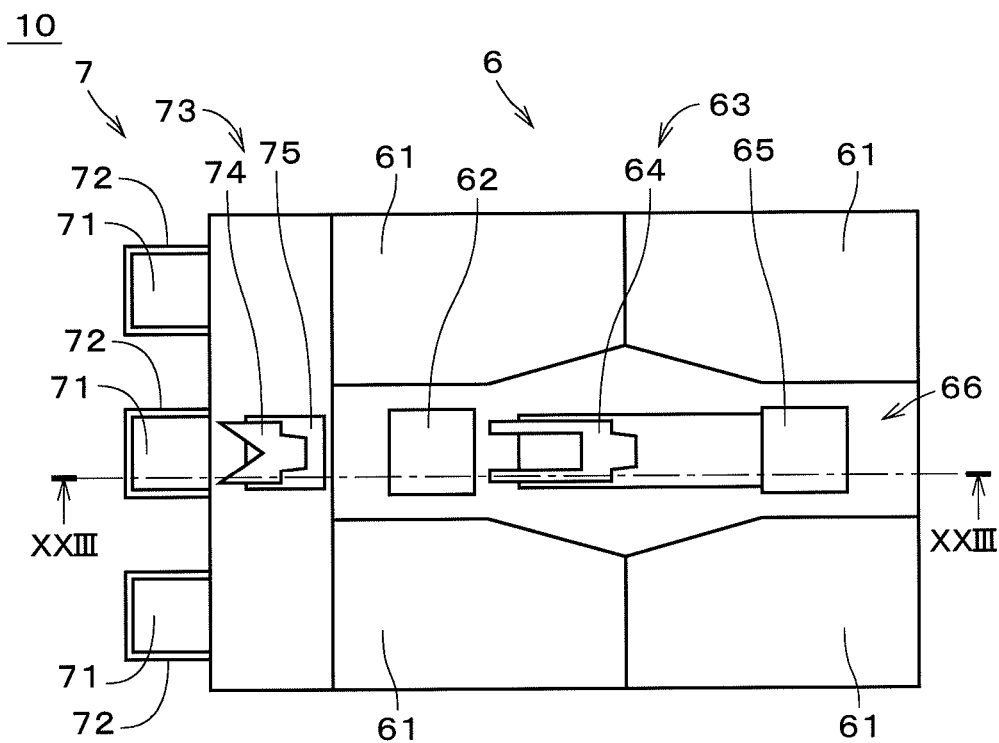
FIG. 22 is a plan view of a substrate processing system according to a fourth embodiment.
Figure 23:
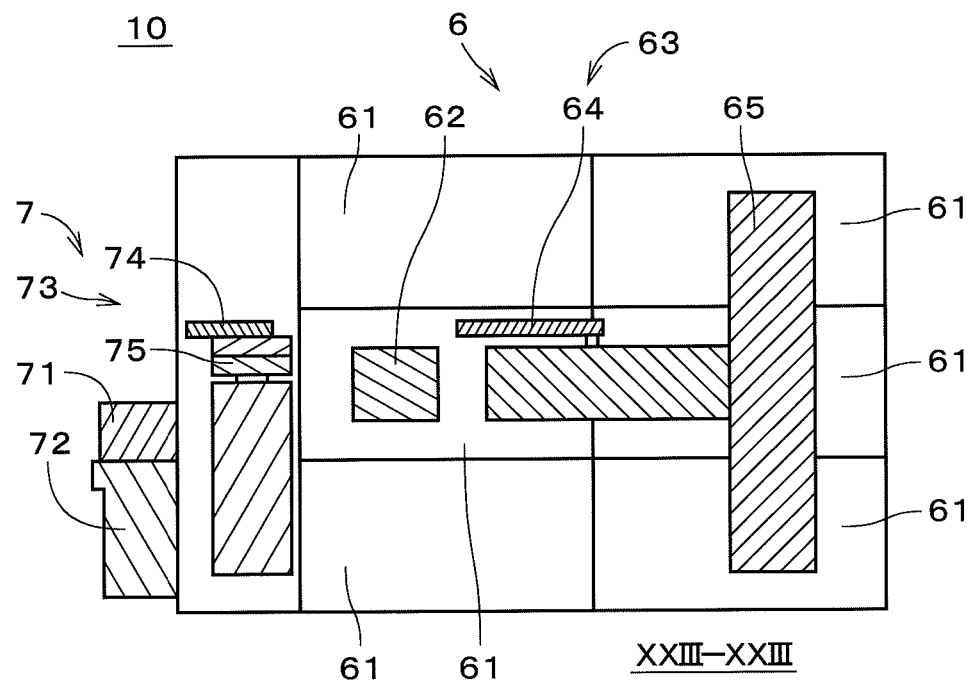
FIG. 23 is a cross-sectional view of the substrate processing system.

FIG. 22 is a plan view illustrating the interior of a substrate processing system 10 according to a fourth embodiment of the present invention. FIG. 23 is a cross-sectional view of the substrate processing system 10 taken along XXIII-XXIII in FIG. 22. FIG. 23 also illustrates a configuration on the back of the cross-section. The substrate processing system 10 is a system (apparatus) for processing a semiconductor substrate (hereinafter, simply referred to as a "substrate").

The substrate processing system 10 includes an indexer 7 and a processor 6. The indexer 7 includes a plurality of substrate containers 71, a plurality of substrate container placement parts 72, and an indexer robot 73. The substrate containers 71 are respectively placed on the substrate container placement parts 72. In FIGS. 22 and 23, the substrate containers 71 are located on the left side of the indexer robot 73. Each substrate container 71 houses a plurality of substrates. In each substrate container 71, a plurality of substrates located in a horizontal position are arrayed and housed away from one another in the up-down direction.

The indexer robot 73 includes an indexer hand 74 and a hand drive mechanism 75. The indexer hand 74 is able to hold a single substrate in a horizontal position. The hand drive mechanism 75 includes, for example, a forward-backward movement mechanism for moving the indexer hand 74 forward and backward in a horizontal direction, an elevating mechanism for moving the indexer hand 74 in the up-down direction, and a rotation mechanism for rotating the indexer hand 74 about a rotation axis parallel to the up-down direction.

When the indexer hand 74 is driven by the hand drive mechanism 75, a substrate (e.g., unprocessed substrate that has not yet been processed) is conveyed out of a substrate container 71, or a substrate (e.g., processed substrate) is conveyed into a substrate container 71. To be specific, the hand drive mechanism 75 causes the indexer hand 74 to oppose a substrate container 7 and then move forward to be inserted into the substrate container 71. The indexer hand 74 is then moved up to hold a substrate and thereafter moved backward to convey the substrate out of the substrate container 71. In the case of conveying a substrate into a substrate container 71, reverse operations are performed.

The processor 6 includes a plurality of processing units 61, an intermediate unit 62, and a main conveying robot 63. Each processing unit 61 is a unit that processes a substrate by supplying a processing liquid to the substrate. In a plan view, the processing units 61 are located to surround a space 66 where the intermediate unit 62 and the main conveying robot 63 are located. The space 66 is a space for the main conveying robot 63 and is shared among the processing units 61. In the following description, this space is referred to as a "shared space 66." In the example illustrated in FIGS. 22 and 23, the substrate processing system 10 includes 12 processing units 61. To be specific, the substrate processing system 10 has six processing units 61 on either side of the shared space 66. Alternatively, the processing units 61 may be located on only one side of the shared space 66.

The main conveying robot 63 includes a substrate conveying hand 64 and a hand drive mechanism 65. The substrate conveying hand 64 is able to hold a single substrate in a horizontal position. The hand drive mechanism 65 includes, for example, a forward-backward movement mechanism for moving the substrate conveying hand 64 forward and backward in a horizontal direction, an elevating mechanism for moving the substrate conveying hand 64 in the up-down direction, and a rotation mechanism for rotating the substrate conveying hand 64 about a rotation axis parallel to the up-down direction.

When the substrate conveying hand 64 is driven by the hand drive mechanism 65, a substrate (e.g., unprocessed substrate) is conveyed into a processing unit 61, or a substrate (e.g., processed substrate) is conveyed out of a processing unit 61. To be specific, the hand drive mechanism 65 causes the substrate conveying hand 64 to oppose the conveyance port of a processing unit 61 and then moves the substrate conveying hand 64 in a forward direction to insert the substrate into the processing unit 61. After the substrate is transferred from the substrate conveying hand 64 to a substrate holder 31 (described later) in the processing unit 61, the substrate conveying hand 64 is moved backward to retract from the processing unit 61. In the case of conveying a substrate out of a processing unit, reverse operations are performed.

The intermediate unit 62 is a unit that temporarily holds a substrate when the substrate is transferred between the indexer robot 73 and the main conveying robot 63. For example, the indexer robot 73 conveys an unprocessed substrate out of a substrate container 71 and conveys the unprocessed substrate into the intermediate unit 62 in which the unprocessed substrate is temporarily held. The main conveying robot 63 then conveys the unprocessed substrate out of the intermediate unit 62 and conveys the unprocessed substrate into a processing unit 61. The main conveying robot 63 also conveys a processed substrate out of a processing unit 61 and conveys the processed substrate into the intermediate unit 62 in which the processed substrate is temporarily held. The processed substrate is then conveyed out of the intermediate unit 62 into a substrate container 71 by the indexer robot 73.

Figure 24:
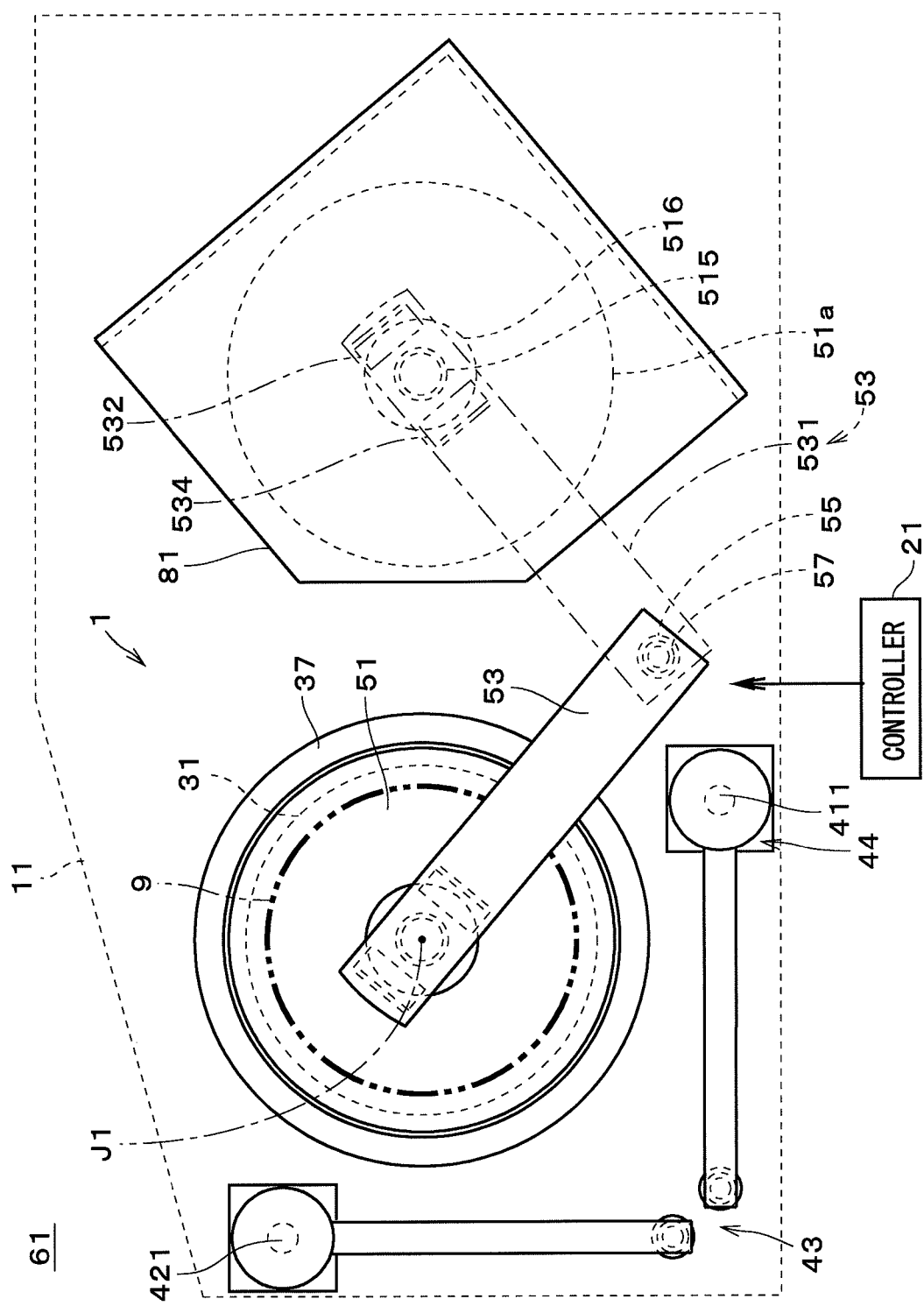
FIG. 24 is a plan view of a processing unit.
Figure 25:
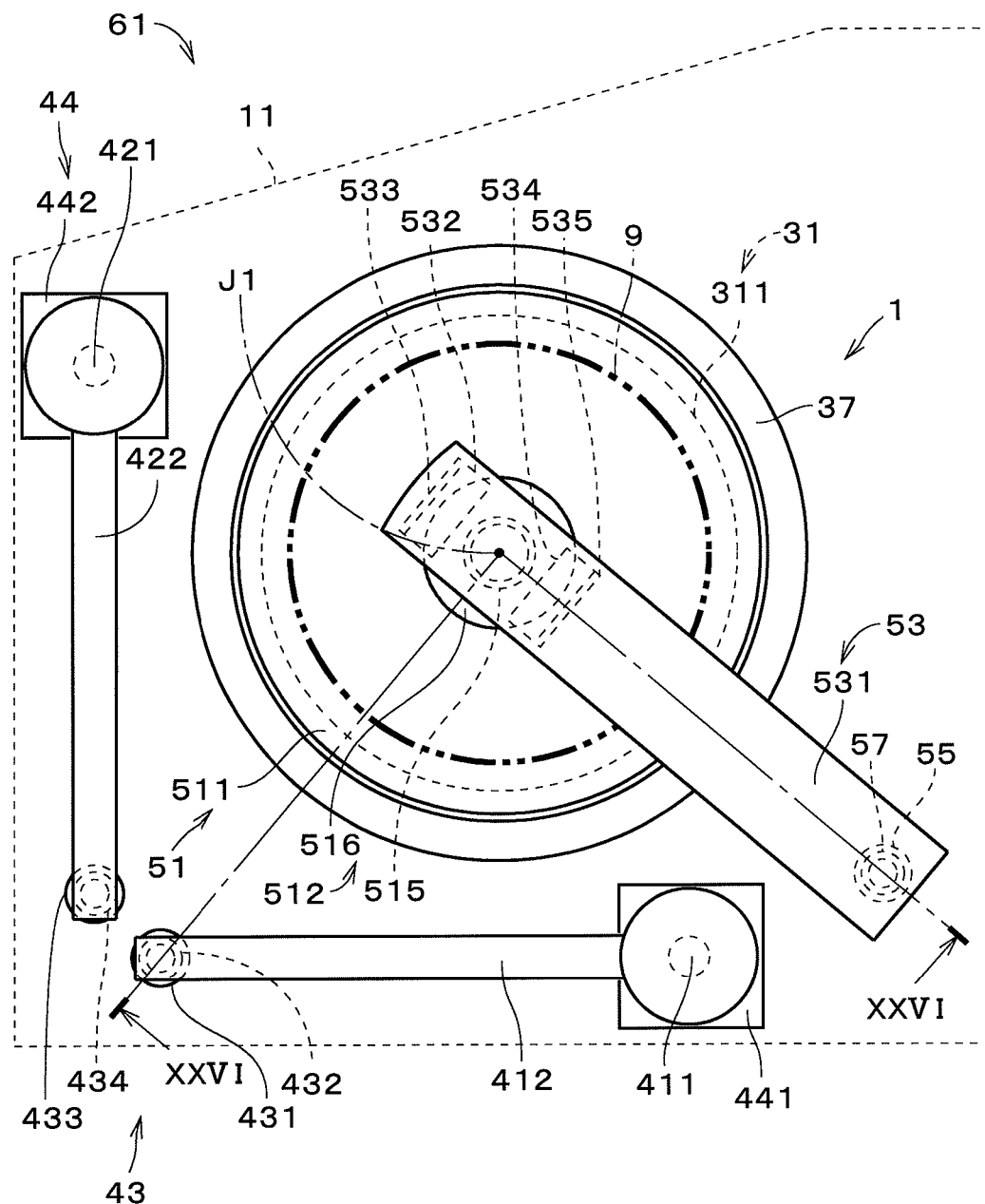
FIG. 25 is a plan view of part of the processing unit.
Figure 26:
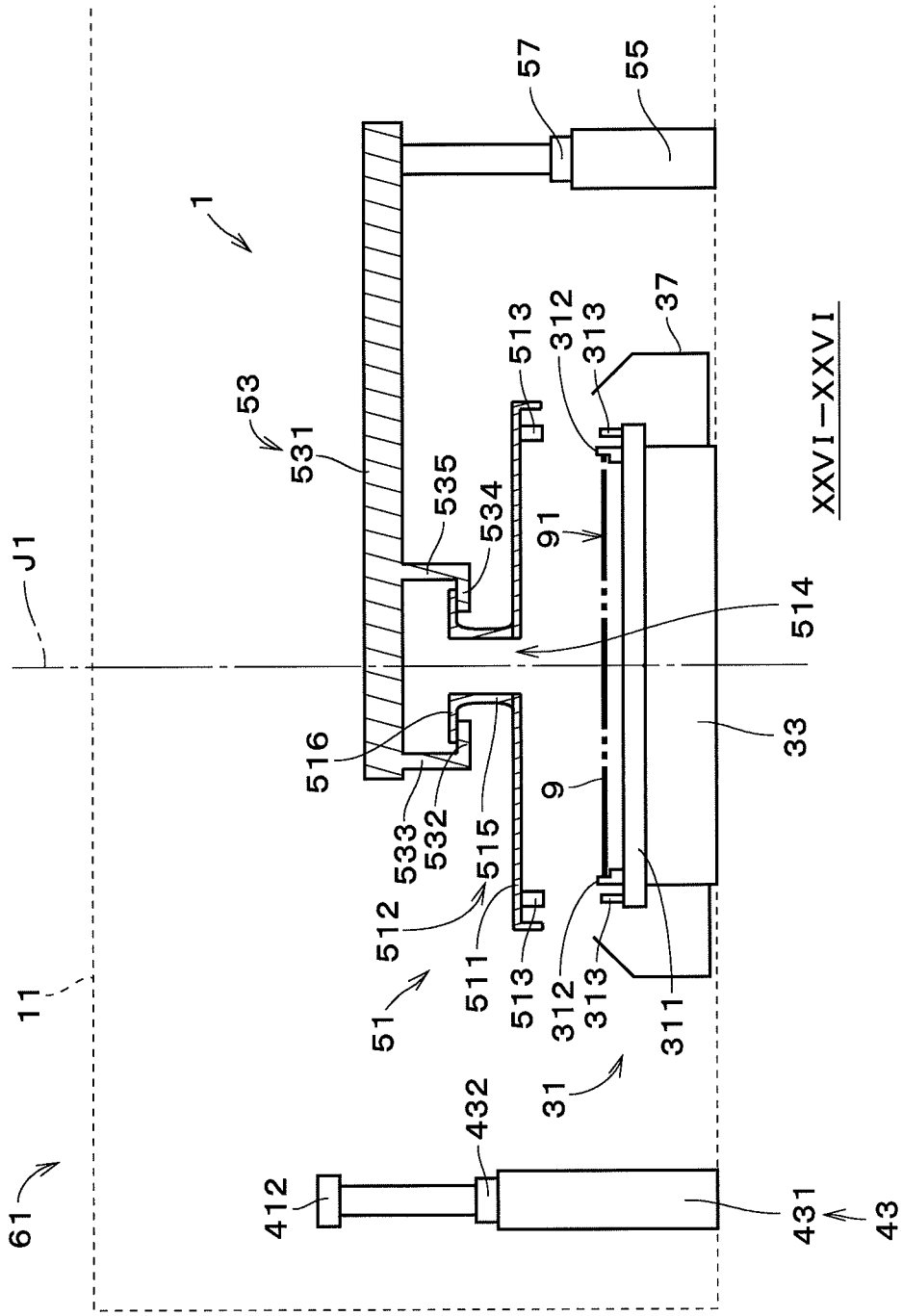
FIG. 26 is a cross-sectional view of part of the processing unit.

FIG. 24 is a plan view illustrating the interior of one processing unit 61. FIG. 25 is an enlarged plan view of part of the processing unit 61 illustrated in FIG. 24. FIG. 26 is a cross-sectional view of part of the processing unit 61 taken along XXVI-XXVI in FIG. 25. The processing unit 61 includes a substrate processing apparatus 1 and a housing 11. The substrate processing apparatus 1 is a sheet-fed apparatus for processing substrates 9 one at a time. The substrate processing apparatus 1 is housed in the housing 11 that is an apparatus housing chamber. In FIGS. 24 to 26, the housing 11 is indicated by a broken line. In the following drawings, the housing 11 is also indicated by a broken line. In the substrate processing system 10, the other processing units 61 also have the same configuration as the configuration illustrated in FIGS. 24 to 26. In each of the other processing units 61, another substrate processing apparatus 1 is housed in another housing 11 that is another apparatus housing chamber. The other substrate processing apparatuses 1 have the same configuration as the configuration of the substrate processing apparatus 1 illustrated in FIGS. 24 to 26.

As illustrated in FIGS. 24 to 26, the substrate processing apparatus 1 includes a substrate holder 31, a substrate rotation mechanism 33, a cup part 37, a first processing liquid nozzle 411, a second processing liquid nozzle 421, a nozzle moving mechanism 43, a nozzle cleaning part 44, a top plate 51, an opposing-member holder 53, an opposing-member elevating mechanism 55, an opposing-member-holder moving mechanism 57, and an opposing-member storage part 81. As illustrated in FIG. 24, the substrate processing apparatus 1 further includes a controller 21. The controller 21 controls constituent elements of, for example, the substrate rotation mechanism 33, the nozzle moving mechanism 43, the nozzle cleaning part 44, the opposing-member elevating mechanism 55, and the opposing-member-holder moving mechanism 57. In FIG. 25 and subsequent drawings, the controller 21 is not shown.

In FIGS. 24 and 25, the first processing liquid nozzle 411 and the second processing liquid nozzle 421 are spaced from the top plate 51 in a plan view and located at their respective retracted positions around the top plate 51. In the following description, when there is no particular need to distinguish between the first processing liquid nozzle 411 and the second processing liquid nozzle 421, the first processing liquid nozzle 411 and the second processing liquid nozzle 421 are collectively referred to as "processing liquid nozzles," or either the first processing liquid nozzle 411 or the second processing liquid nozzle 421 is simply referred to as a "processing liquid nozzle."

As illustrated in FIGS. 25 and 26, the nozzle moving mechanism 43 includes a first nozzle elevating mechanism 431, a first nozzle rotation mechanism 432, a second nozzle elevating mechanism 433, and a second nozzle rotation mechanism 434. The first processing liquid nozzle 411 is connected to the end of a first arm 412 that extends horizontally from the first nozzle elevating mechanism 431 and the first nozzle rotation mechanism 432. The first nozzle elevating mechanism 431 moves the first processing liquid nozzle 411 along with the first arm 412 in the up-down direction. The first nozzle rotation mechanism 432 horizontally rotates the first processing liquid nozzle 411 along with the first arm 412.

As illustrated in FIG. 25, the second processing liquid nozzle 421 is connected to the end of a second arm 422 that extends horizontally from the second nozzle elevating mechanism 433 and the second nozzle rotation mechanism 434. The second nozzle elevating mechanism 433 moves the second processing liquid nozzle 421 along with the second arm 422 in the up-down direction. The second nozzle rotation mechanism 434 horizontally rotates the second processing liquid nozzle 421 along with the second arm 422.

The substrate holder 31 illustrated in FIGS. 25 and 26 holds a substrate 9 in a horizontal position. The substrate holder 31 includes a base part 311, a plurality of chucks 312, and a plurality of engagement parts 313. The base part 311 is a generally disc-shaped member centered on a central axis J1 pointing in the up-down direction. The substrate 9 is located above the base part 311. The chucks 312 are generally equiangularly spaced about the central axis J1 and circumferentially arranged on the outer periphery of the upper surface of the base part 311. In the substrate holder 31, the chucks 312 hold the outer edge of the substrate 9 in a horizontal position. The engagement parts 313 are generally equiangularly spaced about the central axis J1 and circumferentially arranged on the outer periphery of the upper surface of the base part 311. The engagement parts 313 are located radially outward of the chucks 312. The substrate rotation mechanism 33 is located below the substrate holder 31. The substrate rotation mechanism 33 rotates the substrate 9 along with the substrate holder 31 about the central axis J1.

The cup part 37 is an annular member centered on the central axis J1 and is located radially outward of the substrate 9 and the substrate holder 31. The cup part 37 covers the entire circumference of the substrate 9 and the substrate holder 31 and receives, for example, processing liquids that are dispersed from the substrate 9 to the surroundings. The cup part 37 has a discharge port (not shown) at the bottom. The processing liquids or other substances received by the cup part 37 are discharged through the discharge port to the outside of the housing 11. Also, gases in the cup part 37 are exhausted through the discharge port to the outside of the housing 11.

The top plate 51 is a generally circular member in a plan view. The top plate 51 is an opposing member that opposes the upper surface 91 of the substrate 9 and acts as a shield plate that shields above the top of the substrate 9. The top plate 51 includes an opposing-member body 511, a to-be-held part 512, and a plurality of engagement parts 513. The opposing-member body 511 is a generally disc-shaped member centered on the central axis J1. The opposing-member body 511 opposes the upper surface 91 of the substrate 9.

The opposing-member body 511 has an opposing-member opening 514 in the central part. The opposing-member opening 514 is, for example, generally circular in a plan view. The diameter of the opposing-member opening 514 is smaller enough than the diameter of the substrate 9. The engagement parts 513 are generally equiangularly spaced about the central axis J1 and circumferentially arranged on the outer periphery of the lower surface of the opposing-member body 511.

The to-be-held part 512 is a tubular part that protrudes upward from the periphery of the opposing-member opening 514 of the opposing-member body 511. The to-be-held part 512 includes a flange connector 515 and an opposing-member flange part 516. The flange connector 515 has a generally cylindrical shape centered on the central axis J1. The flange connector 515 is connected to the opposing-member body 511 in the vicinity of the edge of the opposing-member opening 514. The opposing-member flange part 516 extends radially outward from the upper end of the flange connector 515. The opposing-member flange part 516 has, for example, a generally annular plate-like shape centered on the central axis J1.

The opposing-member holder 53 holds the to-be-held part 512 of the top plate 51. The opposing-member holder 53 includes a holder body 531, a first flange supporter 532, a first connector 533 a second flange supporter 534, and a second connector 535. The holder body 531 is a rod-like arm that extends generally horizontally. The base (i.e., the right end in FIG. 26) of the holder body 531 is connected to the opposing-member elevating mechanism 55 and the opposing-member-holder moving mechanism 57. In the substrate processing apparatus 1, the opposing-member holder 53, the opposing-member elevating mechanism 55, and the opposing-member-holder moving mechanism 57 constitute an opposing-member conveying mechanism for conveying the top plate 51. The opposing-member conveying mechanism may include other constituent elements.

The first flange supporter 532, the first connector 533, the second flange supporter 534, and the second connector 535 are mounted on the tip end portion of the holder body 531. The first flange supporter 532 and the first connector 533 are located in the vicinity of the tip end of the holder body 531, and the second flange supporter 534 and the second connector 535 are located between the base of the holder body 531 and a pair of the first flange supporter 532 and the first connector 533. The second flange supporter 534 is located on the opposite side to the first flange supporter 532 with the flange connector 515 of the top plate 51 located therebetween.

Figure 27:
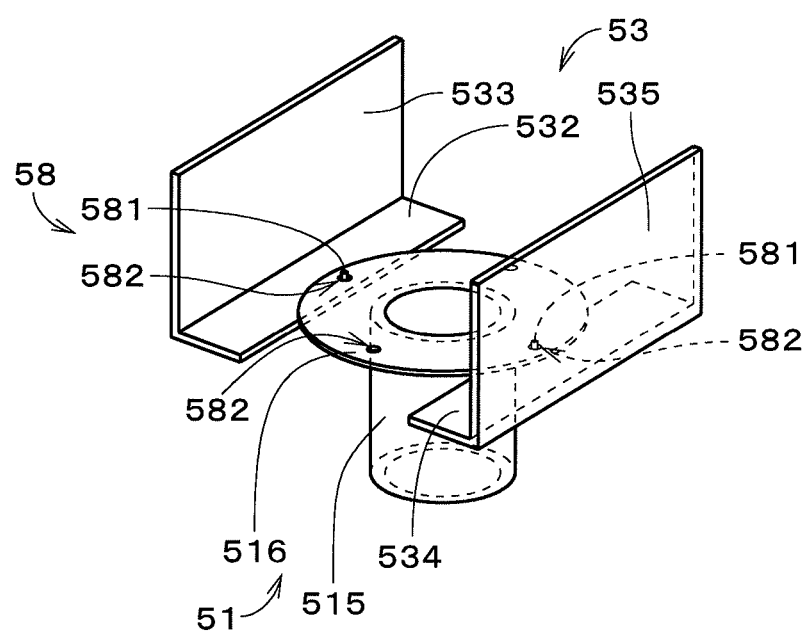
FIG. 27 is an enlarged perspective view of around an end portion of the opposing-member holder.

FIG. 27 is an enlarged perspective view of the vicinity of the end portion of the opposing-member holder 53. In FIG. 27, the holder body 531 and the opposing-member body 511 are not shown. As illustrated in FIGS. 25 to 27, the first connector 533 and the second connector 535 are each a generally flat plate-like part that extends downward from the lower surface of the holder body 531. The first connector 533 and the second connector 535 each extend in a direction that is generally perpendicular to the longitudinal direction of the holder body 531. The first flange supporter 532 is a generally flat plate-like part that extends generally horizontally from the lower end of the first connector 533. The first flange supporter 532 extends from the first connector 533 toward the base of the holder body 531. The second flange supporter 534 is a generally flat plate-like part that extends generally horizontally from the lower end of the second connector 535. The second flange supporter 534 extends from the second connector 535 toward the tip end of the holder body 531.

The distance in the longitudinal direction of the holder body 531 between the first flange supporter 532 and the second flange supporter 534 is smaller than the outer diameter of the opposing-member flange part 516 of the top plate 51 and greater than the outer diameter of the flange connector 515. The distance in the longitudinal direction of the holder body 531 between the first connector 533 and the second connector 535 is greater than the outer diameter of the opposing-member flange part 516.

In the example in FIG. 25, the first flange supporter 532 and the second flange supporter 534 are fixed to the holder body 531 via the first connector 533 and the second connector 535. In other words, the first flange supporter 532 and the second flange supporter 534 are non-movable parts of the opposing-member holder 53, and the positions of the first flange supporter 532 and the second flange supporter 534 relative to the holder body 531 remain unchanged.

With the top plate 51 located at the position illustrated in FIG. 26, the first flange supporter 532 and the second flange supporter 534 are each in contact with and support part of the opposing-member flange part 516 of the top plate 51 from the underside. Thus, the top plate 51 is suspended from the opposing-member holder 53 above the substrate 9 and the substrate holder 31. In the following description, the position of the top plate 51 in the up-down direction in FIG. 26 is referred to as a "first position." The top plate 51 located at the first position is held by the opposing-member holder 53 and spaced above from the substrate holder 31.

The substrate processing apparatus 1 further includes a mobility limiting part 58 that limits a positional shift of the top plate 51 (i.e., movement and rotation of the top plate 51) held by the opposing-member holder 53, as illustrated in FIG. 27. In the example in FIG. 27, the mobility limiting part 58 includes a plurality of protrusions 581 and a plurality of holes 582. The protrusions 581 protrude upward from the upper surfaces of the first flange supporter 532 and the second flange supporter 534. The holes 582 are through holes provided in the outer periphery of the opposing-member flange part 516. The protrusions 581 provided on the first flange supporter 532 and the second flange supporter 534 are inserted in the holes 582 of the opposing-member flange part 516 to limit a positional shift of the top plate 51. The substrate processing apparatus 1 may limit a positional shift of the top plate 51 by, for example, fitting the protrusions 581 into recesses that open radially inward from the outer edge of the opposing-member flange part 516. The mobility limiting part 58 may have other various configurations. The same applies to a substrate processing apparatus 1a, which will be described later.

Figure 28:
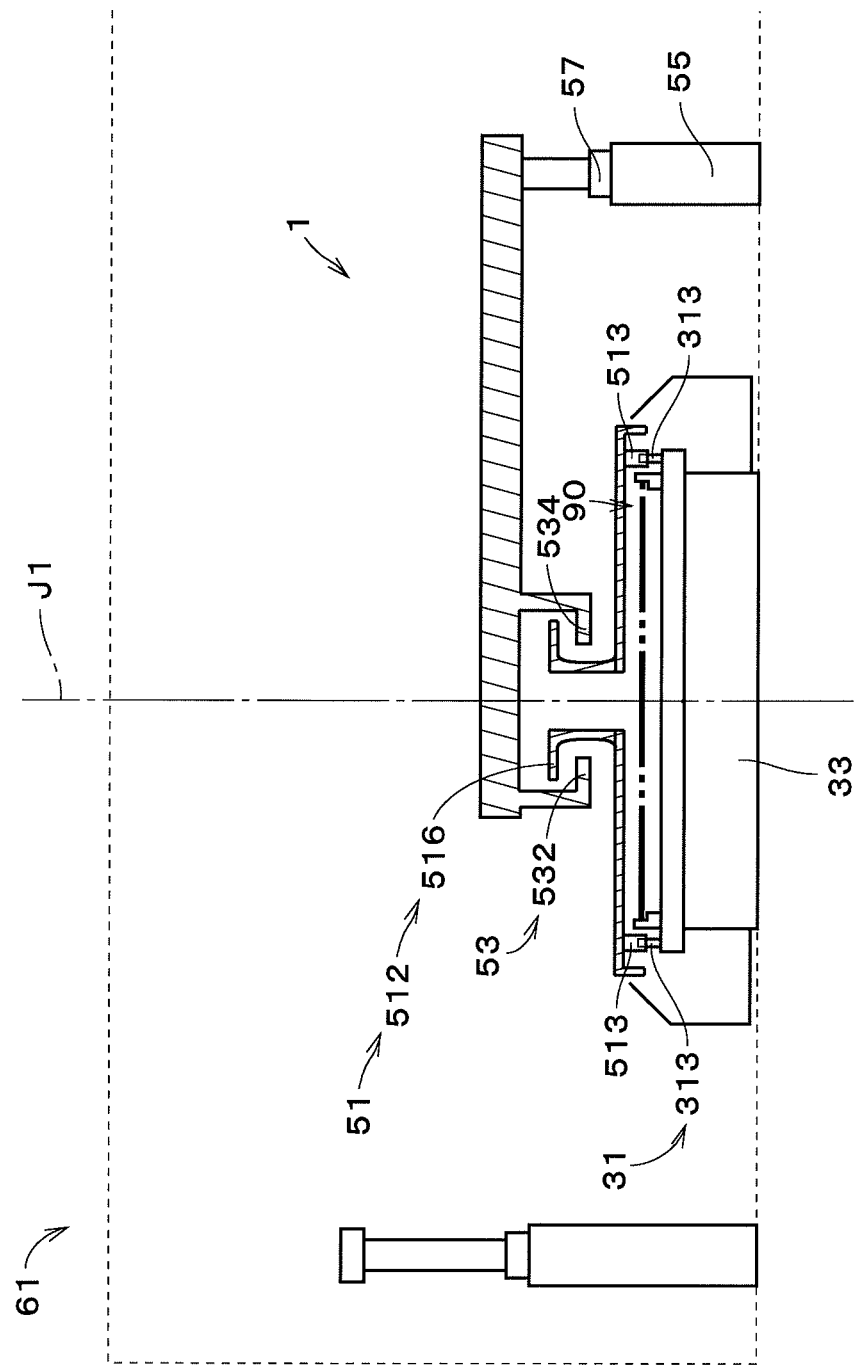
FIG. 28 is a cross-sectional view of part of the processing unit.

The opposing-member elevating mechanism 55 moves the top plate 51 along with the opposing-member holder 53 in the up-down direction. FIG. 28 is a cross-sectional view of part of the processing unit 61 in which the top plate 51 has been moved down from the first position illustrated in FIG. 26. In the following description, the position of the top plate 51 in the up-down direction in FIG. 28 is referred to as a "second position." That is, the opposing-member elevating mechanism 55 moves the top plate 51 between the first position and the second position in the up-down direction. The second position is a position below the first position. In other words, the second position is a position at which the top plate 51 is closer to the substrate holder 31 than at the first position.

With the top plate 51 located at the second position, the engagement parts 513 of the top plate 51 are respectively engaged with the engagement parts 313 of the substrate holder 31. The engagement parts 513 are supported from below by the engagement parts 313. For example, the engagement parts 313 are pins that extend generally parallel to the up-down direction, and the upper ends of the engagement part 313 fit into upwardly opening recesses that are formed in the lower ends of the engagement parts 513. The opposing-member flange part 516 of the top plate 51 is spaced above from the first flange supporter 532 and the second flange supporter 534 of the opposing-member holder 53. Thus, the top plate 51 located at the second position is held by the substrate holder 31 and spaced from the opposing-member holder 53 (i.e., not in contact with the opposing-member holder 53). When the substrate rotation mechanism 33 is driven with the top plate 51 located at the second position, the top plate 51 rotates along with the substrate holder 31.

The opposing-member holder 53 is horizontally movable in the state where the top plate 51 is located at the second position, i.e., where the opposing-member flange part 516 is spaced above from the first flange supporter 532 and the second flange supporter 534. The opposing-member-holder moving mechanism 57 horizontally moves the opposing-member holder 53 that is horizontally movable. As illustrated in FIG. 25, the opposing-member holder 53 is moved in the state where the first processing liquid nozzle 411 and the second processing liquid nozzle 421 are located at their retracted positions. The opposing-member holder 53 is horizontally moved by the opposing-member-holder moving mechanism 57 horizontally rotating the holder body 531.

The opposing-member-holder moving mechanism 57 moves the opposing-member holder 53 between the position above the top plate 51, indicated by the solid line in FIG. 24, and a position over the opposing-member storage part 81 in a plan view, indicated by the dashed double-dotted line. In the following description, the position of the opposing-member holder 53 in a plan view, indicated by the solid line in FIG. 24, is referred to as a "holding position." Also, the position of the opposing-member holder 53 in a plan view, indicated by the dashed double-dotted line in FIG. 24, is referred to as an "replacement position."

Figure 29:
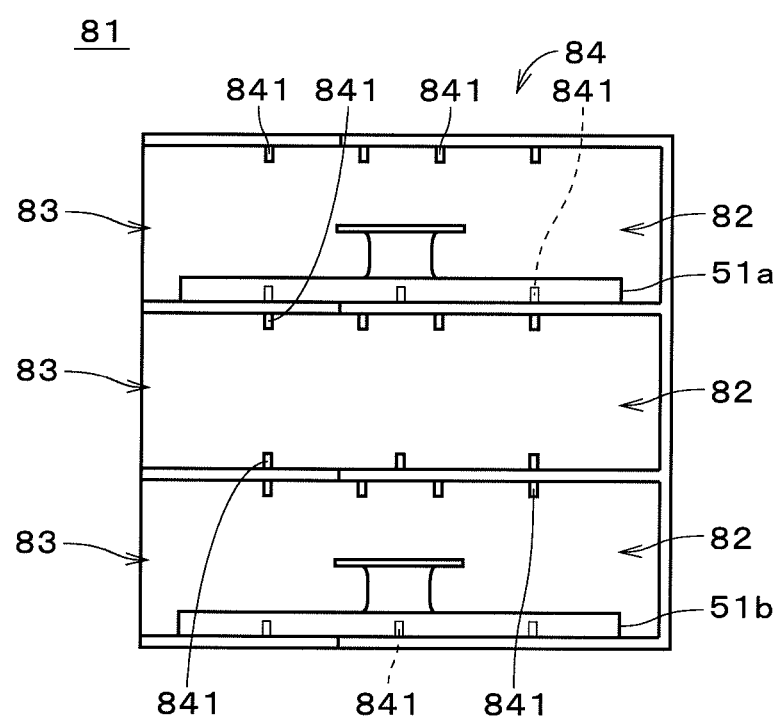
FIG. 29 is a side view of an opposing-member storage part.

In the substrate processing apparatus 1, the opposing-member holder 53, the opposing-member elevating mechanism 55, and the opposing-member-holder moving mechanism 57 enable replacement of the top plate 51 with another top plate stored in the opposing-member storage part 81 illustrated in FIG. 24. FIG. 29 is a side view of the opposing-member storage part 81. The opposing-member storage part 81 is a box-like member of a generally rectangular parallelepiped shape that is able to store a plurality of top plates. Two side surfaces of the opposing-member storage part 81 are closed by side walls, and the other two side surfaces are open. The open side surfaces of the opposing-member storage part 81 allow comings and goings of top plates and the opposing-member holder 53.

The opposing-member storage part 81 includes a plurality of storage parts 82 that are stacked on top of one another in the up-down direction. Each storage part 82 is able to store a single top plate. In the example in FIG. 29, three storage parts 82 are stacked on top of one another in the up-down direction. The topmost storage part 82 stores a top plate 51a, and the bottommost storage part 82 stores a top plate 51b. When the top plate 51 illustrated in FIG. 28 is stored in the opposing-member storage part 81, the top plate 51 is stored in the middle storage part 82. In the following description, when there is no particular need to distinguish among the top plates 51, 51a, and 51b, the top plates 51, 51a, and 51b may be collectively referred to as "top plates," or one or two of the top plates 51, 51a, and 51b may be simply referred to as (a) "top plate(s)."

A top plate is conveyed into or out of each storage part 82 through a storage opening 83 that is formed in one side surface of the storage part 82. The substrate processing apparatus 1 further includes an opposing-member cleaning mechanism 84 for cleaning a top plate stored in each storage parts 82. The opposing-member cleaning mechanism 84 includes a plurality of cleaning nozzles 841. The cleaning nozzles 841 are provided on the upper and lower surfaces of each storage part 82 and supply a cleaning liquid such as deionized water to top plates to clean the top plates. In each storage part 82, such a cleaned top plate may also be dried, for example. Each storage part 82 may, for example, be provided with a shutter that closes the storage opening 83, and the storage opening 83 may be closed during cleaning and drying of the top plate.

The top plates 51, 51a, and 51b are of different types. The type of a top plate refers to, for example, the shape, material, or structure of the top plate. In the present embodiment, the shape of the top plate 51a is different from the shape of the top plate 51, as will be described later. One example of the case where top plates differ in material is a case where the lower surface of one top plate is made of water repellent Teflon (registered trademark), and the lower surface of another top plate is made of a hydrophilic material. Using a top plate having a hydrophilic lower surface ensures a liquid-tight state between the top plate and the substrate 9 during the processing of the substrate 9. One example of the case where top plates differ in structure is a case where one top plate is made of Teflon, and another top plate has a structure in which a metal core is embedded in Teflon. Using a highly rigid top plate with a metal core embedded therein reduces the possibility of deformation of the top plate, for example when the substrate 9 is heated during processing. Note that, in the substrate processing apparatus 1, the opposing-member storage part 81 may store top plates of the same type as the top plate 51 located above the substrate 9.

Figure 30:
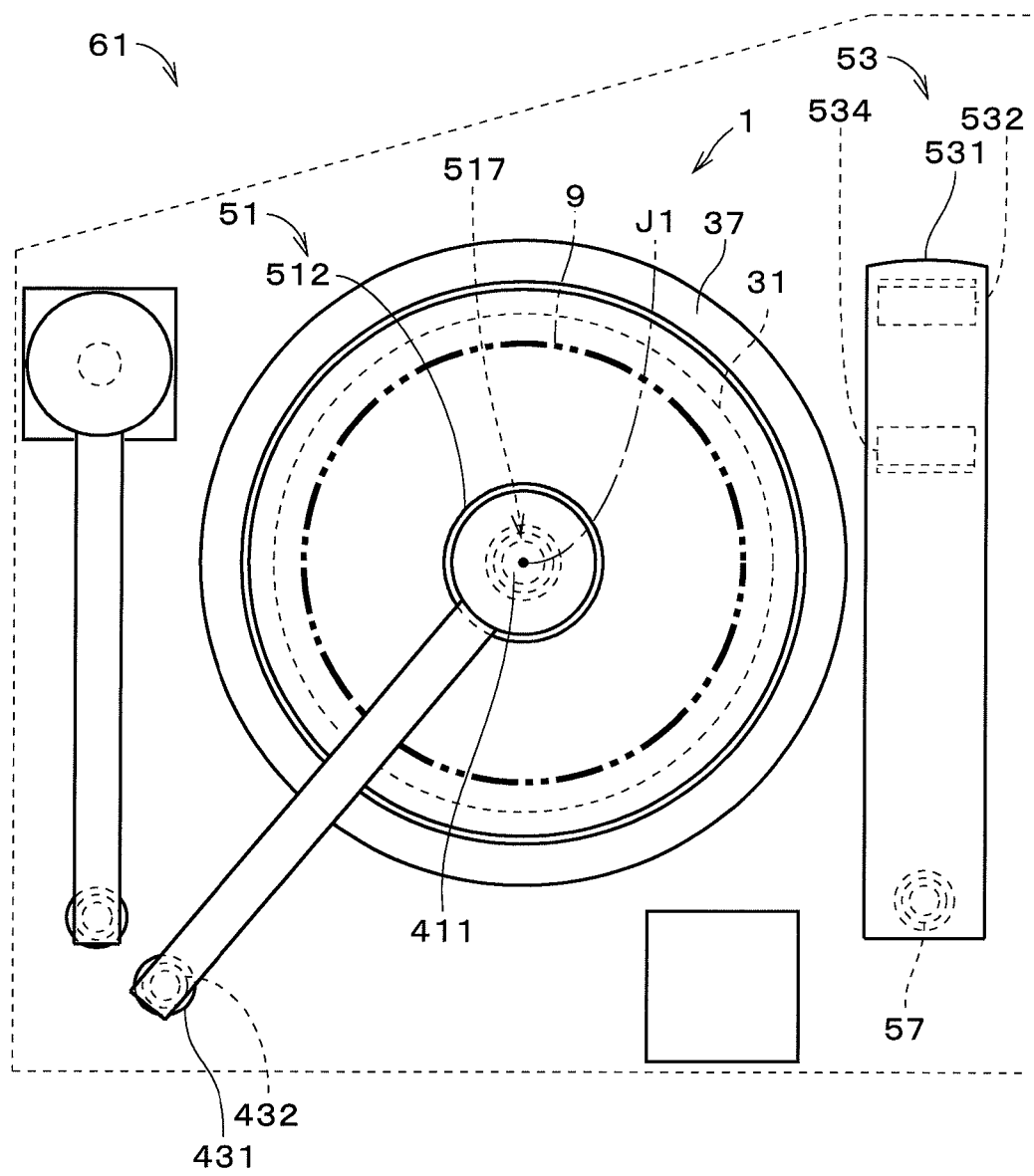
FIG. 30 is a plan view of part of the processing unit.

FIG. 30 is a plan view of part of the processing unit 61. The opposing-member holder 53 is located at its retracted position, which is located in between the holding position and the replacement position described above. The retracted position of the opposing-member holder 53 is a position around the top plate 51, i.e., a position other than positions above the top plate 51, in a plan view. In the substrate processing apparatus 1, the first flange supporter 532 and the second flange supporter 534 are horizontally moved by the opposing-member-holder moving mechanism 57 horizontally rotating the holder body 531 with the top plate 51 located at the second position (see FIG. 28).

As a result, the first flange supporter 532 and the second flange supporter 534 of the opposing-member holder 53 located at the holding position in FIG. 25 are spaced radially outward from the opposing-member flange part 516 and the flange connector 515. At this time, the flange connector 515 is separated on one side in the direction along the first flange supporter 532 and the second flange supporter 534 from between the first flange supporter 532 and the second flange supporter 534. Specifically, the flange connector 515 is separated on the left side in the width direction perpendicular to the longitudinal direction of the holder body 531 in FIG. 25 when the tip end of the opposing-member holder 53 is viewed from the base side. Then, the opposing-member holder 53 is moved to the retracted position illustrated in FIG. 30.

Also, in the substrate processing apparatus 1, the opposing-member holder 53 is horizontally rotated by the opposing-member-holder moving mechanism 57, and accordingly, the first flange supporter 532 and the second flange supporter 534 of the opposing-member holder 53 located at the retracted position are moved to the holding position illustrated in FIG. 25 and disposed below the opposing-member flange part 516.

Figure 31:
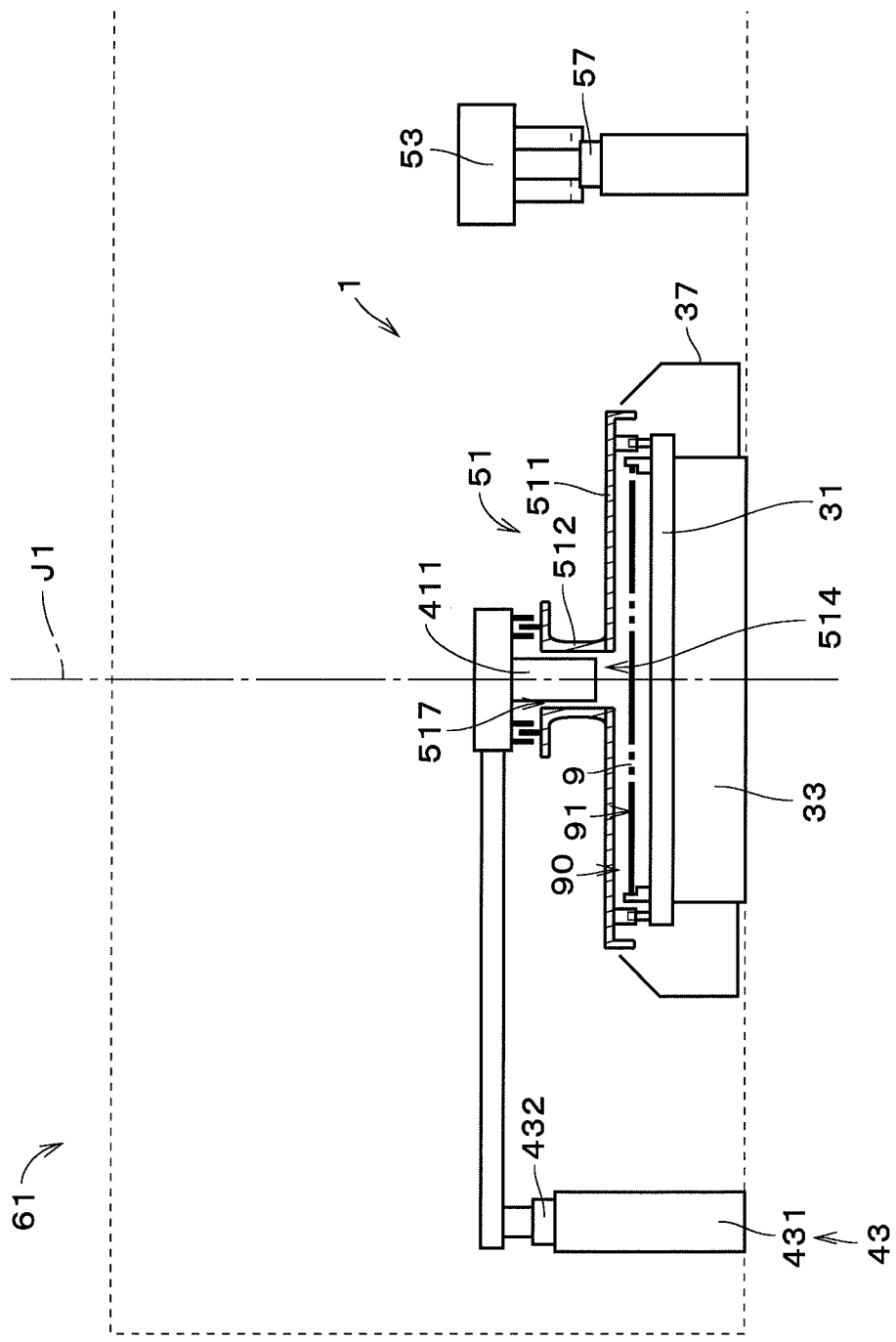
FIG. 31 is a cross-sectional view of part of the processing unit.

FIG. 31 is a cross-sectional view of part of the processing unit 61. FIG. 31 illustrates a state in which the top plate 51 located at the second position is held by the substrate holder 31. The opposing-member holder 53 has been moved from the holding position to the retracted position by the opposing-member-holder moving mechanism 57. As illustrated in FIGS. 30 and 31, with the opposing-member holder 53 retracted, the first processing liquid nozzle 411 is moved from its retracted position and inserted through the upper opening 517 of the to-be-held part 512 of the top plate 51 into the to-be-held part 512 by the first nozzle elevating mechanism 431 and the first nozzle rotation mechanism 432. The first processing liquid nozzle 411 is thus located inside the to-be-held part 512. In other words, the outer surface of the first processing liquid nozzle 411 radially opposes the inner surface of the to-be-held part 512. In the following description, the position of the first processing liquid nozzle 411 in FIG. 31 is referred to as a "supply position" (the same applies to the second processing liquid nozzle 421). In the example in FIG. 31, the end (i.e., lower end) of the first processing liquid nozzle 411 located at the supply position is located above the lower edge of the opposing-member opening 514 of the opposing-member body 511. Alternatively, the end of the first processing liquid nozzle 411 may be located at the same position as the lower edge of the opposing-member opening 514 in the up-down direction.

Figure 32:
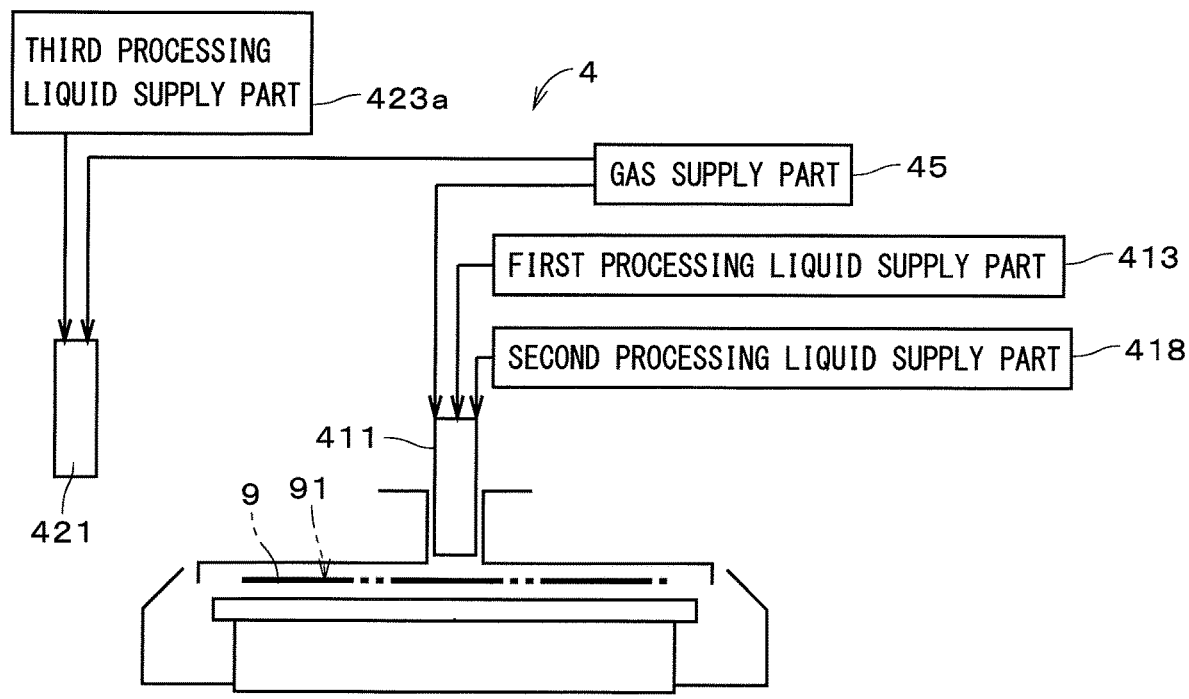
FIG. 32 is a block diagram of the gas-liquid supply part.

FIG. 32 is a block diagram of the gas-liquid supply part 4, related to the supply of gases and processing liquids in the substrate processing apparatus 1. The gas-liquid supply part 4 includes the first processing liquid nozzle 411, the second processing liquid nozzle 421, a first processing liquid supply part 413, a second processing liquid supply part 418, a third processing liquid supply part 423a, and a gas supply part 45.

The first processing liquid supply part 413 and the second processing liquid supply part 418 are connected to the first processing liquid nozzle 411. The first processing liquid supply part 413 supplies a first processing liquid through the first processing liquid nozzle 411 to the upper surface 91 of the substrate 9, with the first processing liquid nozzle 411 located above the substrate 9. The second processing liquid supply part 418 supplies a second processing liquid through the first processing liquid nozzle 411 to the upper surface 91 of the substrate 9, with the first processing liquid nozzle 411 located above the substrate 9. The first processing liquid nozzle 411 selectively supplies one of the first processing liquid and the second processing liquid to the substrate 9. For example, the first processing liquid nozzle 411 supplies the first processing liquid to the substrate 9 and then supplies the second processing liquid to the substrate 9.

The third processing liquid supply part 423a is connected to the second processing liquid nozzle 421. As will be described later, the third processing liquid supply part 423a supplies a third processing liquid through the second processing liquid nozzle 421 to the upper surface 91 of the substrate 9, with the second processing liquid nozzle 421 located above the substrate 9. The gas supply part 45 is connected to the first processing liquid nozzle 411 and the second processing liquid nozzle 421 and supplies gases to the first processing liquid nozzle 411 and the second processing liquid nozzle 421.

In the substrate processing apparatus 1, various types of liquids are used as the first processing liquid, the second processing liquid, and the third processing liquid. The first processing liquid may, for example, be a chemical solution for use in chemical processing of the substrate 9 (e.g., a polymer removing liquid or an etchant such as an aqueous solution of hydrofluoric acid or tetramethylammonium hydroxide (TMAH)). The second processing liquid may, for example, be a cleaning liquid for use in cleaning the substrate 9, such as deionized water (DIW) or carbonated water. The third processing liquid may, for example, be isopropyl alcohol (IPA) that is supplied as a substitute for the liquid on the substrate 9. The gas supplied from the gas supply part 45 may, for example, be an inert gas such as a nitrogen gas ($N_2$). The gas supply part 45 may also supply various gases other than inert gases.

When the first processing liquid is supplied from the first processing liquid nozzle 411 illustrated in FIG. 31, the first processing liquid from the first processing liquid supply part 413 is ejected from an ejection port of the lower end surface of the first processing liquid nozzle 411 through the opposing-member opening 514 toward the upper surface 91 of the substrate 9. When the second processing liquid is supplied from the first processing liquid nozzle 411, the second processing liquid from the second processing liquid supply part 418 is ejected from another ejection port of the lower end surface of the first processing liquid nozzle 411 through the opposing-member opening 514 toward the upper surface 91 of the substrate 9. The inert gas supplied from the gas supply part 45 is, for example, supplied from a jet opening of the lower end surface of the first processing liquid nozzle 411 through the opposing-member opening 514 to a space 90 (hereinafter, referred to as a "processing space 90") between the top plate 51 and the substrate 9.

Figure 33:
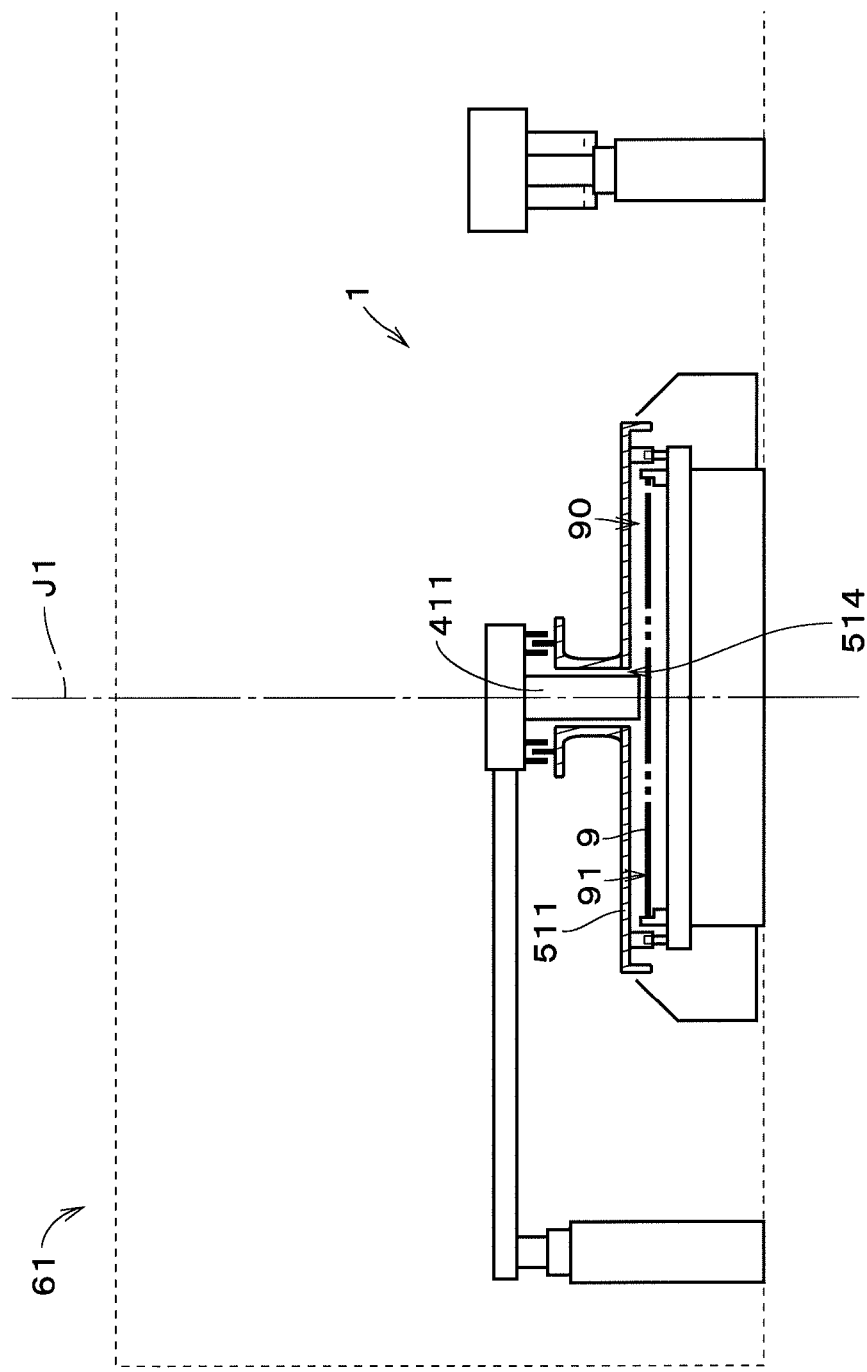
FIG. 33 is a cross-sectional view of part of the processing unit.

In the substrate processing apparatus 1, the first processing liquid nozzle 411 may protrude downward from the opposing-member opening 514 of the opposing-member body 511 as illustrated in FIG. 33. In other words, the end of the first processing liquid nozzle 411 may be located below the lower edge of the opposing-member opening 514. The inert gas supplied from the gas supply part 45 flows down in the first processing liquid nozzle 411 through the opposing-member opening 514 and is supplied from the lower end surface of the first processing liquid nozzle 411 to the processing space 90. The first processing liquid supplied from the first processing liquid supply part 413 and the second processing liquid supplied from the second processing liquid supply part 418 flow down in the first processing liquid nozzle 411 through the opposing-member opening 514 and are ejected from the lower end surface of the first processing liquid nozzle 411 toward the upper surface 91 of the substrate 9.

In the following description, the supply of the first processing liquid or the second processing liquid through the opposing-member opening 514 refers not only to a state where the first processing liquid or the second processing liquid that is ejected from the first processing liquid nozzle 411 above the opposing-member opening 514 passes through the opposing-member opening 514, but also to a state where the first processing liquid or the second processing liquid is ejected through the first processing liquid nozzle 411 that is inserted in the opposing-member opening 514 as illustrated in FIG. 33. The same applies to the case of the second processing liquid nozzle 421 and the third processing liquid, which will be described later.

Figure 34:
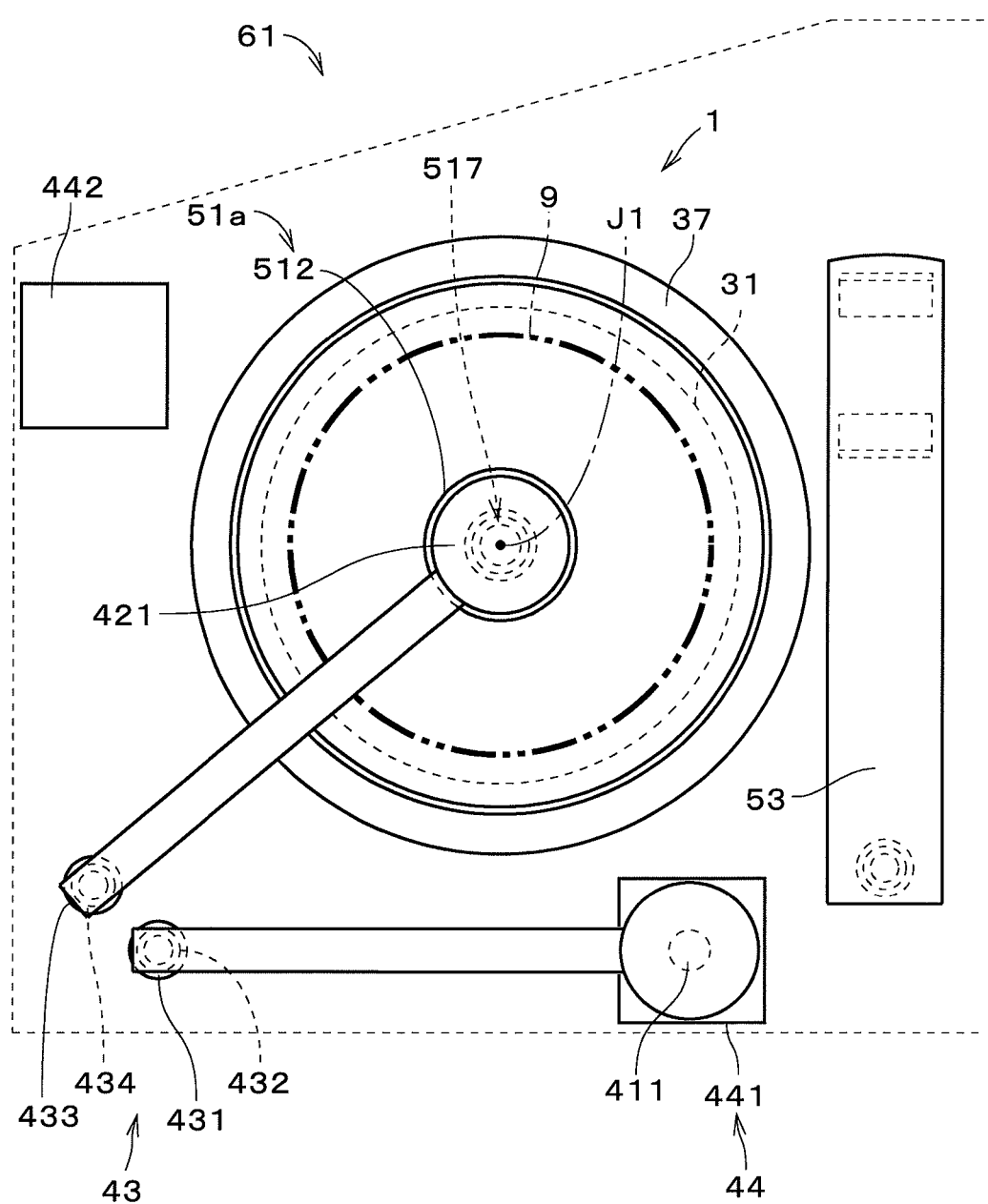
FIG. 34 is a plan view of part of the processing unit.

FIG. 34 is a plan view of part of the processing unit 61. In FIG. 34, the first processing liquid nozzle 411 is moved from the supply position above the top plate 51 illustrated in FIG. 30 by the first nozzle elevating mechanism 431 and the first nozzle rotation mechanism 432 and located at its retracted position, which is located around and spaced from above the top plate 51 as illustrated in FIG. 34. The second processing liquid nozzle 421 is moved from its retracted position around the top plate 51 in FIG. 30 by the second nozzle elevating mechanism 433 and the second nozzle rotation mechanism 434 and located at the supply position above the top plate 51 in FIG. 34. Our concepts regarding the retracted positions of the first processing liquid nozzle 411 and the second processing liquid nozzle 421 include a space (i.e., evacuation space) with a certain degree of spread that allows the first processing liquid nozzle 411 and the second processing liquid nozzle 421 to oscillate at their retracted positions.

Similarly to the first processing liquid nozzle 411 illustrated in FIG. 31, the second processing liquid nozzle 421 that is located at the above supply position is inserted into the to-be-held part 512 through the upper opening 517 of the to-be-held part 512 of the top plate 51. The end (i.e., lower end) of the second processing liquid nozzle 421 located at the supply position is located above the lower edge of the opposing-member opening 514 of the opposing-member body 511, similarly to the first processing liquid nozzle 411 illustrated in FIG. 31. Alternatively, the end of the second processing liquid nozzle 421 may be located at the same position as the lower edge of the opposing-member opening 514 in the up-down direction.

The supply position of the first processing liquid nozzle 411 and the second processing liquid nozzle 421 in FIGS. 31 and 34 is specifically a position above the opposing-member opening 514 of the top plate 51. The retracted positions of the first processing liquid nozzle 411 and the second processing liquid nozzle 421 are positions around the substrate holder 31. The nozzle moving mechanism 43 individually moves the first processing liquid nozzle 411 and the second processing liquid nozzle 421 between the supply position and their respective retracted positions.

As illustrated in FIG. 34, the nozzle cleaning part 44 includes a first cleaning part 441 and a second cleaning part 442. The first cleaning part 441 is provided in the vicinity of the retracted position of the first processing liquid nozzle 411. The first cleaning part 441 cleans the first processing liquid nozzle 411 located at the retracted position. The first cleaning part 441 cleans the first processing liquid nozzle 411 by, for example, supplying a cleaning liquid such as deionized water toward the first processing liquid nozzle 411. The second cleaning part 442 is provided in the vicinity of the retracted position of the second processing liquid nozzle 421. The second cleaning part 442 cleans the second processing liquid nozzle 421 located at the retracted position in FIG. 25. The second cleaning part 442 cleans the second processing liquid nozzle 421 by, for example, supplying a cleaning liquid such as deionized water toward the second processing liquid nozzle 421. For example, the first cleaning part 441 and the second cleaning part 442 may also dry the cleaned first processing liquid nozzle 411 and the cleaned second processing liquid nozzle 421. When cleaning or drying the first processing liquid nozzle 411 and the second processing liquid nozzle 421, the first processing liquid nozzle 411 and the second processing liquid nozzle 421 may oscillate at their retracted positions (i.e., in the evacuation space).

Next, an exemplary procedure of processing performed on the substrate 9 by the substrate processing apparatus 1 will be described with reference to FIGS. 35A, 35B, and 35C. First, with the top plate 51 located at the first position in FIG. 26, the substrate 9 is conveyed into the housing 11 and held by the substrate holder 31 (step S51). At this time, the top plate 51 is held by the opposing-member holder 53, and the first processing liquid nozzle 411 and the second processing liquid nozzle 421 are located at their retracted positions.

Next, the controller 21 (see FIG. 24) controls the opposing-member elevating mechanism 55 to move the opposing-member holder 53 down. Thus, the top plate 51 is moved down from the first position to the second position and held by the substrate holder 31 as illustrated in FIG. 28 (step S52).

In step S52, the first flange supporter 532 and the second flange supporter 534 of the opposing-member holder 53 are spaced below from the opposing-member flange part 516 of the top plate 51. In this state, the controller 21 controls the opposing-member-holder moving mechanism 57 to horizontally rotate the opposing-member holder 53. Thus, the opposing-member holder 53 is retracted from the holding position above the top plate 51 and moved to the aforementioned retracted position (step S53).

Then, with the opposing-member holder 53 located at its retracted position, the controller 21 controls the first nozzle elevating mechanism 431 and the first nozzle rotation mechanism 432 to move the first processing liquid nozzle 411 from its retracted position to the supply position (step S54). The first processing liquid nozzle 411 is inserted through the upper opening 517 of the to-be-held part 512 of the top plate 51 and located inside the to-be-held part 512 as illustrated in FIGS. 30 and 31. When the first processing liquid nozzle 411 is located at the supply position, the controller 21 controls the gas supply part 45 to supply an inert gas from the lower end surface of the first processing liquid nozzle 411 to the processing space 90.

The controller 21 also controls the substrate rotation mechanism 33 to start rotation of the substrate holder 31, the substrate 9, and the top plate 51 (step S55). The inert gas continues to be supplied from the first processing liquid nozzle 411 after step S55 onward. Note that the rotation of the top plate 51 and other constituent elements may be started (step S55) before the first processing liquid nozzle 411 is moved to the supply position (step S54). For example, step S55 may be performed between steps S52 and S53. In this case, in step S53, the opposing-member holder 53 is moved away from the rotating top plate 51 to its retracted position.

Then, with the first processing liquid nozzle 411 located at the supply position, the first processing liquid supply part 413 supplies the first processing liquid from the first processing liquid nozzle 411 through the opposing-member opening 514 of the top plate 51 located at the second position to the central part of the upper surface 91 of the substrate 9 that is being rotated (step S56). The first processing liquid supplied from the first processing liquid nozzle 411 located at the supply position to the central part of the substrate 9 is spread radially outward from the central part of the substrate 9 over the entire upper surface 91 of the substrate 9 by the rotation of the substrate 9. The first processing liquid is dispersed radially outward from the outer edge of the substrate 9 and received by the cup part 37.

The first processing liquid is supplied for a predetermined period of time, and the processing of the substrate 9 using the first processing liquid ends.

The first processing liquid may, for example, be a chemical solution such as a polymer removing liquid or an etchant, and in step S56, chemical processing is performed on the substrate 9. Note that the first processing liquid may be supplied (step S56) before the rotation of the substrate 9 is started (step S55). In this case, a puddle of the first processing liquid is formed on the entire upper surface 91 of the substrate 9, and puddling using the first processing liquid is performed.

After the processing of the substrate 9 using the first processing liquid has ended, the second processing liquid is supplied from the first processing liquid nozzle 411 through the opposing-member opening 514 of the top plate 51 located at the second position to the central part of the upper surface 91 of the substrate 9 that is being rotated (step S57). The second processing liquid supplied to the central part of the substrate 9 is spread radially outward from the central part of the substrate 9 over the entire upper surface 91 of the substrate 9 by the rotation of the substrate 9. The second processing liquid is dispersed radially outward from the outer edge of the substrate 9 and received by the cup part 37. The second processing liquid is supplied for a predetermined period of time, and the processing of the substrate 9 using the second processing liquid ends. The second processing liquid may, for example, be a cleaning liquid such as deionized water or carbonated water, and in step S57, cleaning processing is performed on the substrate 9. In step S57, puddling using the second processing liquid may also be performed.

After the processing of the substrate 9 using the second processing liquid has ended, the supply of the second processing liquid from the first processing liquid nozzle 411 is stopped. Then, the rotation of the substrate holder 31, the substrate 9, and the top plate 51 is stopped (step S58). In step S58, the supply of the inert gas from the first processing liquid nozzle 411 is also stopped. After the rotation is stopped, approximately the entire upper surface 91 of the substrate 9 is covered with a liquid film of the second processing liquid. Then, the first processing liquid nozzle 411 is moved from the supply position to its retracted position by the first nozzle elevating mechanism 431 and the first nozzle rotation mechanism 432 (step S59). The first processing liquid nozzle 411 located at its retracted position is cleaned by the first cleaning part 441.

Next, top plates are replaced. First, the controller 21 (see FIG. 24) determines the type of another top plate to be used next, according to the properties of processing to be performed after the replacement of the top plates by the substrate processing apparatus 1 (step S60). In the present embodiment, processing to be performed after the replacement of the top plates is dry processing for drying the substrate 9, as will be described later. Thus, the top plate 51 for chemical and cleaning processing is replaced with a top plate 51a (see FIG. 29) for dry processing.

In the case of replacing the top plate 51 with the top plate 51a, the opposing-member holder 53 located at its retracted position is moved to the holding position by the opposing-member elevating mechanism 55 and the opposing-member-holder moving mechanism 57 (step S61). The opposing-member holder 53 is then moved up, and thereby the top plate 51 is held by the opposing-member holder 53 and moved to the first position above the substrate 9 and the substrate holder 31 as illustrated in FIG. 26 (step S62).

Then, the opposing-member holder 53 is rotated clockwise in FIG. 24 by the opposing-member-holder moving mechanism 57 and moved from the holding position to the replacement position. The top plate 51 is thereby conveyed away from above the substrate 9 and the substrate holder 31 through the storage opening 83 into the middle storage part 82 of the opposing-member storage part 81 illustrated in FIG. 29 (step S63). The tip end of the holder body 531 located at the replacement position is located inside the storage part 82. In the substrate processing apparatus 1, the mobility limiting part 58 illustrated in FIG. 27 limits a positional shift (i.e., movement and rotation of the top plate 51 relative to the opposing-member holder 53) of the top plate 51 that is being conveyed by the opposing-member-holder moving mechanism 57 of the aforementioned opposing-member conveying mechanism.

When the top plate 51 has been conveyed into the storage part 82, the opposing-member holder 53 is moved down by the opposing-member elevating mechanism 55, and thereby the top plate 51 is placed on the lower surface of the storage part 82, and the first flange supporter 532 and the second flange supporter 534 of the opposing-member holder 53 are spaced below from the opposing-member flange part 516 of the top plate 51.

Thereafter, the opposing-member holder 53 is rotated counterclockwise in FIG. 24 and retracted from the middle storage part 82. At this time, the flange connector 515 of the top plate 51 is separated on the other side in the direction along the first flange supporter 532 and the second flange supporter 534 from between the first flange supporter 532 and the second flange supporter 534. Specifically, the flange connector 515 is separated on the right side in the width direction of the holder body 531 in FIG. 24 when the tip end of the opposing-member holder 53 is viewed from the base side. In the substrate processing apparatus 1, the flange connector 515 is separated on either side in the direction along the first flange supporter 532 and the second flange supporter 534 from between the first flange supporter 532 and the second flange supporter 534. In the opposing-member storage part 81, as illustrated in FIG. 29, the opposing-member cleaning mechanism 84 cleans the top plate 51 housed in the central storage part 82 (step S64).

Next, the opposing-member holder 53 is moved up and disposed beside the topmost storage part 82 and enters the storage part 82 through the storage opening 83 by clockwise rotation in FIG. 24. The first flange supporter 532 and the second flange supporter 534 are located below the opposing-member flange part 516 of the next top plate 51a. The opposing-member holder 53 is then moved up to bring the first flange supporter 532 and the second flange supporter 534 into contact with the opposing-member flange part 516, and thereby the top plate 51a is held by the opposing-member holder 53.

The opposing-member holder 53 is then rotated counterclockwise in FIG. 24 by the opposing-member-holder moving mechanism 57 and moved from the replacement position to the holding position. Along with this, the top plate 51a stored in the opposing-member storage part 81 is conveyed out into the first position above the substrate 9 and the substrate holder 31 (step S65). In the substrate processing apparatus 1, the mobility limiting part 58 (see FIG. 27) limits a positional shift (i.e., movement and rotation of the top plate 51a relative to the opposing-member holder 53) of the top plate 51a that is being conveyed by the opposing-member-holder moving mechanism 57. The opposing-member-holder moving mechanism 57 conveys the top plate between the opposing-member storage part 81 and the position above the substrate 9 and the substrate holder 31. Note that the determination of the type of the next top plate in step S60 described above only needs to be performed before the top plate 51*a* is conveyed out (step S65).

The opposing-member holder 53 is then moved down, and the top plate 51*a* is moved from the first position to the second position and held by the substrate holder 31 as illustrated in FIG. 36 (step S66).

The top plate 51*a* has the same configuration as the configuration of the top plate 51 illustrated in FIGS. 26, 28, and 31, with the exception that a downwardly protruding protrusion 521 is provided on the lower surface of the opposing-member body 511. The protrusion 521 has a generally annular plate-like shape centered on the central axis J1. The outer diameter of the protrusion 521 is greater than the diameter of the substrate 9. The protrusion 521 opposes approximately the entire upper surface 91 of the substrate 9 in the up-down direction. The lower surface of the protrusion 521 is spaced above from the upper surface 91 of the substrate 9. Note that portions of the protrusion 521 that oppose the chucks 312 of the substrate holder 31 are upwardly recessed to avoid contact with the chucks 312. The distance in the up-down direction between the lower surface of the protrusion 521 and the upper surface 91 of the substrate 9 is smaller than the distance in the up-down direction between the lower surface of the opposing-member body 511 of the top plate 51 illustrated in FIG. 31 and the upper surface 91 of the substrate 9, throughout approximately the entirety of the upper surface 91 of the substrate 9.

When the top plate 51*a* is located at the second position, the opposing-member holder 53 is horizontally rotated and moved from the holding position above the top plate 51*a* to its retracted position (step S67).

Then, the controller 21 controls the second nozzle elevating mechanism 433 and the second nozzle rotation mechanism 434 to move the second processing liquid nozzle 421 from its retracted position to the supply position (step S68). With the opposing-member holder 53 retracted, the second processing liquid nozzle 421 is inserted through the upper opening 517 of the to-be-held part 512 of the top plate 51 and disposed inside the to-be-held part 512 as illustrated in FIGS. 34 and 35. When the second processing liquid nozzle 421 is disposed at the supply position, the inert gas from the gas supply part 45 is supplied from the lower end surface of the second processing liquid nozzle 421 to the processing space 90. Also, the substrate rotation mechanism 33 starts rotation of the substrate holder 31, the substrate 9, and the top plate 51*a* (step S69). The inert gas continues to be supplied from the second processing liquid nozzle 421 after step S69 onward. During steps S58 to S69, approximately the entire upper surface 91 of the substrate 9 is covered with a liquid film of the second processing liquid. In other words, the upper surface 91 of the substrate 9 is protected by the liquid film. This liquid film prevents the upper surface of the substrate 9 from being exposed to outside air during the replacement of the top plates described above. When there is no particular need to protect the upper surface 91 of the substrate 9 by such a liquid film, the supply of an inert gas from the first processing liquid nozzle 411 is unnecessary.

Then, the controller 21 controls the second processing liquid supply part 423 to, with the second processing liquid nozzle 421 located at the supply position, supply the third processing liquid from the second processing liquid nozzle 421 through the opposing-member opening 514 of the top plate 51 located at the second position to the central part of the upper surface 91 of the substrate 9 that is being rotated (step S70). The third processing liquid supplied from the second processing liquid nozzle 421 located at the supply position to the central part of the substrate 9 is spread radially outward from the central part of the substrate 9 over the entire upper surface 91 of the substrate 9 by the rotation of the substrate 9. Through this, the second processing liquid (e.g., cleaning liquid such as deionized water) on the upper surface 91 of the substrate 9 is removed from above the substrate 9. The third processing liquid may, for example, be isopropyl alcohol, and in step S70, processing for substituting another processing liquid for the cleaning liquid on the substrate 9 is performed. The third processing liquid is dispersed radially outward from the outer edge of the substrate 9 and received by the cup part 37. The third processing liquid is supplied for a predetermined period of time, and the processing of the substrate 9 using the third processing liquid ends.

When the processing of the substrate 9 using the third processing liquid has ended, the supply of the third processing liquid from the second processing liquid nozzle 421 is stopped. Then, the second processing liquid nozzle 421 is moved from the supply position to its retracted position by the second nozzle elevating mechanism 433 and the second nozzle rotation mechanism 434 (step S71). The second processing liquid nozzle 421 located at the retracted position is cleaned by the second cleaning part 442.

In the substrate processing apparatus 1, the substrate 9 continues to be rotated and processing for drying the substrate 9 is performed (step S72). The rotation speed of the substrate 9 during dry processing is faster than the rotation speed thereof during the processing of the substrate 9 using the third processing liquid in step S69.

Also, the opposing-member holder 53 is horizontally rotated and moved from the retracted position to the holding position by the opposing-member-holder moving mechanism 57 (step S73). At this time, the first flange supporter 532 and the second flange supporter 534 of the opposing-member holder 53 are spaced below from the opposing-member flange part 516 of the top plate 51*a* that is being located at the second position.

Then, the rotation of the substrate holder 31, the substrate 9, and the top plate 51*a* by the substrate rotation mechanism 33 is stopped (step S74). In step S74, the supply of the inert gas from the second processing liquid nozzle 421 is also stopped. Then, the opposing-member holder 53 is moved up by the opposing-member elevating mechanism 55, and thereby the top plate 51*a* is moved up from the second position to the first position (step S75). The top plate 51*a* is spaced above from the substrate holder 31 and held by the opposing-member holder 53.

Then, the controller 21 (see FIG. 24) determines the type of another top plate to be used next, according to the properties of processing to be performed on the next substrate 9 by the substrate processing apparatus 1 (step S76). In the present embodiment, a top plate 51 for chemical and cleaning processing is determined as the next top plate. Then, the opposing-member holder 53 is moved from the holding position to the replacement position. The top plate 51*a* is thereby conveyed out from above the substrate 9 and the substrate holder 31 into the topmost storage part 82 of the opposing-member storage part 81 in FIG. 29 through the storage opening 83 (step S77). A positional shift of the top plate 51*a* during conveyance is limited by the mobility limiting part 58 (see FIG. 27). In the opposing-member storage part 81, the opposing-member cleaning mechanism 84 cleans the top plate 51*a* stored in the topmost storage part 82 (step S78).

In the substrate processing apparatus 1, the next top plate 51 stored in the middle storage part 82 is conveyed out into the first position above the substrate 9 and the substrate holder 31 by the opposing-member holder 53a (step S79). A positional shift of the top plate 51 during conveyance is limited by the mobility limiting part 58. In parallel with the replacement of the top plates in steps S76 to S79, the substrate 9 is conveyed out of the housing 11 (step S80). Preferably, step S80 may be performed in parallel with step S77. Step S80 may also be performed after steps S76 to S79, or may be performed before steps S76 to S79.

As described above, the processing of the substrate 9 using the first processing liquid and the second processing liquid is performed when the top plate 51 is located at the second position, and the processing of the substrate 9 using the third processing liquid is performed when the top plate 51a is located at the second position. Thus, the above second position may also be regarded as a "processing position."

The substrate processing apparatus 1 sequentially performs the above-described steps S51 to S80 on a plurality of substrates 9 to process the substrates 9. In the substrate processing apparatus 1, the cleaning of the top plate 51a in step S78 is performed after completion of step S77 and before step S65 is performed on the next substrate 9 (i.e., conveyance of the top plate 51a out of the storage part). Also, the cleaning of the top plate 51 in step S64 is performed after completion of step S63 and before step S79 (i.e., conveyance of the top plate 51 out of the storage part).

As described above, in the substrate processing apparatus 1, the opposing-member-holder moving mechanism 57 conveys a top plate from the position above the substrate 9 and the substrate holder 31 into the opposing-member storage part 81 and conveys out another top plate stored in the opposing-member storage part 81 into the position above the substrate 9 and the substrate holder 31. Thus, the replacement and use of top plates are implemented with a single substrate processing apparatus 1.

In the substrate processing apparatus 1, the top plate and the other top plate (i.e., the top plates 51 and 51a) are of different types. Thus, top plates that are respectively suited for a plurality of types of processing are usable in a single substrate processing apparatus 1 during the processing of the substrate 9.

The substrate processing apparatus 1 allows a desired gaseous atmosphere to be created in the processing space 90 between the top plate and the substrate 9 by supplying a gas to the processing space 90 and thereby allows the substrate 9 to be processed in that gaseous atmosphere, irrespective of the type of a top plate to be used. For example, when an inert gas is supplied to the processing space 90, the substrate 9 is processed in an inert gas atmosphere (i.e., a low oxygen atmosphere).

In the above-described example, the top plate 51 illustrated in FIG. 31 is used during chemical and cleaning processing performed on the substrate 9, and the top plate 51a illustrated in FIG. 36 is used during replacement and dry processing performed on the substrate 9. In the case of using the top plate 51, since the distance between the upper surface 91 of the substrate 9 and the lower surface of the opposing-member body 511 is relatively large, the possibility of adhesion of a chemical solution or a cleaning liquid to the lower surface of the opposing-member body 511 is reduced. This consequently reduces the possibility that particles or the like generated from a chemical solution or a cleaning liquid adhering to and dried on the opposing-member body 511 will adhere to the substrate 9.

In the case of using the top plate 51a, the distance between the upper surface 91 of the substrate 9 and the lower surface of the protrusion 521 of the top plate 51a is relatively small, and the time required to dry the substrate 9 is shortened. This consequently reduces the possibility that a watermark will be formed on the upper surface 91 of the substrate 9. When the substrate 9 has a pattern on the upper surface 91, the amount of time that surface tension produced by the processing liquid remaining in the pattern will act on the pattern, and therefore, the possibility of pattern destruction or the like is reduced.

Note that the top plate 51 may be used during the replacement processing using the third processing liquid in step S70. In this case, after the cleaning processing using the second processing liquid (step S57) has ended, the first processing liquid nozzle 411 is moved to its retracted position without stopping the rotation of the top plate 51 and the substrate 9 (step S59). Then, the second processing liquid nozzle 421 is moved to the supply position (step S68), and the third processing liquid is supplied from the second processing liquid nozzle 421 to the substrate 9 (step S70). Thereafter, steps S58, S60 to S67, S69, and S71 to S80 are performed sequentially.

In the above-described example, the difference between the top plate 51 and the top plate 51a is mainly a difference in the distance to the upper surface 91 of the substrate 9 due to different shapes, but the top plate 51 and the top plate 51a may have approximately the same shape. For example, the top plate 51 may have a hydrophilic lower surface, and the top plate 51a may have a water-repellent lower surface. This reduces the possibility that the processing liquid adhering to the lower surface of the top plate 51 will drop on the substrate 9 during processing using the first processing liquid and the second processing liquid. In this case, adhesion of the processing liquid to the lower surface of the top plate 51a during dry processing is also reduced. Thus, the processing liquid is quickly removable from the space between the top plate 51a and the substrate. This configuration shortens the time required for dry processing.

For example, when a relatively high-temperature processing liquid (e.g., SPM liquid) is used as the first processing liquid, the top plate 51 may be a highly rigid top plate with a metal core embedded therein to reduce the possibility of thermal deformation. In this case, a lightweight top plate having no metal core is preferably used as the top plate 51a. This configuration facilitates high-speed rotation during dry processing.

As described above, the determination of the type of the next top plate in step S60 is conducted before step S65 in accordance with the properties of processing to be performed by the substrate processing apparatus 1 after the top plate M a is conveyed out of the opposing-member storage part 81 in step S65 (i.e. in accordance with the processing to be performed in steps S69 to S74). Similarly, the determination of the type of the next top plate in step S76 is conducted before step S79 in accordance with the properties of processing to be performed by the substrate processing apparatus 1 (i.e., processing to be performed on the next substrate 9) after the top plate 51 is conveyed out of the opposing-member storage part 81 in step S79. Thus, top plates that are respectively suited for a plurality of types of processing to be performed on the substrate 9 are usable in a single substrate processing apparatus 1 during the processing of the substrate 9. The determination of the type of the next top plate in steps S60 and S76 may be conducted by, for example, reading out a predetermined type of top plates from recipes stored in the substrate processing apparatus 1.

The substrate processing apparatus 1 further includes the opposing-member cleaning mechanism 84 for cleaning top plates stored in the opposing-member storage part 81. This cleaning mechanism removes processing liquids or other substances adhering to the top plates and keeps unused top plates clean. The cleaning of top plates may be performed in parallel with the processing of the substrate 9 using another top plate in order to remove processing liquids or other substances adhering to the top plates without reducing the productivity of the substrate processing apparatus 1.

As described above, the opposing-member storage part 81 includes the plurality of storage parts 82 that are stacked on top of one another in the up-down direction and each are able to store a top plate. This configuration reduces the footprint of the substrate processing apparatus 1 as compared with the case where the storage parts 82 are horizontally arranged.

The substrate processing apparatus 1 further includes the mobility limiting part 58 that limits a positional shift of a top plate that is being conveyed by the opposing-member-holder moving mechanism 57. The mobility limiting part prevents a top plate from moving or rotating relative to the opposing-member holder 53 during conveyance. This configuration consequently allows the top plate to be moved to the first position with high positional accuracy and allows the substrate holder 31 to easily hold the top plate.

In the substrate processing apparatus 1, the opposing-member holder 53 includes the first flange supporter 532, the second flange supporter 534 located on the opposite side to the first flange supporter 532 with the flange connector 515 located therebetween, and the holder body 531 on which the first flange supporter 532 and the second flange supporter 534 are mounted. The first flange supporter 532 and the second flange supporter 534 are each in contact with and support part of the opposing-member flange part 516 of a top plate from the underside when the top plate is located at the first position. With the top plate located at the second position, the first flange supporter 532 and the second flange supporter 534 are horizontally moved and either spaced radially outward from the opposing-member flange part 516 or disposed below the opposing-member flange part 516.

Thus, irrespective of whether the top plate located at the second position is in a stationary state or being rotated, the first flange supporter 532 and the second flange supporter 534 are easily movable away from the opposing-member flange part 516 to move the opposing-member holder 53 to the retracted position with a simple configuration. Also, irrespective of whether the top plate is in a stationary state or being rotated, the first flange supporter 532 and the second flange supporter 534 are easily insertable into a position below the opposing-member flange part 516 to move the opposing-member holder 53 to the holding position with a simple configuration. That is, the substrate processing apparatus 1 not only allows a top plate to be held with a simple configuration, but also allows the opposing-member holder 53 to be movable between the holding position and the retracted position (or the replacement position) with a simple configuration, irrespective of the state of the top plate. In this way, in the substrate processing apparatus 1, the opposing-member holder 53 are movable between the holding position and the retracted position (or replacement position) during the rotation of the top plate 51 and other constituent elements. This configuration shortens the time required for the processing of the substrate 9.

In the substrate processing apparatus 1, the flange connector 515 is separable on either side in the direction along the first flange supporter 532 and the second flange supporter 534 from between the first flange supporter 532 and the second flange supporter 534. Thus, the opposing-member holder 53 located at the holding position is retractable from the position above the top plate located above the substrate 9 by clockwise rotation in FIG. 24 toward the replacement position. Also, the opposing-member holder 53 located at the replacement position is retractable from the position above a top plate disposed in the opposing-member storage part 81 by counterclockwise rotation in FIG. 24 toward the holding position. Consequently, the substrate processing apparatus 1 allows a top plate to be easily conveyed into the opposing-member storage part 81 and to be easily conveyed out of the opposing-member storage part 81 and disposed above the substrate 9.

In the substrate processing system 10, the substrate processing apparatus 1 including the opposing-member storage part 81 is housed in the housing 11 of each of the processing units 61. This configuration enables the replacement of top plates during processing of a single substrate 9, without opening the housing 11.

In the substrate processing apparatus 1, the opposing-member storage part 81 does not necessarily have to store a plurality of types of top plates to be used in processing a single substrate 9. For example, the opposing-member storage part 81 may store top plates that are suited to different processing from the above-described series of processing to be performed on the substrate 9 (i.e., chemical processing, cleaning processing, replacement processing, and dry processing). In this case, when the type of a series of processing to be performed by the substrate processing apparatus 1 on a substrate 9 is changed, a top plate on the substrate holder 31 is replaced with a top plate that is suited to the next processing. This allows the substrate processing apparatus 1 to be switchable among configurations that are suited to a plurality of types of a series of processing to be performed on the substrate 9 (i.e., a plurality of processing recipes). Consequently, the substrate processing apparatus 1 is usable for various types of processing to be performed on the substrate 9.

In the substrate processing apparatus 1, the top plate disposed above the substrate 9 and the top plates stored in the opposing-member storage part 81 do not necessarily have to be of different types. For example, the opposing-member storage part 81 may store top plates 51 of the same type as the top plate 51 disposed above the substrate 9. In this case, for example, when the cleaning of the top plate 51 disposed above the substrate 9 becomes necessary due to processing liquids or other substances adhering thereto (i.e., when the maintenance of the top plate 51 becomes necessary), the top plate 51 is replaced with another top plate 51 stored in the opposing-member storage part 81. The top plates 51 may be replaced, for example, during processing of a single substrate 9, or may be replaced after a processed substrate 9 is conveyed out of the housing 11 and before the next substrate 9 is conveyed into the housing 11.

Figure 38:
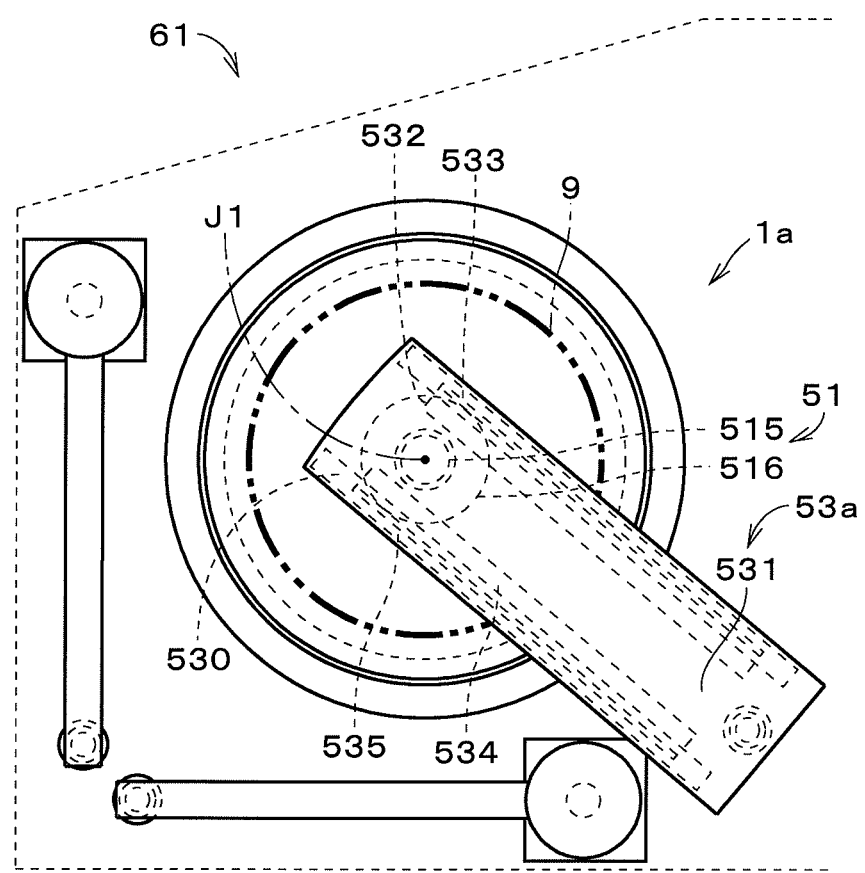
FIG. 38 is a plan view of part of the processing unit.

FIG. 37 is a plan view illustrating the interior of a processing unit 61 that includes a substrate processing apparatus 1a according to a fifth embodiment of the present invention. FIG. 38 is an enlarged plan view of part of the processing unit 61 illustrated in FIG. 37. The substrate processing apparatus 1a includes, instead of the opposing-member holder 53 in FIG. 25, an opposing-member holder 53a that differs from the opposing-member holder 53 in the orientations of the first flange supporter 532 and the second flange supporter 534. The opposing-member holder 53a also includes a supporter moving mechanism 530. In the substrate processing apparatus 1a, an opposing-member storage part 81*a* is located at a different position from the position illustrated in FIG. 24. The other configuration of the substrate processing apparatus 1*a* is the same as the configuration of the substrate processing apparatus 1 illustrated in FIG. 25, and constituent elements that correspond to those in FIG. 25 are given the same reference numerals.

As illustrated in FIG. 38, in the opposing-member holder 53*a*, the first flange supporter 532, the first connector 533, the second flange supporter 534, and the second connector 535 are mounted on the holder body 531 via the supporter moving mechanism 530. The first flange supporter 532, the first connector 533, the second flange supporter 534, the second connector 535, and the supporter moving mechanism 530 are provided approximately along the entire length of the holder body 531. The second flange supporter 534 is located on the opposite side to the first flange supporter 532 with the flange connector 515 of the top plate 51 located therebetween.

The first connector 533 and the second connector 535 are generally flat plate-like parts that extend downward from the supporter moving mechanism 530. The first connector 533 and the second connector 535 each extend in a direction that is generally parallel to the longitudinal direction of the holder body 531. The first flange supporter 532 is a generally flat plate-like part that extends generally horizontally from the lower end of the first connector 533. The first flange supporter 532 extends from the first connector 533 in a direction toward the second flange supporter 534. The second flange supporter 534 is a generally flat plate-like part that extends generally horizontally from the lower end of the second connector 535. The second flange supporter 534 extends from the second connector 535 in a direction toward the first flange supporter 532.

The distance in the width direction of the holder body 531 between the first flange supporter 532 and the second flange supporter 534 is smaller than the outer diameter of the opposing-member flange part 516 of the top plate 51 and greater than the outer diameter of the flange connector 515. The distance in the width direction of the holder body 531 between the first connector 533 and the second connector 535 is greater than the outer diameter of the opposing-member flange part 516.

The supporter moving mechanism 530 moves the first connector 533, the first flange supporter 532, the second connector 535, and the second flange supporter 534 generally horizontally in a direction that is generally parallel to the longitudinal direction of the holder body 531. That is, in the opposing-member holder 53*a*, the first flange supporter 532 and the second flange supporter 534 are movable relative to the holder body 531 by the supporter moving mechanism 530. The supporter moving mechanism 530 moves the first flange supporter 532 and the second flange supporter 534 relative to the holder body 531 in a forward-backward direction.

Figure 39:
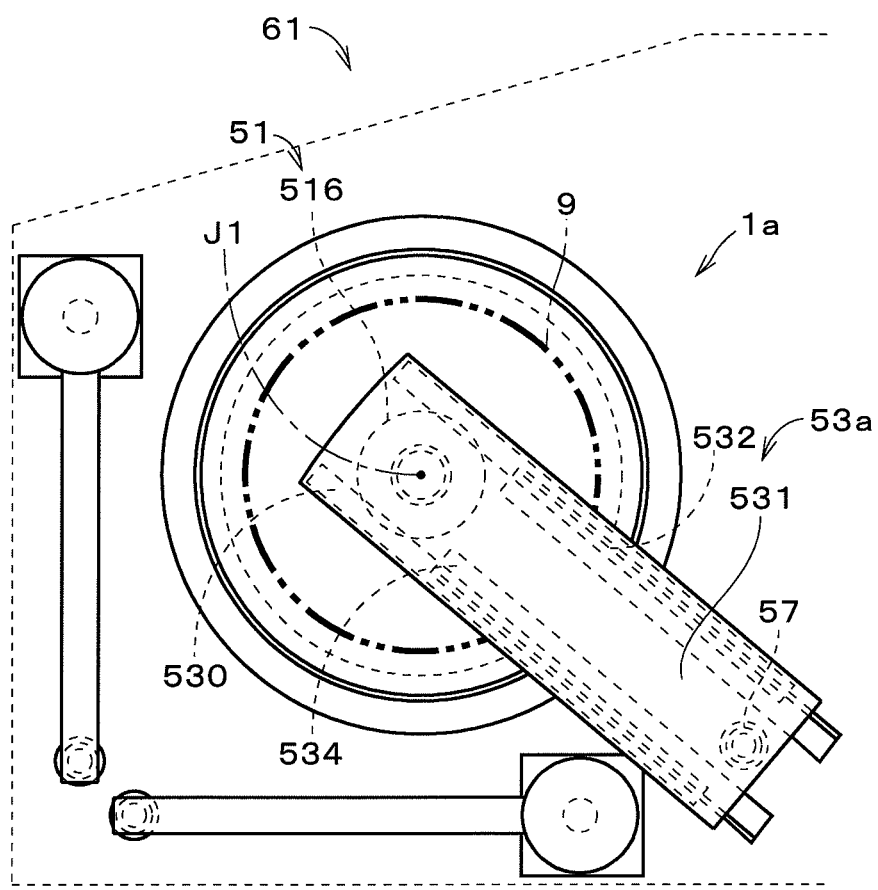
FIG. 39 is a plan view of part of the processing unit.

In the substrate processing apparatus 1*a*, with the holder body 531 located at the holding position, the first flange supporter 532 and the second flange supporter 534 are in contact with part of the opposing-member flange part 516 of the top plate 51 from the underside and supports the top plate 51 when the top plate 51 is located at the first position. In the example in FIG. 38, the opposing-member flange part 516 is in contact with end portions of the first flange supporter 532 and the second flange supporter 534 (i.e., the end portion of the holder body 531 on the tip end side). Also, with the holder body 531 located at the holding position and the top plate 51 located at the second position, the first flange supporter 532 and the second flange supporter 534 are moved toward the base of the holder body 531 by the supporter moving mechanism 530, and the first flange supporter 532 and the second flange supporter 534 are spaced radially outward from the opposing-member flange part 516 as illustrated in FIG. 39. In this state, the opposing-member holder 53*a* is horizontally rotated and moved between the holding position and the retracted position by the opposing-member-holder moving mechanism 57.

Also, in the substrate processing apparatus 1*a*, with the holder body 531 located at the holding position and the top plate 51 located at the second position, the first flange supporter 532 and the second flange supporter 534 are moved toward the tip end of the holder body 531 by the supporter moving mechanism 530 and disposed below the opposing-member flange part 516 as illustrated in FIG. 38.

In the substrate processing apparatus 1*a*, irrespective of whether the top plate 51 located at the second position is in a stationary state or being rotated, the first flange supporter 532 and the second flange supporter 534 are movable away from the opposing-member flange part 516 to move the opposing-member holder 53*a* to the retracted position, as in the substrate processing apparatus 1 illustrated in FIG. 25. Also, irrespective of whether the top plate 51 is in a stationary state or being rotated, the opposing-member holder 53*a* is movable from the retracted position to the holding position to dispose the first flange supporter 532 and the second flange supporter 534 below the opposing-member flange part 516. That is, the substrate processing apparatus 1*a* allows the top plate 51 to be held with a simple configuration and allows the opposing-member holder 53*a* to move between the holding position and the retracted position (or the replacement position) with a simple configuration, irrespective of the state of the top plate 51. In this way, in the substrate processing apparatus 1*a*, the opposing-member holder 53*a* is movable between the holding position and the retracted position (or the replacement position) during the rotation of the top plate 51 and other constituent elements, as in the substrate processing apparatus 1 illustrated in FIG. 25. This configuration shortens the time required for the processing of the substrate 9.

Figure 35A:
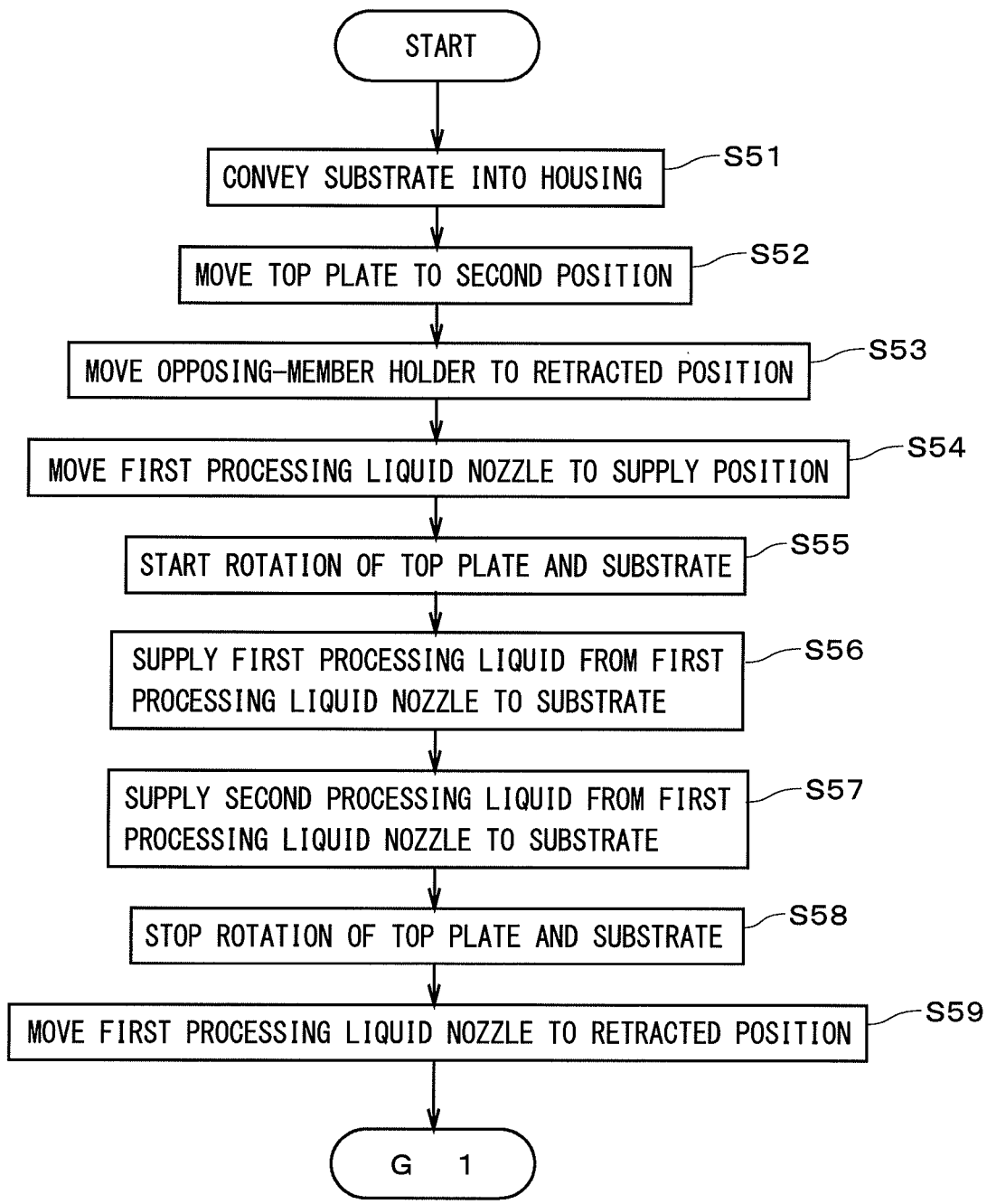
FIG. 35A is a flowchart of processing performed on a substrate.
Figure 35B:
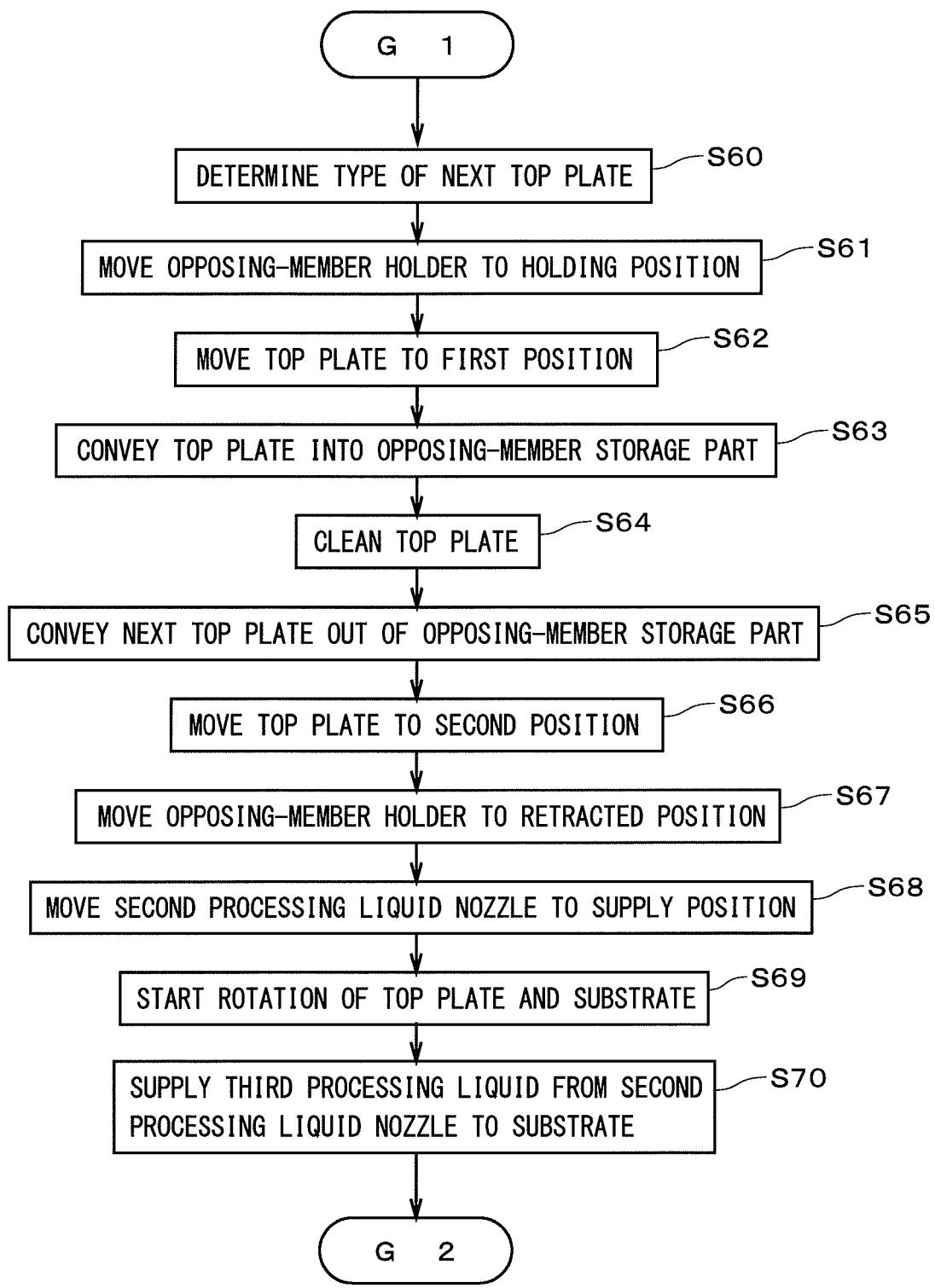
FIG. 35B is a flowchart of processing performed on the substrate.
Figure 35C:
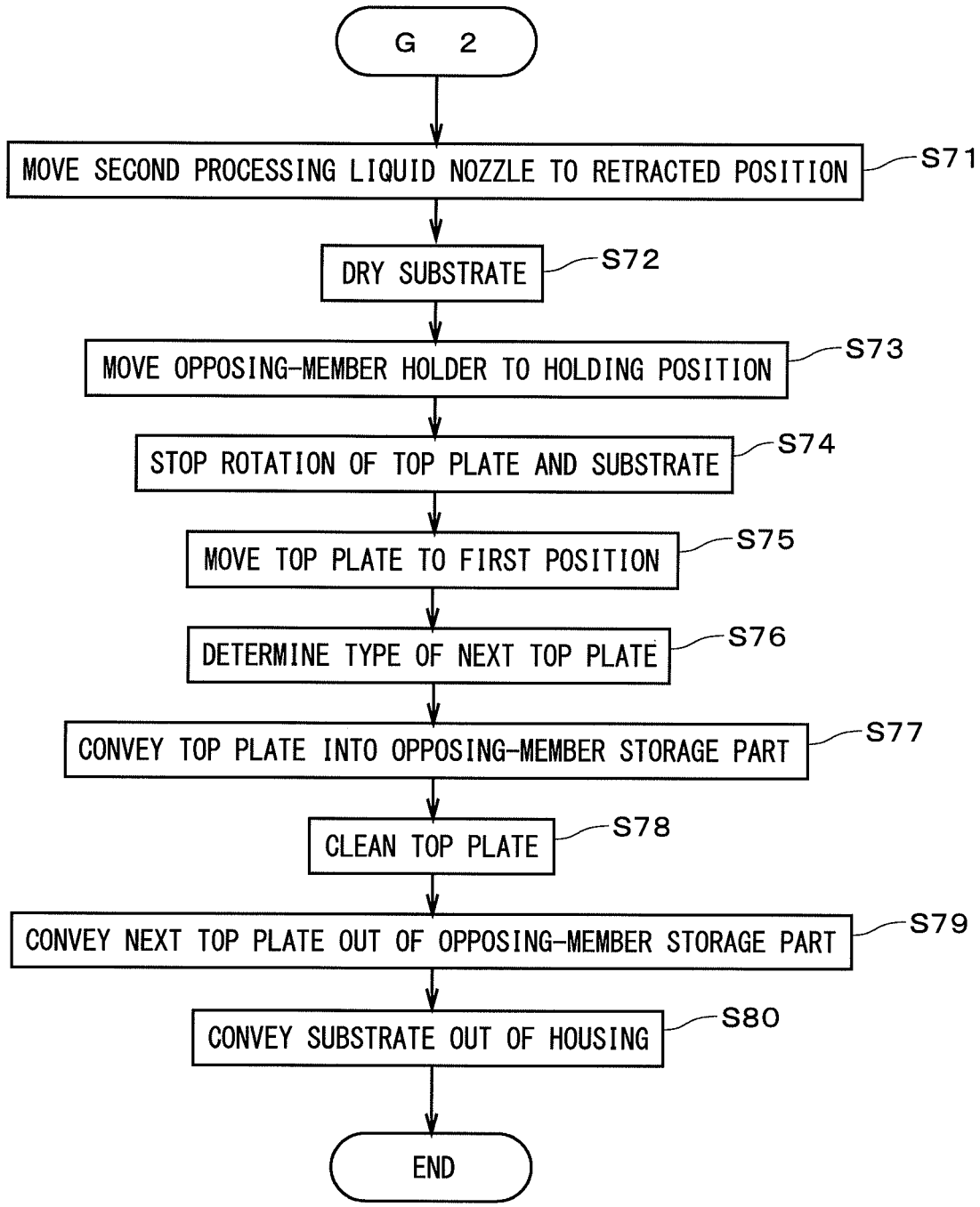
FIG. 35C is a flowchart of processing performed on the substrate.

The procedure of processing performed on the substrate 9 by the substrate processing apparatus 1*a* is approximately the same as the procedure of processing performed on the substrate 9 by the substrate processing apparatus 1 illustrated in FIGS. 35A to 35C. The operations of each constituent element of the substrate processing apparatus 1*a* are controlled by the controller 21 as in the substrate processing apparatus 1. When the top plate 51 is conveyed into the opposing-member storage part 81*a* in step S63, the opposing-member holder 53*a* that holds the top plate 51 is rotated clockwise in FIG. 37 by the opposing-member-holder moving mechanism 57 and moved from the holding position indicated by the solid line to the replacement position indicated by the dashed double-dotted line. For easy understanding of the drawing, other top plates stored in the opposing-member storage part 81*a* are not shown in FIG. 37 (the same applies to FIG. 40).

The tip end of the holder body 531 located at the replacement position is located outside the opposing-member storage part 81*a* and opposes the side surface of the opposing-member storage part 81*a*. Like the opposing-member storage part 81 illustrated in FIG. 29, the opposing-member storage part 81*a* is a box-like member of a generally rectangular parallelepiped that is able to store a plurality of top plates. Three side surfaces of the opposing-member storage part 81*a* are closed by side walls, and one side surface thereof that opposes the opposing-member holder 53a located at the replacement position is open. The open side surface has storage openings 83 for a plurality of storage parts 82.

Figure 40:
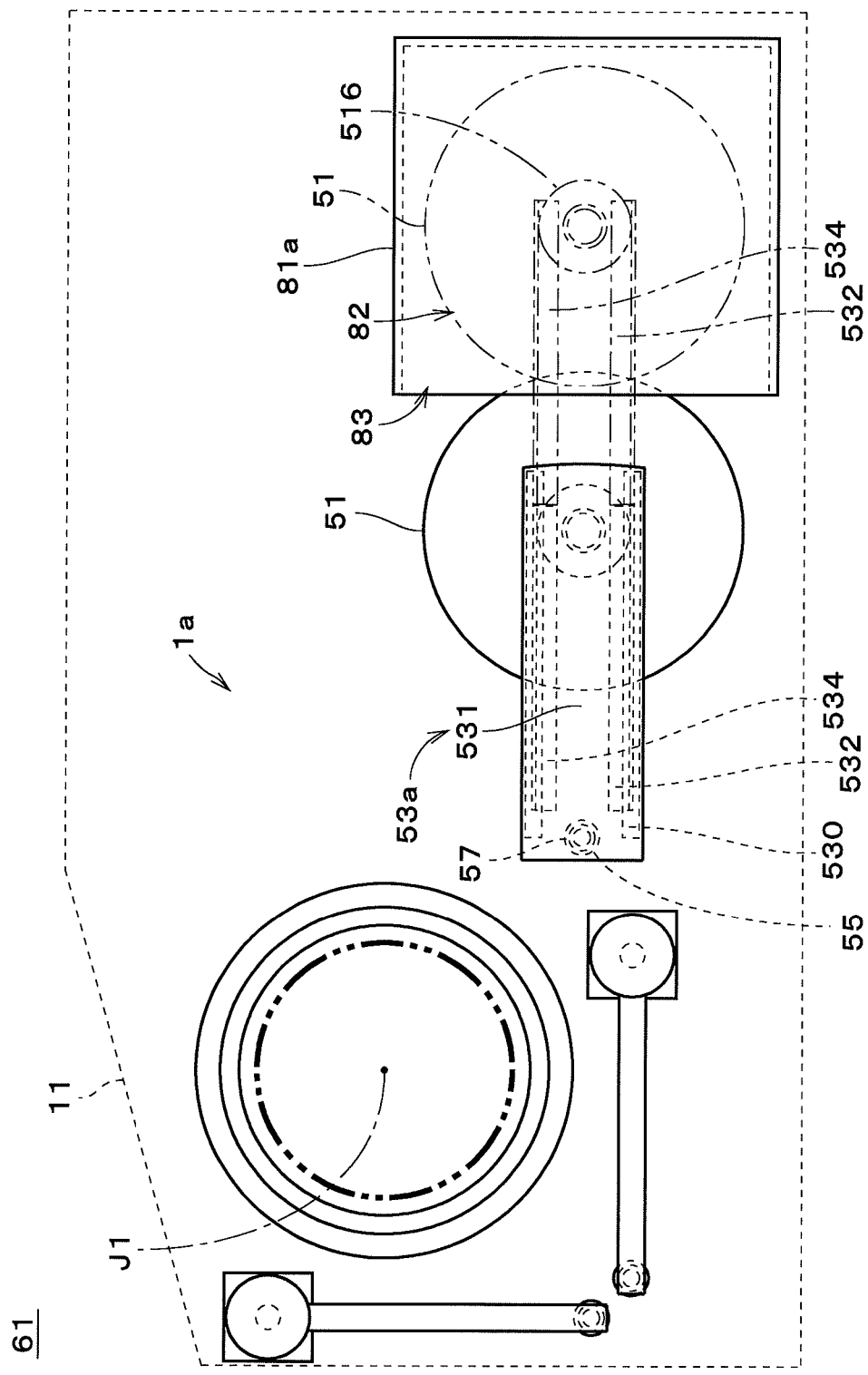
FIG. 40 is a plan view of the processing unit.

In the substrate processing apparatus 1a, the first flange supporter 532 and the second flange supporter 534 of the opposing-member holder 53a located at the replacement position are moved in a forward direction toward the tip end of the holder body 531 by the supporter moving mechanism 530 as illustrated in FIG. 40. This movement causes the first flange supporter 532 and the second flange supporter 534 to protrude in the longitudinal direction from the tip end of the holder body 531 as indicated by the dashed double-dotted line in FIG. 40, and thereby causes the top plate 51 held by the first flange supporter 532 and the second flange supporter 534 to be conveyed into a storage part 82 of the opposing-member storage part 81a.

In the substrate processing apparatus 1a, the mobility limiting part 58 (see FIG. 27) limits a positional shift of the top plate 51 (i.e., movement and rotation of the top plate 51 relative to the first flange supporter 532 and the second flange supporter 534) during conveyance by the opposing-member-holder moving mechanism 57 and the supporter moving mechanism 530, as in the above-described substrate processing apparatus 1. After the top plate 51 is conveyed into the storage part 82, the opposing-member holder 53a is moved down by the opposing-member elevating mechanism 55. Thus, the top plate 51 is placed on the lower surface of the storage part 82, and the first flange supporter 532 and the second flange supporter 534 are spaced below from the opposing-member flange part 516 of the top plate 51. The first flange supporter 532 and the second flange supporter 534 are then moved in a backward direction toward the base of the holder body 531 and retracted from the opposing-member storage part 81a by the supporter moving mechanism 531.

In the case of conveying the top plate 51a out of the opposing-member storage part 81a in step S65, the opposing-member elevating mechanism 55 is driven to cause the opposing-member holder 53a to move to a position that opposes the storage part 82 where the top plate 51a is stored. Then, the first flange supporter 532 and the second flange supporter 534 are moved in a forward direction toward the tip end of the holder body 531 by the supporter moving mechanism 530. As a result, the first flange supporter 532 and the second flange supporter 534 protrude in the longitudinal direction from the tip end of the holder body 531, and the ends of the first flange supporter 532 and the second flange supporter 534 are disposed below the opposing-member flange part 516 of the top plate 51a.

Then, the opposing-member holder 53a is moved up to bring the first flange supporter 532 and the second flange supporter 534 into contact with the opposing-member flange part 516, and the top plate 51a is held by the opposing-member holder 53a. The first flange supporter 532 and the second flange supporter 534 are then moved in a backward direction toward the base of the holder body 531 and retracted from the opposing-member storage part 81a by the supporter moving mechanism 530. Thus, the top plate 51a is conveyed out of the opposing-member storage part 81a. The opposing-member holder 53a is thereafter horizontally rotated and moved from the replacement position to the holding position by the opposing-member-holder moving mechanism 57. As a result, the top plate Ma conveyed out of the opposing-member storage part 81a is conveyed to the first position above the substrate 9 and the substrate holder 31.

The operations of conveying the top plate 51a into the opposing-member storage part 81a in step S77 and conveying the top plate 51 out of the opposing-member storage part 81a in step S79, performed by the substrate processing apparatus 1a, are respectively the same as the operations performed in steps S63 and S65 described above.

In the substrate processing apparatus 1a, the above-described opposing-member conveying mechanism for conveying top plates further includes a supporter moving mechanism 530 in addition to the opposing-member holder 53, the opposing-member elevating mechanism 55, and the opposing-member-holder moving mechanism 57. The supporter moving mechanism 530 is a forward-backward movement mechanism for moving a top plate forward and backward (i.e., move a top plate in a forward-backward direction) relative to the opposing-member storage part 81a. This mechanism facilitates the conveyance of a top plate into and out of the opposing-member storage part 81a. This mechanism also eliminates the need to locate the opposing-member storage part 81a on the rotation path of a top plate by the opposing-member-holder moving mechanism 57 and thereby improves the degree of freedom in the location of the opposing-member storage part 81a.

Figure 41:
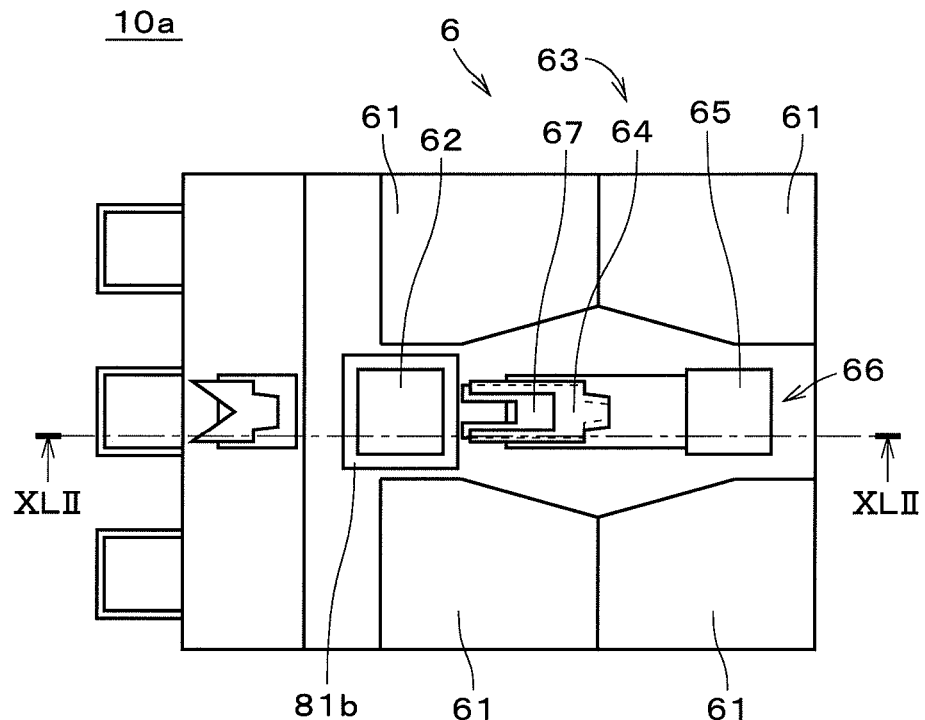
FIG. 41 is a plan view of a substrate processing system according to a sixth embodiment.
Figure 42:
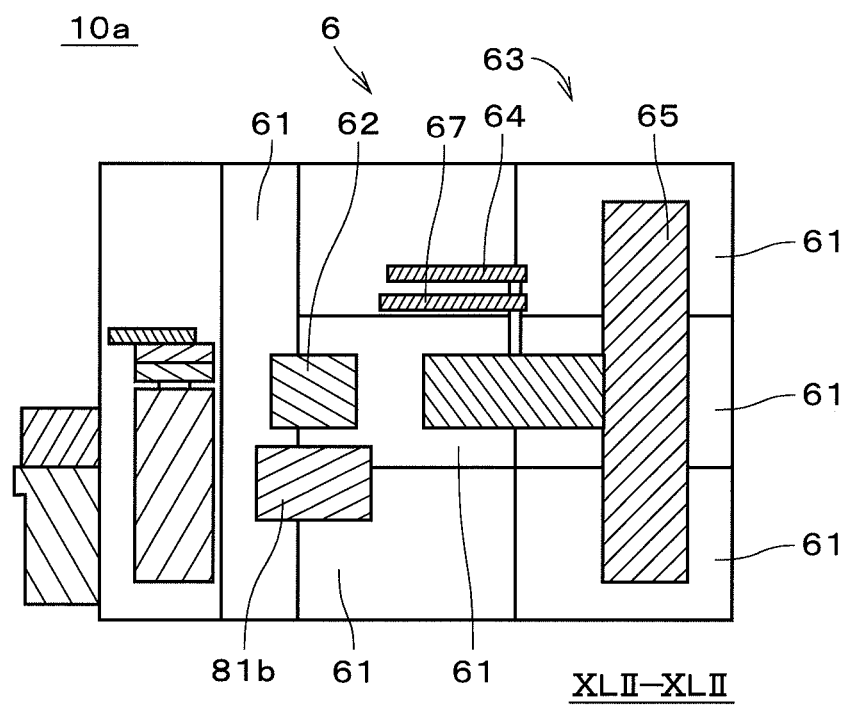
FIG. 42 is a cross-sectional view of the substrate processing system.

FIG. 41 is a plan view illustrating the interior of a substrate processing system 10a according to a sixth embodiment of the present invention. FIG. 42 is a cross-sectional view of the substrate processing system 10a taken along XLII-XLII in FIG. 41. FIG. 42 also illustrates a configuration on the back of the cross-section. In the substrate processing system 10a, the opposing-member storage part 81 (see FIG. 24) is omitted from each processing unit 61, and a shared opposing-member storage part 81b is disposed in the shared space 66 of the processor 6. The main conveying robot 63 located in the shared space 66 further includes, in addition to the substrate conveying hand 64, an opposing-member conveying hand 67 that is able to hold a top plate in a horizontal position. The other configuration of the substrate processing system 10a is the same as the configuration of the substrate processing system 10 illustrated in FIGS. 22 and 23, and constituent elements that correspond to those in FIGS. 22 and 23 are given the same reference numerals in the following description.

The opposing-member conveying hand 67, which is an opposing-member holder, is moved along with the substrate conveying hand 64 by the hand drive mechanism 65, which is an opposing-member-holder moving mechanism. The opposing-member conveying hand 67 is located, for example, below the substrate conveying hand 64. For example, the opposing-member conveying hand 67 is horizontally moved forward and backward, moved in the up-down direction, and rotated about a rotation axis parallel to the up-down direction by the hand drive mechanism 65. Note that the main conveying robot 63 may move the opposing-member conveying hand 67 independently of the substrate conveying hand 64.

Like the opposing-member storage part 81 illustrated in FIG. 29, the opposing-member storage part 81b is a box-like member of a generally rectangular parallelepiped that is able to store a plurality of top plates. The opposing-member storage part 81b includes, for example, a plurality of storage parts 82 (see FIG. 29) that are stacked on top of one another in the up-down direction. Each of the storage parts 82 is able to store a single top plate. The opposing-member storage part 81b is located, for example, below the intermediate unit 62. Alternatively, the opposing-member storage part 81b may be located above the intermediate unit 62, or may be located at any other position in the shared space 66.

Figure 43:
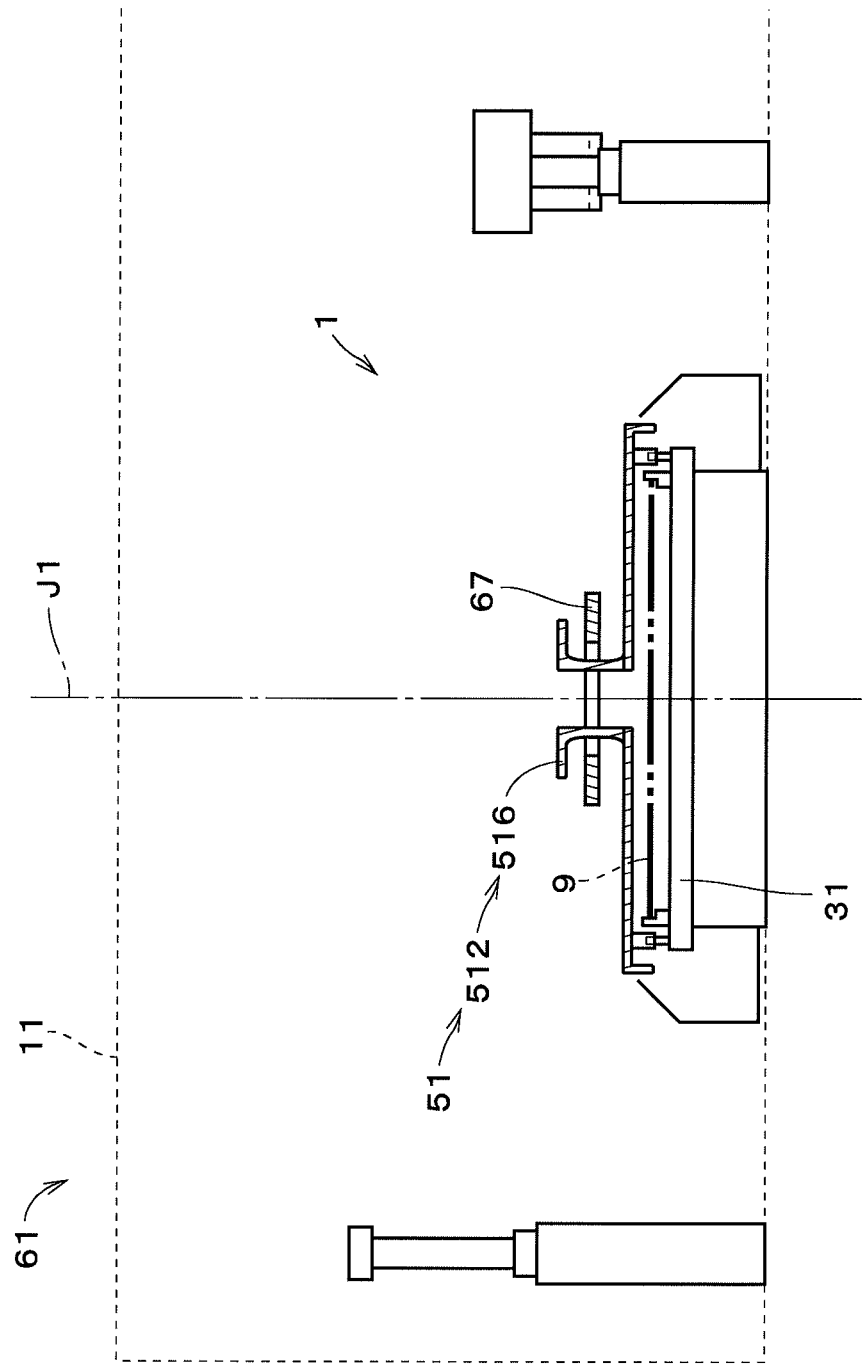
FIG. 43 is a cross-sectional view of part of a processing unit.

The opposing-member conveying hand 67 of the main conveying robot 63 is driven to convey a top plate out of a processing unit 61 and into the opposing-member storage part 81b. To be specific, the hand drive mechanism 65 moves the opposing-member conveying hand 67 to oppose the conveyance port of a processing unit 61 and then moves the opposing-member conveying hand 67 in a forward direction to insert the opposing-member conveying hand 67 into the processing unit 61. As illustrated in FIG. 43, the opposing-member conveying hand 67 is disposed below the opposing-member flange part 516 of the top plate 51 that is held by the substrate holder 31.

The opposing-member conveying hand 67 is then moved up and brought into contact with the lower surface of the opposing-member flange part 516, and thereby the top plate 51 is held by the opposing-member conveying hand 67. The top plate 51 is spaced above from the substrate holder 31. Next, the opposing-member conveying hand 67 is moved backward and retracted from the processing unit 61. Thus, the top plate 51 is conveyed out of the processing unit 61. The opposing-member conveying hand 67 and the top plate 51 are moved to a position that opposes the opposing-member storage part 81b. The opposing-member conveying hand 67 is then moved in a forward direction, and the top plate 51 held by the opposing-member conveying hand 67 is conveyed into the opposing-member storage part 81b.

The opposing-member conveying hand 6 of the main conveying robot 63 is also driven to convey a top plate out of the opposing-member storage part 81b and into a processing unit 61. To be specific, the hand drive mechanism 65 causes the opposing-member conveying hand 67 to oppose the opposing-member storage part 81b and then moves the opposing-member conveying hand 67 in a forward direction to insert the opposing-member conveying hand 67 into the opposing-member storage part 81b. After the top plate is held by the opposing-member conveying hand 67, the opposing-member conveying hand 67 is moved in a backward direction to convey the top plate out of the opposing-member storage part 81b. The opposing-member conveying hand 67 is then moved to oppose the conveyance port of the processing unit 61 and moved in a forward direction to be inserted into the processing unit 61. Thus, the top plate is conveyed into the processing unit 61. Then, the top plate is transferred from the opposing-member conveying hand 67 to the substrate holder 31, and the opposing-member conveying hand 67 is moved in a backward direction and retracted from the processing unit 61.

In the substrate processing system 10a, the above-described opposing-member conveying mechanism for conveying top plates further includes the main conveying robot 63 in addition to the constituent elements including the opposing-member holder 53, the opposing-member elevating mechanism 55, and the opposing-member-holder moving mechanism 57. Like the opposing-member holder 53 illustrated in FIG. 27, the opposing-member conveying hand 67 includes a mobility limiting part that limits a positional shift of a top plate that is being conveyed. The configuration of the mobility limiting part is, for example, the same as the configuration of the mobility limiting part 58 illustrated in FIG. 27. The mobility limiting part prevents a top plate from moving and rotating relative to the opposing-member conveying hand 67 during conveyance. This consequently allows the top plate to accurately move onto the substrate holder 31 and allows the substrate holder 31 to easily hold the top plate.

As described above, the hand drive mechanism 65 of the main conveying robot 63 includes a forward-backward movement mechanism for moving a top plate forward and backward relative to the opposing-member storage part 81b. This mechanism facilitates the conveyance of a top plate into and out of the opposing-member storage part 81b.

In the substrate processing system 10a, the main conveying robot 63 and the opposing-member storage part 81b are shared among the processing units 61. Focusing now on two processing units 61, the substrate processing system 10a includes a substrate processing apparatus 1, a housing 11 that is an apparatus housing chamber, another substrate processing apparatus 1, and another housing 11 that is another apparatus housing chamber. The other substrate processing apparatus 1 shares the opposing-member storage part 81b and the main conveying robot 63, which is part of the opposing-member conveying mechanism, with the substrate processing apparatus 1 and has the same configuration as the configuration of the substrate processing apparatus 1. The constituent elements of the substrate processing apparatus 1, excluding the opposing-member storage part 81b and the main conveying robot 63, are housed in the housing 11. Similarly, the constituent elements of the other substrate processing apparatus 1, excluding the opposing-member storage part 81b and the main conveying robot 63, are housed in the other housing 11.

Sharing the constituent elements simplifies the configuration of the substrate processing system 10a and reduces the size of the housing 11 of each processing unit 61. Consequently, the size of the substrate processing system 10a is reduced.

In the substrate processing system 10a, the opposing-member storage part 81b stores, for example, top plates 51 of the same type as the top plate 51 used in a processing unit 61. In this case, for example, when cleaning becomes necessary due to processing liquids or other substances adhering to the top plate 51 that is being used in a processing unit 61 (i.e., when the maintenance of the top plate 51 becomes necessary), this top plate 51 is replaced with another top plate 51 stored in the opposing-member storage part 81b. This configuration enables replacement of the top plate 51 without reducing the productivity of the substrate processing system 10a.

The replacement of top plates may be carried out, for example, after the processed substrate 9 is conveyed out of the processing unit 61 and before the next substrate 9 is conveyed into the processing unit 61. Alternatively, the replacement of top plates may be carried out in parallel with the conveyance of the substrate 9. That is, the top plate may be conveyed out of the processing unit 61 at the same time when a processed substrate 9 is conveyed out of the processing unit 61, and the next top plate 51 may be conveyed into the processing unit 61 at the same when an unprocessed substrate 9 is conveyed into the processing unit 61.

In the substrate processing system 10a, the opposing-member storage part 81b may store top plates of different types from the type of the top plate 51 that is being used in a processing unit 61. For example, the opposing-member storage part 81b may store a plurality of types of top plates that are respectively suited to a plurality of types of a series of processing (i.e., a plurality of processing recipes) to be performed on the substrate 9. In this case, when the type of a series of processing to be performed on the substrate 9 in a processing unit 61 is changed, the top plate 51 in the processing unit 61 is replaced with a top plate that is suited to the next processing. Thus, in the substrate processing system 10a, each processing unit 61 is switchable among configurations that are suited to a plurality of types of a series of processing to be performed on the substrate 9.

Consequently, each processing unit 61 is usable for various types of processing to be performed on the substrate 9.

The substrate processing apparatuses 1, 1a, and 1b and the substrate processing systems 10 and 10a described above may be modified in various ways.

The substrate processing apparatuses 1 and 1a may use a configuration different from processing liquid nozzles (i.e., the first processing liquid nozzle 411 and the second processing liquid nozzle 421) to supply a gas to the gap 518 between a processing liquid nozzle and the to-be-held part 512.

In the substrate processing apparatus 1b, the gas supplied from the gas supply part 45 to the gap 518 does not necessarily have to pass through both of the processing nozzle located at the supply position and the opposing-member holder 53b. For example, the gas may be supplied from the side surface of a processing liquid nozzle (e.g., the first processing liquid nozzle 411a and the second processing liquid nozzle 421a) to the gap 518, and the supply of a gas from the opposing-member holder 53b may be omitted. This configuration simplifies the configuration of the opposing-member holder 53b. In this case, the opposing-member holder 53b may, for example, be a generally solid member, and the through hole 537 may be a columnar hole that extends from the upper surface of the opposing-member holder 53b to lower surface thereof. Alternatively, the gas may be supplied from the opposing-member holder 53b through the upper opening 517 of the to-be-held part 512 to the gap 518, and the supply of the gas from the processing liquid nozzle to the gap 518 may be omitted. In this case, the configuration of the processing liquid nozzles is simplified. As another alternative, a different configuration from the configuration using the processing liquid nozzles and the opposing-member holder 53b may be used to supply a gas to the gap 518.

Note that a gas does not necessarily have to be supplied to the gap 518. The supply position of the processing liquid nozzles is not limited to the position inside the to-be-held part 512 and may be any position above the opposing-member opening 514. For example, the processing liquid nozzles may be located above the upper opening 517 of the to-be-held part 512.

Figure 21:
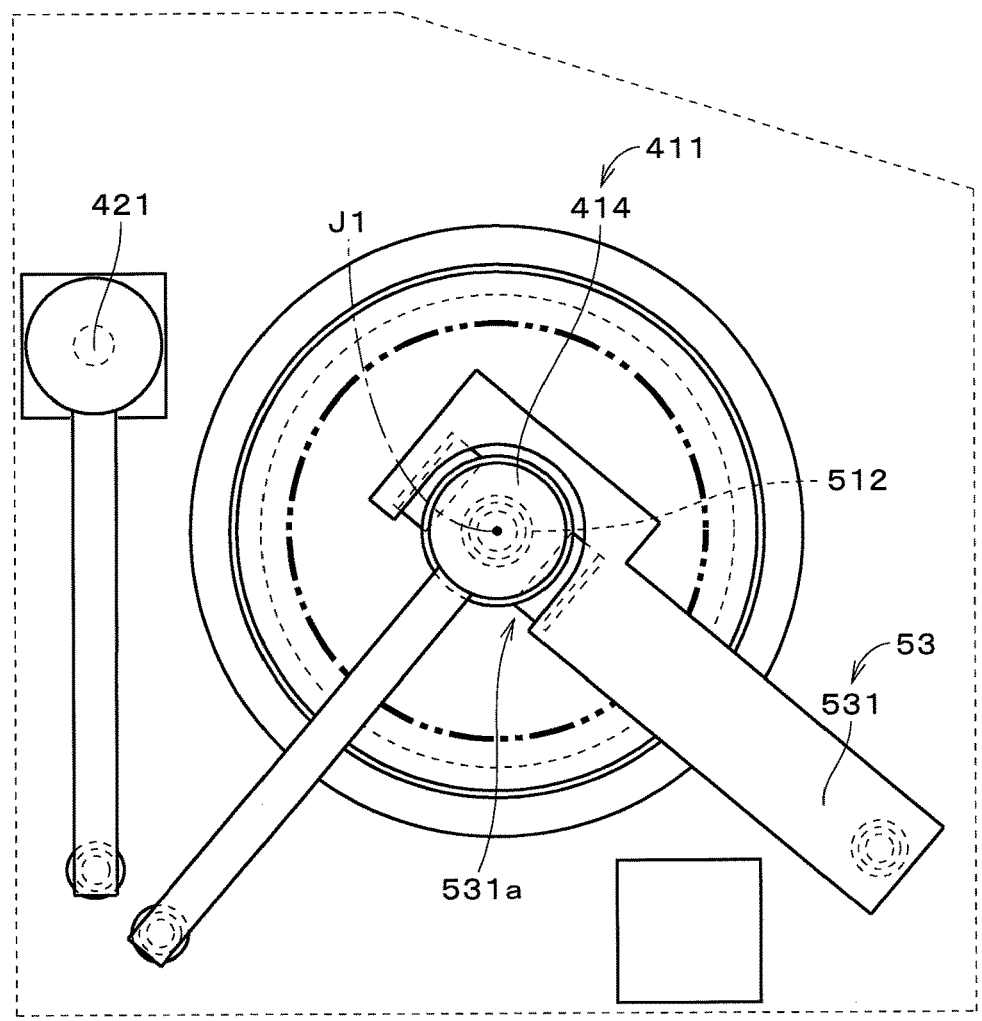
FIG. 21 is a plan view of the substrate processing apparatus and illustrates another example of the opposing-member holder.

In the substrate processing apparatus 1, the opposing-member holder 53 does not necessarily have to be located at the retracted position when the first processing liquid nozzle 411 and the second processing liquid nozzle 421 are inserted into the to-be-held part 512. Also, the first processing liquid nozzle 411 and the second processing liquid nozzle 421 do not necessarily have to be located at their retracted positions when the opposing-member holder 53 is moved from the retracted position to the holding position. For example, a configuration as illustrated in FIG. 21 is conceivable in which a cut-out part 531a that is larger than the nozzle flange part 414 of the first processing liquid nozzle 411 is formed in the side surface of the holder body 531, and the first processing liquid nozzle 411 located at the supply position is housed in the cut-out part 531a of the opposing-member holder 53 located at the holding position in a plan view. In this case, the processing liquid nozzle (i.e., the first processing liquid nozzle 411 or the second processing liquid nozzle 421) may be inserted into the to-be-held part 512 with the opposing-member holder 53 located at the holding position. Alternatively, the opposing-member holder 53 may be moved from the retracted position to the holding position with the processing liquid nozzle inserted in the to-be-held part 512.

In the substrate processing apparatus 1, the first flange supporter 532 and the second flange supporter 534 may be connected in part to each other at, for example, their right ends in FIG. 5. Similarly, in the substrate processing apparatus 1a, the first flange supporter 532 and the second flange supporter 534 may be connected in part to each other at, for example, their ends on the base side of the holder body 531.

In the substrate processing apparatuses 1, 1a, and 1b, a plurality of types of processing liquids may be sequentially supplied from the first processing liquid nozzle 411 or 411a onto the substrate 9. The same applies to the second processing liquid nozzle 421 or 421a. In addition to the first processing liquid nozzle 411 or 411a and the second processing liquid nozzle 421 or 421a, other processing liquid nozzles may be provided. In the substrate processing apparatus 1, the second processing liquid nozzle 421, the second nozzle elevating mechanism 433, the second nozzle rotation mechanism 434, and the second cleaning part 442 may be omitted. The same applies to the substrate processing apparatuses 1a and 1b.

In the substrate processing apparatus 1b, a single processing liquid nozzle may be fixed to the opposing-member holder 53b, and one or more types of processing liquids may be supplied from the fixed processing liquid nozzle to the substrate 9. Fixing a processing liquid nozzle to the opposing-member holder 53b in this way simplifies the configuration of the opposing-member holder 53b and the processing liquid nozzle. In this case, for example, a configuration is conceivable in which the processing liquid nozzle protrudes downward from the opposing-member holder 53b and is inserted through the upper opening 517 of the to-be-held part 512 of the top plate 5, and the gas from the gas supply part 45 is supplied through the opposing-member holder 53b and the upper opening 517 of the to-be-held part 512 into the to-be-held part 512. This configuration simplifies the configuration of the processing liquid nozzle and reduces the entry of outside air into the processing space 90.

The opposing-member elevating mechanism 55 does not necessarily have to move the top plate 51 in the up-down direction, and it is sufficient for the top plate 51 and the substrate holder 31 to move relative to each other. For example, the opposing-member elevating mechanism 55 may move the substrate holder 31 in the up-down direction without moving the top plate 51 in order to achieve movement of the top plate 51 between the first position and the second position in the up-down direction relative to the substrate holder 31. In this case, the position of the top plate 51 that is held by the opposing-member holder 53 and spaced above from the substrate holder 31 is the first position, and the position of the top plate 51 that is held by the substrate holder 31 is the second position.

In the substrate processing apparatuses 1, 1a, and 1b, the cup part 37 may include a plurality of cups that are arranged concentrically. In this case, a cup that receives a processing liquid from the substrate 9 may preferably be changed when the type of the processing liquid supplied onto the substrate 9 is changed (e.g., when the processing liquid is changed from a chemical solution to a cleaning liquid). This configuration facilitates separation, collection, and discarding of a plurality of processing liquids.

In the substrate processing apparatuses 1, 1a, and 1b, the substrate holder 31 may have a lower nozzle in the central part to supply a processing liquid to the lower surface of the substrate 9.

In the substrate processing apparatuses 1, 1a, and 1b, the use of the top plate 51 enables execution of various types of processing that are desirably performed in a low oxygen atmosphere. The gas supplied to the processing space 90 is not limited to a nitrogen gas, and may be other inert gases such as an argon gas. The gas supplied to the processing space 90 may be a gas that creates a desired gaseous atmosphere above the substrate 9, e.g., a mixed gas having a controlled gas composition ratio (i.e., mixture of a plurality of types of gases). The gas supplied to the processing space 90 may, for example, be dried air with low humidity, depending on the content of processing. In the substrate processing apparatuses 1, 1*a*, and 1*b*, the supply of a gas to the processing space 90 is not an absolute necessity.

The substrate processing apparatuses 1, 1*a*, and 1*b* may process various types of substrates other than semiconductor substrates.

Figure 44:
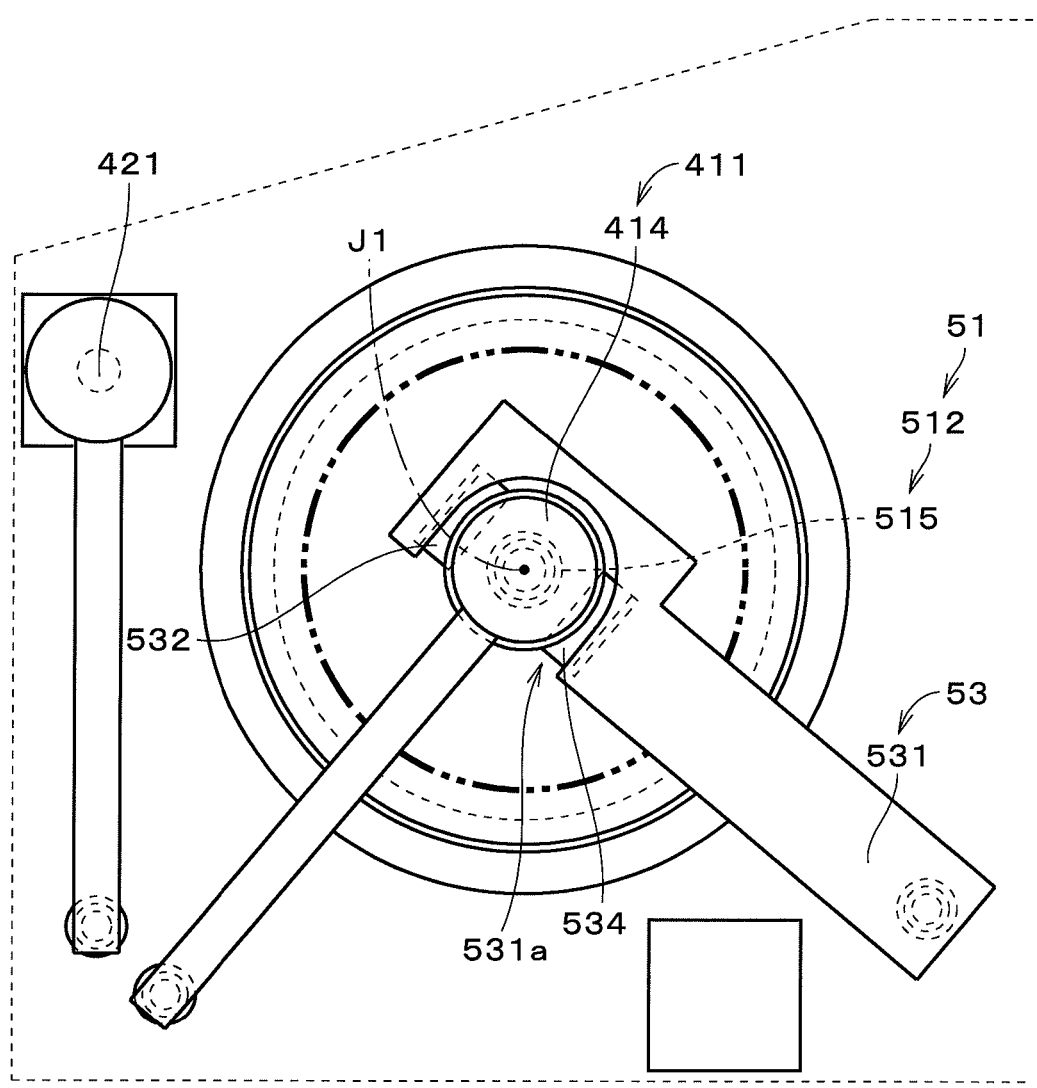
FIG. 44 is a plan view of part of the processing unit and illustrates another example of the opposing-member holder.

In the substrate processing apparatuses 1 of the substrate processing systems 10 and 10*a*, the opposing-member holder 53 does not necessarily have to be located at the retracted position when the first processing liquid nozzle 411 and the second processing liquid nozzle 421 are inserted into the to-be-held part 512. Also, the first processing liquid nozzle 411 and the second processing liquid nozzle 421 do not necessarily have to be located at their retracted positions when the opposing-member holder 53 is moved from the retracted position to the holding position. For example, a configuration as illustrated in FIG. 44 is conceivable in which the cut-out part 531*a* larger than the nozzle flange part 414 of the first processing liquid nozzle 411 is formed in the side surface of the holder body 531, and the first processing liquid nozzle 411 located at the supply position is housed in the cut-out part 531*a* of the opposing-member holder 53 located at the holding position in a plan view. In this case, a processing liquid nozzle (i.e., the first processing liquid nozzle 411 or the second processing liquid nozzle 421) may be inserted into the to-be-held part 512 with the opposing-member holder 53 located at the holding position. Also, the opposing-member holder 53 may be moved from the retracted position to the holding position with the processing liquid nozzle inserted in the to-be-held part 512. Irrespective of whether the top plate 51 is in a stationary state or being rotated, the flange connector 515 is separable on one side in the direction along the first flange supporter 532 and the second flange supporter 534 from between the first flange supporter 532 and the second flange supporter 534.

The substrate processing apparatuses 1 and 1*a* of the substrate processing systems 10 and 10*a* may have a configuration in which a through hole is formed in the holder body 531 of the opposing-member holder 53 or 53*a*, and with the opposing-member holder 53 or 53*a* located at the holding position, the first processing liquid nozzle 411 or the second processing liquid nozzle 421 is inserted through that through hole into the to-be-held part 512.

In the substrate processing apparatuses 1 and 1*a* of the substrate processing systems 10 and 10*a*, the supply position of the processing liquid nozzles is not limited to a position inside the to-be-held part 5 and may be any position above the opposing-member opening 514. For example, the processing liquid nozzles may be located above the upper opening 517 of the to-be-held part 512.

In the substrate processing apparatus 1 of the substrate processing system 10*a*, the first flange supporter 532 and the second flange supporter 534 may be connected in part to each other at, for example, their right ends in FIG. 34. In the substrate processing apparatus 1*a*, the first flange supporter 532 and the second flange supporter 534 may be connected in part to each other at, for example, their ends on the base side of the holder body 531.

The configurations of the above-described preferred embodiments and variations may be appropriately combined as long as there are no mutual inconsistencies.

While the invention has been shown and described in detail, the fore going description is in all aspects illustrative and not restrictive. It is therefore to be understood that numerous modifications and variations can be devised without departing from the scope of the invention. This application claims priority benefit under 35 U.S.C. Section 119 of Japanese Patent Application No. 2015-25718 filed in the Japan Patent Office on Feb. 12, 2015, Japanese Patent Application No. 2015-25719 fi led in the Japan Patent Office on Feb. 12, 2015, Japanese Patent Application No. 2015-25720 filed in the Japan Patent Office on Feb. 12, 2015, and Japanese Pat ent Application No. 2015-37749 filed in the Japan Patent Office on Feb. 27, 2015, the entire disclosures of which are incorporated herein by reference.

REFERENCE SIGNS LIST 1, 1*a*, 1*b* Substrate processing apparatus
9 Substrate
10, 10*a* Substrate processing system
11 Housing
21 Control part
31 Substrate holder
33 Substrate rotation mechanism
43 Nozzle moving mechanism
44 Nozzle cleaning part
45 Gas supply part
51, 51*a*, 51*b* Top plate
53, 53*a*, 53*b* Opposing-member holder
54, 54*a* Labyrinth
55 Opposing-member elevating mechanism
57 Opposing-member-holder moving mechanism
58 Mobility limiting part
65 Hand drive mechanism
66 Shared space
67 Opposing-member conveying hand
81, 81*a*, 81*b* Opposing-member storage part
82 Storage part
84 Opposing-member cleaning mechanism
90 Processing space
91 Upper surface (of substrate)
411, 411*a* First processing liquid nozzle
413 First processing liquid supply part
414 Nozzle flange part
415 Nozzle body
421, 421*a* Second processing liquid nozzle
418, 423 Second processing liquid supply part
423*a* Third processing liquid supply part
511 Opposing-member body
512 To-be-held part
514 Opposing-member opening
515 Flange connector
516 Opposing-member flange part
517 Upper opening (of to-be-held part)
518 Gap
530 Supporter moving mechanism
531 Holder body
532 First flange supporter
534 Second flange supporter
537 Through hole
J1 Central axis
S11 to S26, S31 to S44, S51 to S80 Step

The invention claimed is:

1. A substrate processing apparatus for processing a substrate, comprising:
a substrate holder for holding a substrate in a horizontal position;
an opposing member that opposes an upper surface of said substrate, has an opposing-member opening in a central part, and has a tubular to-be-held part that protrudes upward from a periphery of said opposing-member opening;
an opposing-member holder for holding said tubular to-be-held part of said opposing member;
an opposing-member elevator having a cylinder for moving said opposing-member holder in an up-down direction to move said opposing member relative to said substrate holder between a first position and a second position;
a processing liquid nozzle located on an inner side of said tubular to-be-held part and for ejecting a processing liquid through said opposing-member opening toward said upper surface of said substrate;
a substrate rotator operable for rotating said substrate along with said substrate holder about a central axis pointing in said up-down direction; and
a gas supply part for supplying a gas to a space between said opposing member and said substrate,
said opposing member when located at said first position is held by said opposing-member holder and spaced above from said substrate holder, and said opposing member when located at said second position is held by said substrate holder and rotated along with said substrate holder by said substrate rotator, and
said gas supply part supplies a gas to said processing liquid nozzle, and the gas is supplied directly from an outer surface of said processing liquid nozzle to a gap which is formed between an inner surface of said tubular to-be-held part of said opposing member and said outer surface of said processing liquid nozzle, the outer surface of said processing liquid nozzle being directly opposed to said inner surface of said tubular to-be-held part in a radial direction.

2. The substrate processing apparatus according to claim 1, wherein:
a side-surface jet opening is provided in said outer surface of said processing liquid nozzle and opposed to said inner surface of said tubular to-be-held part in said radial direction,
the gas from said gas supply part is supplied through said side-surface jet opening to said gap.

3. The substrate processing apparatus according to claim 1, wherein:
a first side-surface jet opening and a second side-surface jet opening are both provided in said outer surface of said processing liquid nozzle and opposed to said inner surface of said tubular to-be-held part in said radial direction,
the gas from said gas supply part is supplied obliquely downward through said first side-surface jet opening to said gap, and
the gas from said gas supply part is supplied obliquely upward through said second side-surface jet opening to said gap.

4. The substrate processing apparatus according to claim 3,
wherein said tubular to-be-held part includes:
a cylindrical flange connector centered on said central axis; and
an opposing-member flange part that extends radially outward from an upper end of said flange connector,
wherein said processing liquid nozzle includes:
a nozzle body that is inserted in said flange connector of said tubular to-be-held part; and
a nozzle flange part that extends radially outward from a top of said nozzle body and opposes an upper surface of said opposing-member flange part, and
wherein a labyrinth is formed between said upper surface of said opposing-member flange part and a lower surface of said nozzle flange part with a first protrusion protruding upward from said upper surface of said opposing-member flange part and a second protrusion protruding downward from said lower surface of said nozzle flange part, wherein:
further a third side-surface jet opening is provided above said first side-surface jet opening and said second side-surface jet opening in said outer surface of said processing liquid nozzle and opposed to said labyrinth in said radial direction, and
the gas from said gas supply part is supplied through said third side-surface jet opening to said labyrinth.

5. A substrate processing apparatus for processing a substrate, comprising:
a substrate holder for holding a substrate in a horizontal position;
an opposing member that opposes an upper surface of said substrate, has an opposing-member opening in a central part, and has a tubular to-be-held part that protrudes upward from a periphery of said opposing-member opening;
an opposing-member holder for holding said tubular to-be-held part of said opposing member;
an opposing-member elevator having a cylinder for moving said opposing-member holder in an up-down direction to move said opposing member relative to said substrate holder between a first position and a second position;
an opposing-member-holder conveyor operable for, with said opposing member being located at said second position, horizontally moving said opposing-member holder to retract from above said opposing member;
a processing liquid nozzle located on an inner side of said tubular to-be-held part and for ejecting a processing liquid through said opposing-member opening toward said upper surface of said substrate;
a substrate rotator operable for rotating said substrate along with said substrate holder about a central axis pointing in said up-down direction; and
a gas supply part for supplying a gas to a space between said opposing member and said substrate,
said opposing member when located at said first position is held by said opposing-member holder and spaced above from said substrate holder, and said opposing member when located at said second position is held by said substrate holder and rotated along with said substrate holder by said substrate rotator,
said gas supply part supplies a gas to said processing liquid nozzle, and the gas is supplied directly from an outer surface of said processing liquid nozzle to a gap formed between an inner surface of said tubular to-be-held part of said opposing member and said outer surface of said processing liquid nozzle,
with said opposing-member holder being retracted, said processing liquid nozzle is inserted through an upper opening of said tubular to-be-held part, and the gas from said gas supply part is supplied from said outer surface of said processing liquid nozzle to said gap.

6. The substrate processing apparatus according to claim 5, wherein:
the gas from said gas supply part is supplied obliquely downward and obliquely upward from said outer surface of said processing liquid nozzle.

7. The substrate processing apparatus according to claim 5,
wherein said tubular to-be-held part includes:
a cylindrical flange connector centered on said central axis; and
an opposing-member flange part that extends radially outward from an upper end of said flange connector, and
wherein said processing liquid nozzle includes:
a nozzle body that is inserted in said flange connector of said tubular to-be-held part; and
a nozzle flange part that extends radially outward from a top of said nozzle body and opposes an upper surface of said opposing-member flange part, and
wherein a labyrinth is formed between said upper surface of said opposing-member flange part and a lower surface of said nozzle flange part with a first protrusion protruding upward from said upper surface of said opposing-member flange part and a second protrusion protruding downward from said lower surface of said nozzle flange part.

8. The substrate processing apparatus according to claim 7, wherein:
the gas from said gas supply part is supplied from said outer surface of said processing liquid nozzle toward said labyrinth.

* * * * *